(12) United States Patent
Tolle et al.

(10) Patent No.: US 11,778,933 B2
(45) Date of Patent: *Oct. 3, 2023

(54) NANO MEMORY DEVICE

(71) Applicant: South Dakota Board of Regents, Pierre, SD (US)

(72) Inventors: Charles Tolle, Rapid City, SD (US); Haiping Hong, Rapid City, SD (US); Christian Widener, Rapid City, SD (US); Greg Christensen, Rapid City, SD (US); Jack Yang, Rapid City, SD (US)

(73) Assignee: SOUTH DAKOTA BOARD OF REGENTS, Pierre, SD (US)

( * ) Notice: Subject to any disclaimer, the term of this patent is extended or adjusted under 35 U.S.C. 154(b) by 114 days.

This patent is subject to a terminal disclaimer.

(21) Appl. No.: 17/469,080

(22) Filed: Sep. 8, 2021

(65) Prior Publication Data

US 2021/0408376 A1 Dec. 30, 2021

Related U.S. Application Data

(63) Continuation of application No. 16/381,641, filed on Apr. 11, 2019, now Pat. No. 11,145,815.

(60) Provisional application No. 62/656,862, filed on Apr. 12, 2018, provisional application No. 62/656,773, filed on Apr. 12, 2018, provisional application No. 62/656,725, filed on Apr. 12, 2018.

(51) Int. Cl.
| | | |
|---|---|---|
| *H10N 70/00* | (2023.01) | |
| *C10M 103/02* | (2006.01) | |
| *H10B 63/00* | (2023.01) | |
| *B82Y 30/00* | (2011.01) | |
| *C10N 20/06* | (2006.01) | |
| *C10N 50/10* | (2006.01) | |
| *C10N 20/00* | (2006.01) | |

(52) U.S. Cl.
CPC ...... *H10N 70/8845* (2023.02); *C10M 103/02* (2013.01); *H10B 63/20* (2023.02); *B82Y 30/00* (2013.01); *C10N 2020/00* (2013.01); *C10N 2050/10* (2013.01)

(58) Field of Classification Search
CPC .................................................. H10N 70/8845
See application file for complete search history.

(56) References Cited

U.S. PATENT DOCUMENTS

| | | |
|---|---|---|
| 5,498,372 A | 3/1996 | Hedges |
| 7,871,533 B1 | 1/2011 | Haiping et al. |
| (Continued) | | |

OTHER PUBLICATIONS

Martinez et al., "Solid-state memcapacitor", Dec. 2009, pp. 1-7, Department of Physics and Astronomy and USC Nanocenter, University of South Carolina, Columbia, SC, 29208.

(Continued)

*Primary Examiner* — Mounir S Amer
(74) *Attorney, Agent, or Firm* — Goodhue, Coleman & Owens, P.C.

(57) ABSTRACT

A non-volatile memory circuit in embodiments of the present invention may have one or more of the following features: (a) a logic source, and (b) a semi-conductive device being electrically coupled to the logic source, having a first terminal, a second terminal and a nano-grease with significantly reduced amount of carbon nanotube loading located between the first and second terminal, wherein the nano-grease exhibits non-volatile memory characteristics.

20 Claims, 28 Drawing Sheets

(56) References Cited

U.S. PATENT DOCUMENTS

| | | |
|---|---|---|
| 8,222,190 B2 | 7/2012 | Zhamu et al. |
| 9,911,743 B2 | 3/2018 | Bertin et al. |
| 2008/0079027 A1 | 4/2008 | Bertin et al. |
| 2008/0159042 A1 | 7/2008 | Bertin et al. |
| 2011/0014356 A1 | 1/2011 | Fornes et al. |

OTHER PUBLICATIONS

Pershin et al., "Memory effects in complex materials and nanoscale systems", Nov. 12, 2010, pp. 1-59, Department of Physics and Astronomy and USC Nanocenter, University of South Carolina, Columbia, SC, 29208.

Yin et al., "What are Memristor, Memcapacitor, and Meminductor?", IEEE Transactions on Circuits and Systems—II: Express Briefs, vol. 62 No.4, Apr. 2015, pp. 402-406.

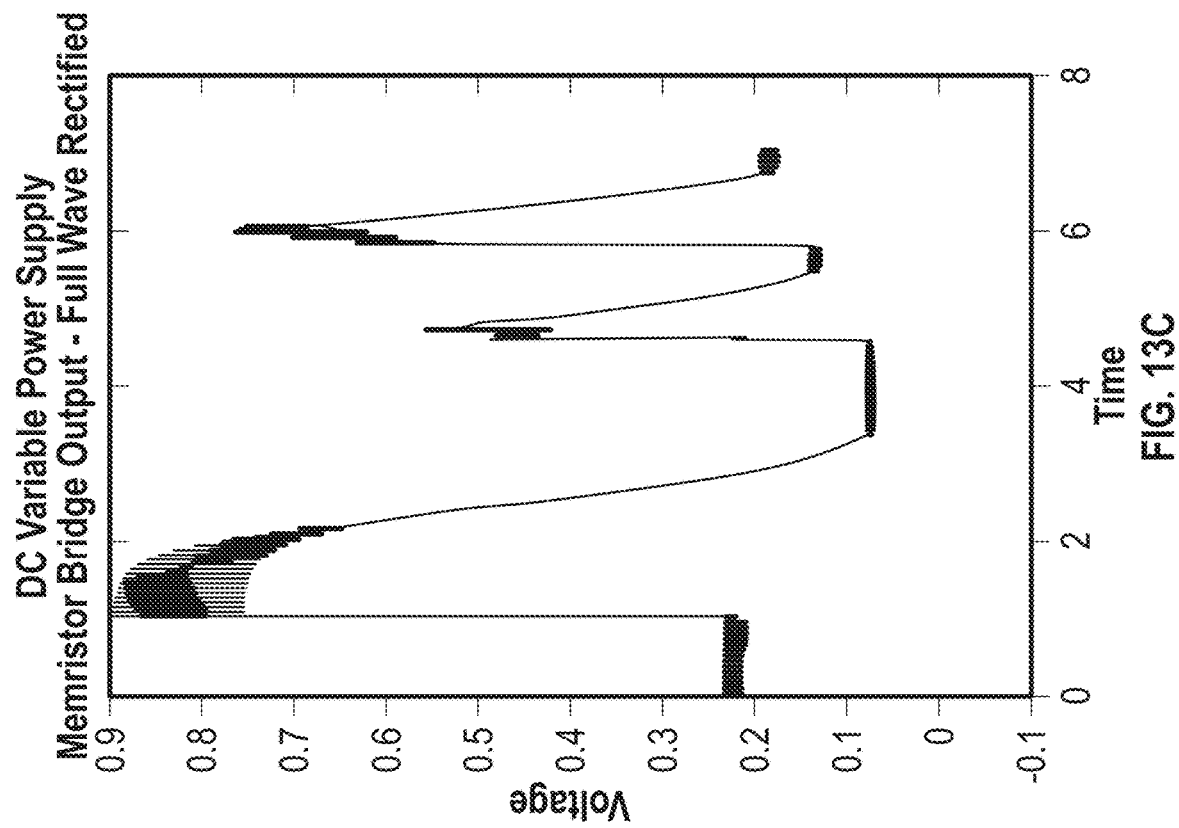
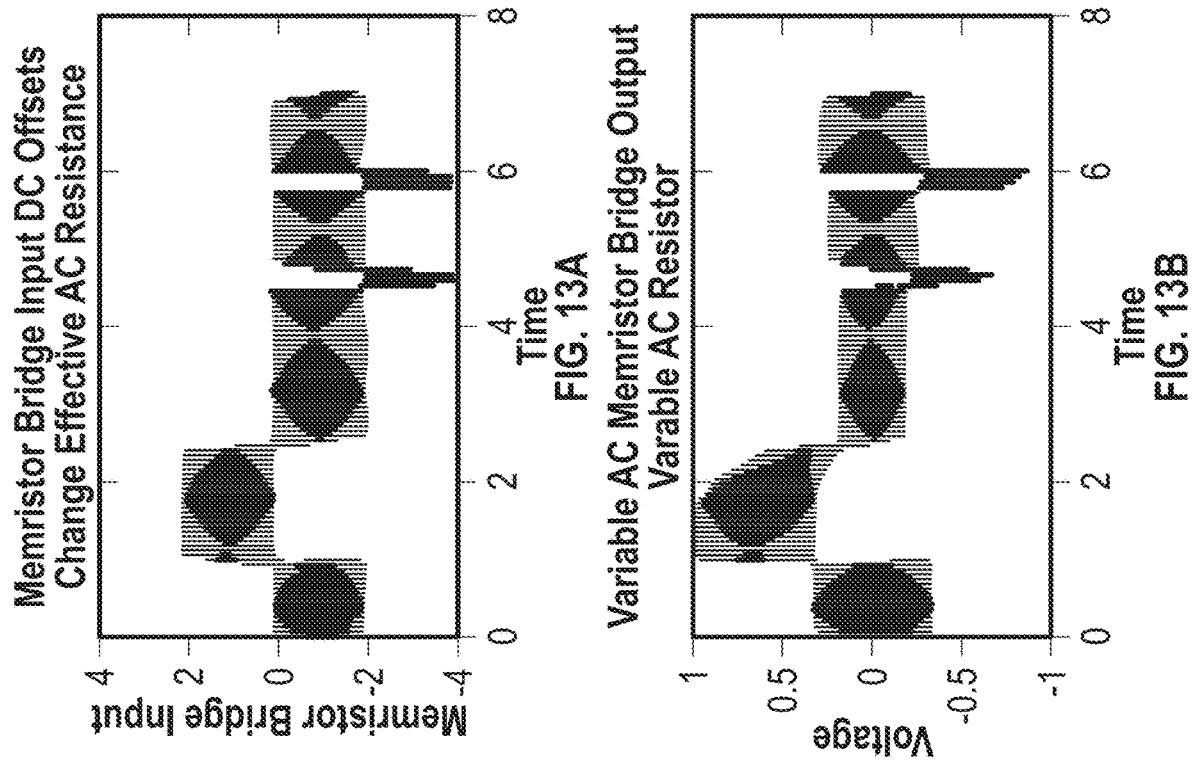
FIG. 13A
FIG. 13B
FIG. 13C

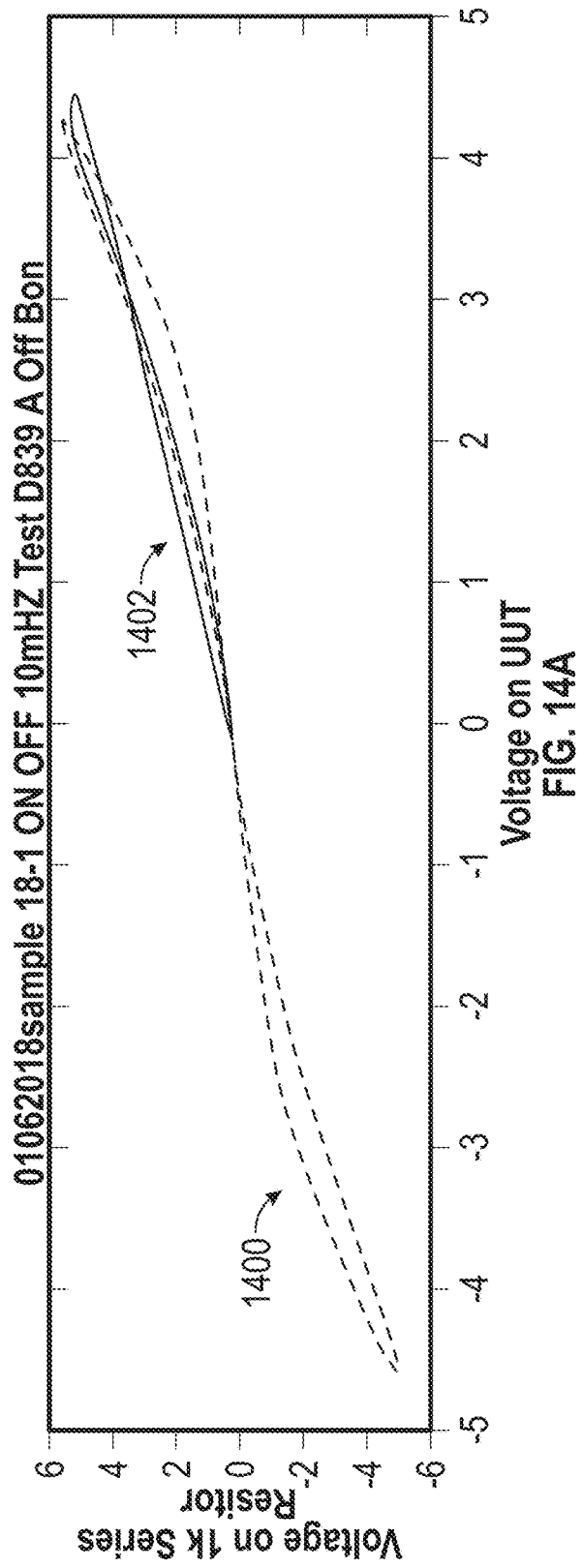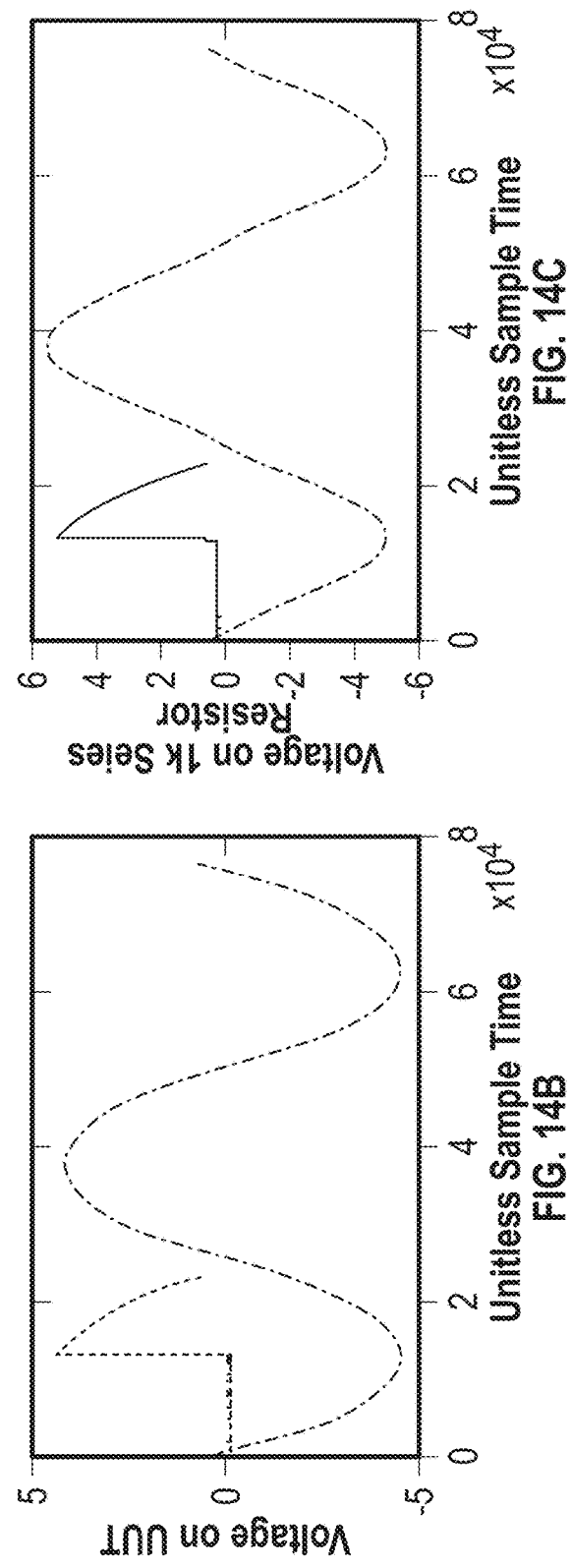

NANO MEMORY DEVICE

PRIORITY STATEMENT

This application is continuation of U.S. Non-provisional patent application Ser. No. 16/381,641, filed on Apr. 11, 2019, titled NANO MEMORY DEVICE, which claims priority to U.S. Provisional Patent Application No. 62/656,862, filed on Apr. 12, 2018, titled NANO MEMORY DEVICE, U.S. Provisional Patent Application No. 62/656,725 filed on Apr. 12, 2018 titled CONDUCTIVE GREASE WITH ENHANCED THERMAL OR ELECTRICAL CONDUCTIVITY AND REDUCED AMOUNT OF CARBON PARTICLE LOADING, and U.S. Provisional Patent Application No. 62/656,773 filed on Apr. 12, 2018 titled FLEXIBLE NANO COATING WITH SIGNIFICANTLY ENHANCED ELECTRICAL, THERMAL AND SEMICONDUCTOR PROPERTIES all of which are hereby incorporated by reference in their entirety.

FIELD OF THE INVENTION

The present invention relates to electronic devices. Particularly, the present invention relates to nano-electronic devices. More particularly, but not exclusively, the present invention relates to nano-electronic circuits.

BACKGROUND

A memristor (a.k.a., a memory resistor) is a non-linear passive two-terminal electrical component relating electric charge and magnetic flux linkage. It was envisioned, and its name coined, in 1971 by circuit theorist Leon Chua. According to the characterizing mathematical relations, the memristor would operate in the following way: the memristor's electrical resistance is not constant but depends on the history of current previously flowing through the device (i.e., its present resistance depends on how much electric charge has flowed in what direction through it in the past; the device remembers its history—the so-called non-volatility property). When the electric power supply is turned off, the memristor remembers its most recent resistance until it is turned on again.

Chua extrapolated a conceptual symmetry between the non-linear resistor (voltage vs. current), non-linear capacitor (voltage vs. charge) and non-linear inductor (magnetic flux linkage vs. current). He then inferred the possibility of a memristor as another fundamental non-linear circuit element linking magnetic flux and charge. In contrast to a linear (or non-linear) resistor the memristor has a dynamic relationship between current and voltage including a memory of past voltages or currents.

Memristor resistance depends on the integral of the input applied to the terminals (rather than on the instantaneous value of the input as in a varistor). Since the element "remembers" the amount of current last passing through, it was tagged by Chua with the name "memristor". Another way of describing a memristor is as any passive two-terminal circuit element maintaining a functional relationship between the time integral of current (i.e., charge) and the time integral of voltage (i.e., flux, as it is related to magnetic flux). The slope of this function is called the memristance M and is like variable resistance.

A varistor is an electronic component with an electrical resistance varying with the applied voltage. Also known as a voltage-dependent resistor (VDR), it has a nonlinear, non-ohmic current-voltage characteristic like a diode. In contrast to a diode however, it has the same characteristic for both directions of traversing current. At low voltage it has a high electrical resistance which decreases as the voltage is raised. Varistors are used as control or compensation elements in circuits either to provide optimal operating conditions or to protect against excessive transient voltages. When used as protection devices, they shunt the current created by the excessive voltage away from sensitive components when triggered.

With reference to FIGS. 17 & 18A-D are a Simulink Model & plot representation of a variable resistor circuit in accordance with the prior art is shown. As will be discussed in detail below regarding FIG. 1, a memristor, memcapacitor and/or meminductor will have a Lissajous curve where the hysteresis loop degenerates to a straight (linear) or curved line (non-linear) through the origin (i.e., it does not store energy). From the plots of FIGS. 18A-D, it can be seen the varistor does not pass through the origin. Furthermore, a varistor will not remember its last state as will the memristor, memcapacitor and/or meminductor described in detail below.

The memristor definition is based solely on the fundamental circuit variables of current and voltage and their time-integrals, just like the resistor, capacitor and inductor. Unlike those three elements however, which are allowed in linear time-invariant or LTI system theory, memristors of interest have a dynamic function with memory and may be described as some function of net charge. There is no such thing as a standard memristor. Instead, each device implements a function, wherein the integral of voltage determines the integral of current and vice versa. A linear time-invariant memristor, with a constant value for M, is simply a conventional resistor.

Leon Chua has argued the memristor definition could be generalized to cover all forms of two-terminal non-volatile memory devices based on resistance switching effects. These devices are intended for applications in nano-electronic memories, computer logic and neuromorphic/neuromemristive computer architectures.

Memcapacitor is a member of a family of new circuit elements postulated by Chua in the late seventies and presented as one of 4 guest lectures at the 1978 European Conference on Circuit Theory and Design (ECCTD). Memcapacitor was formally defined by Chua in 2003. The nanoscale circuit elements, i.e., memristor, memcapacitor, and meminductor, have memorial properties and can store information without power supplies.

Although an actual solid-state memcapacitor has not been yet realized, it is important to design effective memcapacitor models and make prospective studies for its applications. In 2009, a piecewise linear memcapacitor model was first presented.

Memcapacitive and meminductive systems are two recently postulated classes of circuit elements with memory complementing the class of memristive systems. Their main characteristic is a hysteretic loop—which may or may not pass through the origin—in their constitutive variables (charge-voltage for memcapacitors and current-flux for meminductors) when driven by a periodic input, and, unlike memristors, they can store energy. As of today, a few systems have been found to operate as memcapacitors and meminductors. However, these are neither available on the market yet, nor can their properties be easily tuned to investigate their role in more complex circuits. The same can be said about memristive systems. Therefore, electronic emulators of such memory elements easily built and tuned would be highly desirable, so these properties can be identified in the future.

Flash memories are currently by far the most widely used type of non-volatile memory (NVM), and phase-change memories (PCMs) are the most promising emerging NVM technology. Flash memories and PCM have many important common properties, including noisy cell programming, limited cell endurance, asymmetric cost in changing a cell state in different directions, the drifting of cell levels after programming, cell heterogeneities and the like. As representative NVMs, they have been, and likely will continue to be widely used in mobile, embedded and mass-storage systems. They are partially replacing hard drives and main memories and are fundamentally changing some computer architectures.

In 2008, a team at HP Labs claimed to have found Chua's missing memristor based on an analysis of a thin film of titanium dioxide thus connecting the operation of RRAM devices to the memristor concept. Following this claim, Leon Chua has argued the memristor definition could be generalized to cover all forms of two-terminal non-volatile memory devices based on resistance switching effects. In 2015, a self-directed channel ion-conducting memristor was made commercially available by KNOWN. However, this self-directed channel ion-conducting memristor has several drawbacks including: a low power threshold (e.g., much less than 0.1 watts), high sensitivity to ESD, multiple components (i.e., up to 12 standard components), no shipping product level device and the 16 pin IC DIP memristor sold by KNOWN can cost as much as $200.

There are several advantages of the memristor memory over conventional transistor-based memories. One is its strikingly small size. Though memristor is still at its early development stage, its size is at most one tenth of its RAM counterparts. If the fabrication technology for the memristor is improved, the size advantage could be even more significant. Another feature of the memristor is its incomparable potential to store analog information, which enables the memristor to keep multiple bits of information in a memory cell. Besides these features, the memristor is also an ideal device for implementing synaptic weights in artificial neural networks Therefore, what is needed is an efficient and effective way to produce non-volatile memory devices on a nano-scale. Further, what is needed is a nano memory device capable of handling power up to and greater than 4 watts. Further, what is needed is a nano memory device not sensitive to ESD. Further, what is needed is a nano-scale and one component non-volatile memory device. Further, what is needed is an inexpensive nano memory device.

SUMMARY

Therefore, it is a primary object, feature, or advantage of the present invention to improve over the state of the art.

A non-volatile memory circuit in embodiments of the present invention may have one or more of the following features: (a) a logic source, and (b) a semi-conductive device being electrically coupled to the logic source, having a first terminal, a second terminal and a nano-grease with significantly reduced amount of carbon nanotube loading located between the first and second terminal, wherein the nano-grease exhibits non-volatile memory characteristics.

A non-volatile memory circuit in embodiments of the present invention may have one or more of the following features: (a) a voltage source, (b) a semi-conductive device being electrically coupled to the logic source, having a first terminal, a second terminal and a nano-grease with significantly reduced amount of carbon nanotube loading located between the first and second terminal, wherein the nano-grease exhibits non-volatile memory characteristics, and (c) a voltage sensor electrically coupled in parallel with the semi-conductive device capable of measuring the voltage drop at the semi-conductive device.

One or more of these and/or other objects, features, or advantages of the present invention will become apparent from the specification and claims follow. No single embodiment need provide every object, feature, or advantage. Different embodiments may have different objects, features, or advantages. Therefore, the present invention is not to be limited to or by any objects, features, or advantages stated herein.

BRIEF DESCRIPTION OF THE DRAWINGS

Illustrated embodiments of the disclosure are described in detail below with reference to the attached drawing figures, which are incorporated by reference herein.

FIGS. 13A-C are Simulink Model plots of a Simulink Model representation of a power memristor circuit for a variable DC power supply using a memristor bridge in accordance with an embodiment of the present invention;

FIGS. 14A-C are Simulink Model plots of a Simulink Model representation of a memristor circuit in accordance with an embodiment of the present invention;

Figure 1:
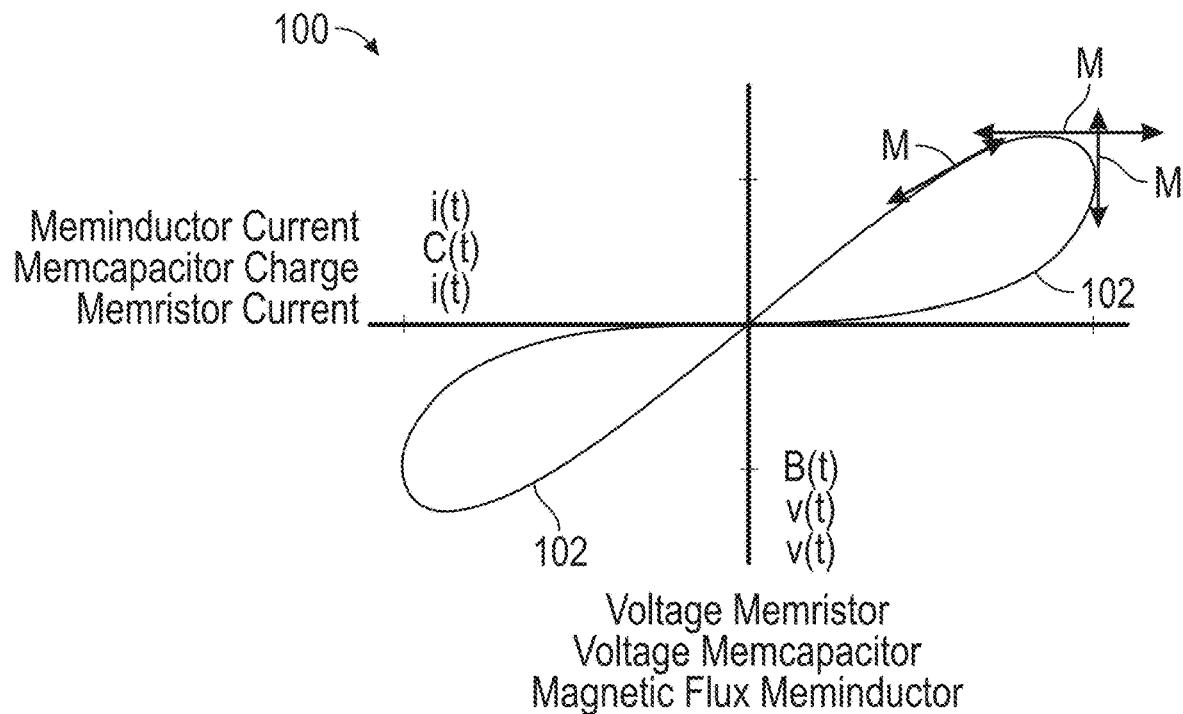
FIG. 1 is a Lissajous curve showing memristive-memcapacitive-meminductive properties in accordance with an embodiment of the present invention.

Some of the figures include graphical and ornamental elements. It is to be understood the illustrative embodiments contemplate all permutations and combinations of the various graphical elements set forth in the figures thereof.

DETAILED DESCRIPTION

The following discussion is presented to enable a person skilled in the art to make and use the present teachings. Various modifications to the illustrated embodiments will be plain to those skilled in the art, and the generic principles herein may be applied to other embodiments and applications without departing from the present teachings. Thus, the present teachings are not intended to be limited to embodiments shown but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings. While embodiments of the present invention are discussed in terms of power nano memory devices, it is fully contemplated embodiments of the present invention could be used in most any nanoscale memory device without departing from the spirit of the invention.

Embodiments of the present invention can utilize a nano-grease with significantly reduced amount of carbon nano-tube (SWNT (single wall nanotube), double-walled nanotubes ("DWNT"), and MWNT (multi-wall nanotube)) loading as disclosed in detail below. One embodiment discloses a stable conductive grease composition comprising a base oil and nanomaterial, wherein the nanomaterial is a functionalized nanomaterial having one or more of a first functional group capable of forming a hydrogen bond or boron nanomaterial; and wherein the base oil comprises one or more of a second functional group capable of forming a hydrogen bond with the first function group of the nanomaterial.

In another embodiment, a stable and homogeneous grease based on carbon nanotubes (hereinafter referenced to as CNT) (i.e., single-wall and multi-wall) in polyalphaolefin oil being produced without using a chemical surfactant. For example, for a 22-24 wt % (14-15 vol %) multi-wall CNT loading, the thermal conductivity (TC) of the grease shows a 70-80% increase compared to no nanotube loading. In addition, the grease is electrically conductive, has a high dropping point, good temperature resistance, and does not react with copper at temperatures up to 177° C. Additional embodiments disclose a new way to produce the grease with low nanotube loading (SWNT<2.5 wt %, MWNT<1.5 wt %).

In some embodiments the inventors have made several quality greases by three roll mills. They are:

7.5 wt % MWNT-OH/92.5 wt % N650HT (FIG. 7)
7.5 wt % MWNT-OH/92.5 wt % PAO
1.4 wt % MWNT-OH/98.6 wt % Krytox
2.5 wt % SWNT-OH/97.5 wt % PAO The inventors have found all nano-greases produced are stable. No oil leaks are found for these 4 grease samples for at least 10 days. More physical properties such as dropping point, penetration length, thermal conductivity, electrical conductivity, rheology behavior, etc. have greatly improved qualities.

The inventors have discovered the nano-grease with significantly reduced amount of carbon nanotubes (SWNT and MWNT) displays some unique electrical attributes. The inventors have found the nano-grease with significantly reduced amount of carbon nanotubes displays electrical attributes common to a memristor, a memcapacitor and a meminductor which is discussed in greater detail below. The use of this nano-grease with significantly reduced amount of carbon nanotubes as a memristor, a memcapacitor and meminductor has great potential in several industries.

They could be implemented as transistors. Nanoparticle composites could be combined into devices called crossbar latches, which could replace transistors in future computers, given their much higher circuit density. They can potentially be fashioned into non-volatile solid-state memory, which would allow greater data density than hard drives with access times like DRAM, replacing both components. Nanoparticle composite applications could include programmable logic, signal processing, neural networks, control systems, reconfigurable computing, brain-computer interfaces and RFID.

Nanoparticle composite devices are potentially useful for stateful logic implication, allowing a replacement for CMOS-based logic computation. Nanoparticle composites could be used for adaptive behavior of unicellular organisms. For example, subjected to a train of periodic pulses, a circuit learns and anticipates the next pulse like the behavior of slime molds where the viscosity of channels in the cytoplasm responds to periodic environment changes. Applications of such circuits may include pattern recognition. Neuromorphic architectures may be based on nanoparticle composite memristive systems. Whole-brain nanoparticle composite circuits can power a virtual and robotic agent using memristive hardware. Nanoparticle composite memristors can be used as non-volatile analog memories and can mimic classic habituation and learning phenomena. According to Allied Market Research the memristor market was worth $3.2 million in 2015 and will be worth $79.0 million by 2022.

With reference to FIG. 1, one of the resulting properties of memristors, memcapacitors and meminductors is the existence of a pinched hysteresis effect, shown by the Lissajous curve 100, in the voltage-current, voltage-charge and magnetic flux-current plane when driven by any bipolar periodic voltage or current without respect to initial conditions. For a current-controlled memristive system, the input u(t) is the current i(t), the output y(t) is the voltage v(t), and the slope of the curve M represents the electrical resistance, capacitance or inductance. The change in slope M of the pinched hysteresis curve 102 demonstrates switching between different resistance states which is a phenomenon central to ReRAM and other forms of two-terminal resistance memory. The area of each lobe of the pinched hysteresis loop 102 shrinks as the frequency of the forcing signal increases. Memristive theory predicts the pinched hysteresis effect will degenerate, resulting in a straight-line representative of a linear resistor. As the frequency tends to infinity, the hysteresis loop degenerates to a straight (linear) or curved line (non-linear) through the origin (i.e., it does not store energy).

Memcapacitors and meminductors have an almost identical pinched hysteresis effect and are shown in FIG. 1 as well. Thus, the change in slope M of the pinched hysteresis curve 102 demonstrates switching between different capacitive states for a memcapacitor and a switching of different inductive states for a meminductor. As with the memristor, theory predicts the hysteresis effect will degenerate into a straight-line representative of a linear capacitor and/or inductor. This is because the higher the frequency goes the more the input appears to be constant and thus the memcapacitor will behave as a standard capacitor and a meminductor will behave as a standard inductor.

Figure 2:
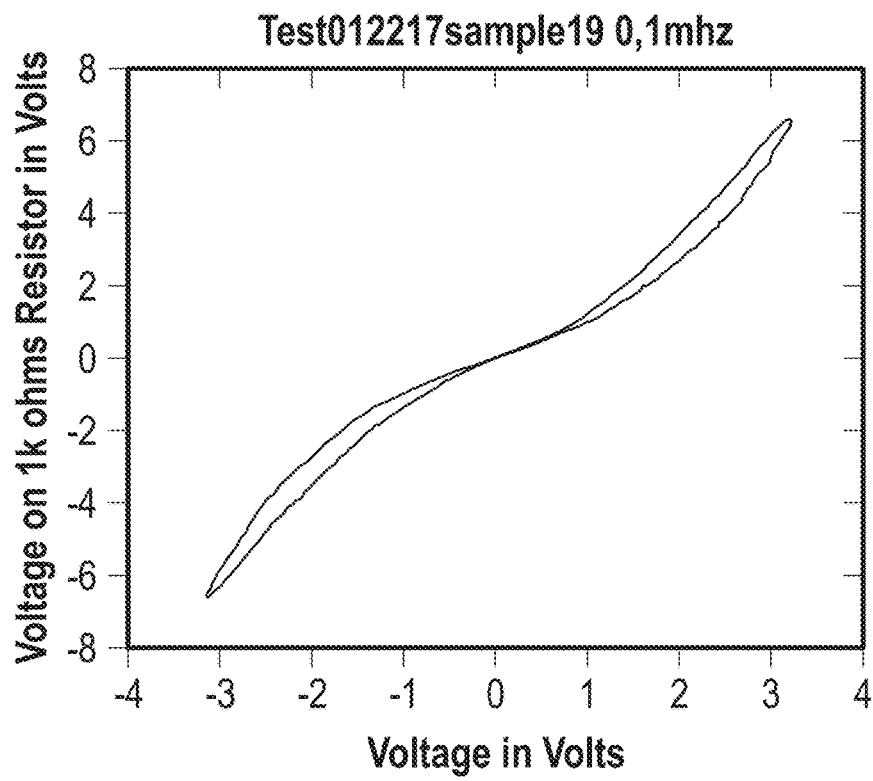
FIG. 2 is a sample plot of current vs. voltage curve with 10V point to point (P-P AC 0.1 Mhz voltage) applied to nano-grease in series with a 1K ohm resistor in accordance with an embodiment of the present invention.

With reference to FIG. 2, a sample plot of current vs. voltage curve with 10V point to point (P-P AC 0.1 Mhz voltage) applied to the nano-grease 300 with significantly reduced amount of carbon nanotubes (SWNT and MWNT) of FIG. 3, and discussed in detail below, in series with a 1K ohm resistor in accordance with an embodiment of the present invention. As can clearly be seen the electrical response of the carbon nanotube structure significantly resembles the Lissajous curve 100 for a memristor. FIG. 2 clearly shows the carbon nanotube structure disclosed in embodiments of the present application have memristive properties and could be used to implement memristors on a nanoscale.

Figure 3:
FIG. 3 is a pictorial representation of nano-grease in accordance with an embodiment of the present invention.
Figure 4:
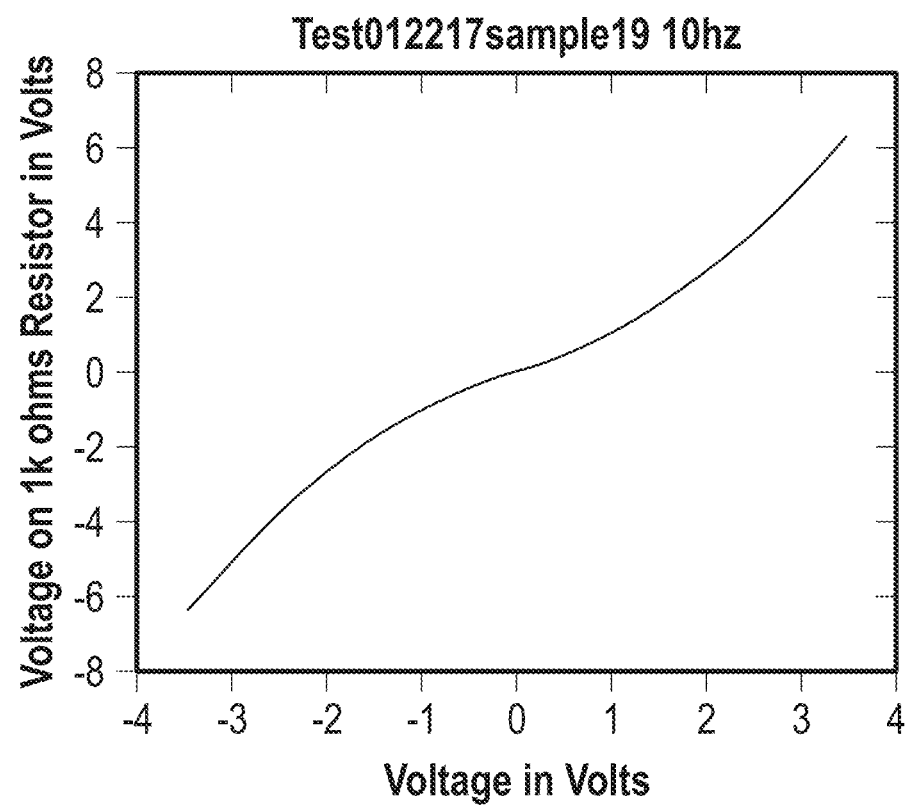
FIG. 4 is a sample plot of current vs. voltage curve with 10V point to point (P-P AC 10 Mhz voltage) applied to nano-grease materials in series with a 1K ohm resistor in accordance with an embodiment of the present invention
Figure 5:
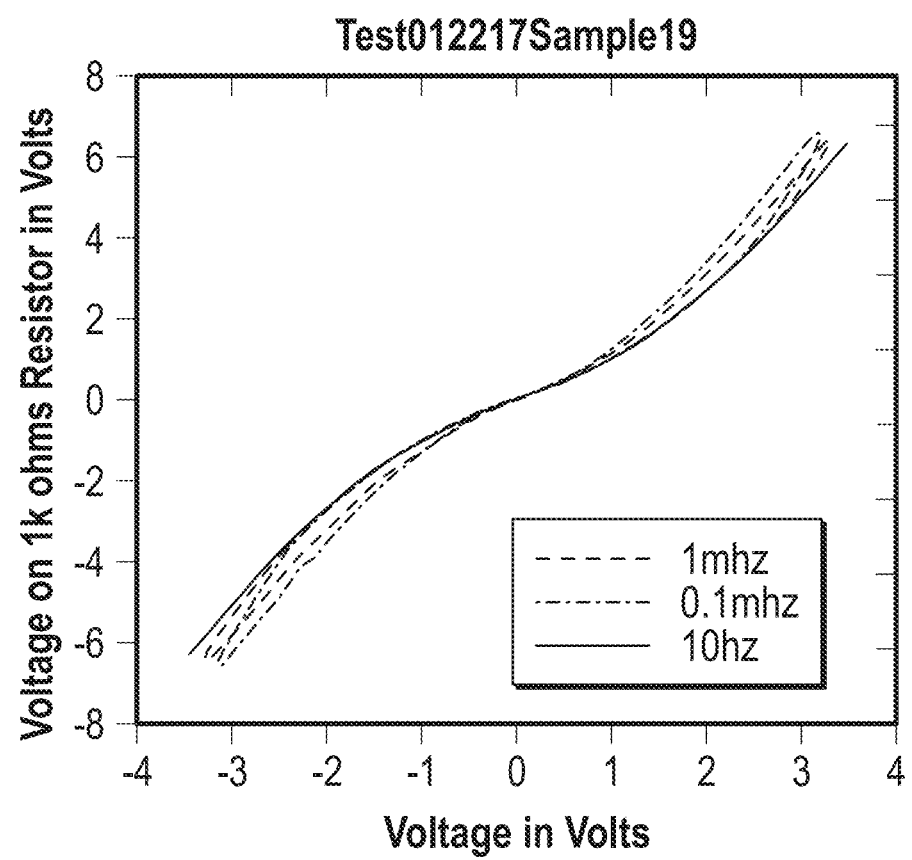
FIG. 5 is sample plot of current vs. voltage curve with 10V point to point (P-P AC 0.1 Mhz, 1 Mhz & 10 Mhz voltage) applied to nano-grease materials in series with a 1K ohm resistor in accordance with an embodiment of the present invention.

With reference to FIGS. 4 & 5, sample plots for different test frequencies of current vs. voltage curve with 10V point to point (P-P AC voltage) applied to the carbon nanotube structure 300 of FIG. 3 and discussed above in series with a 1K ohm resistor. The plots are recreated at different frequencies getting similar results but different areas under the curve for the varying frequencies.

Figure 6:
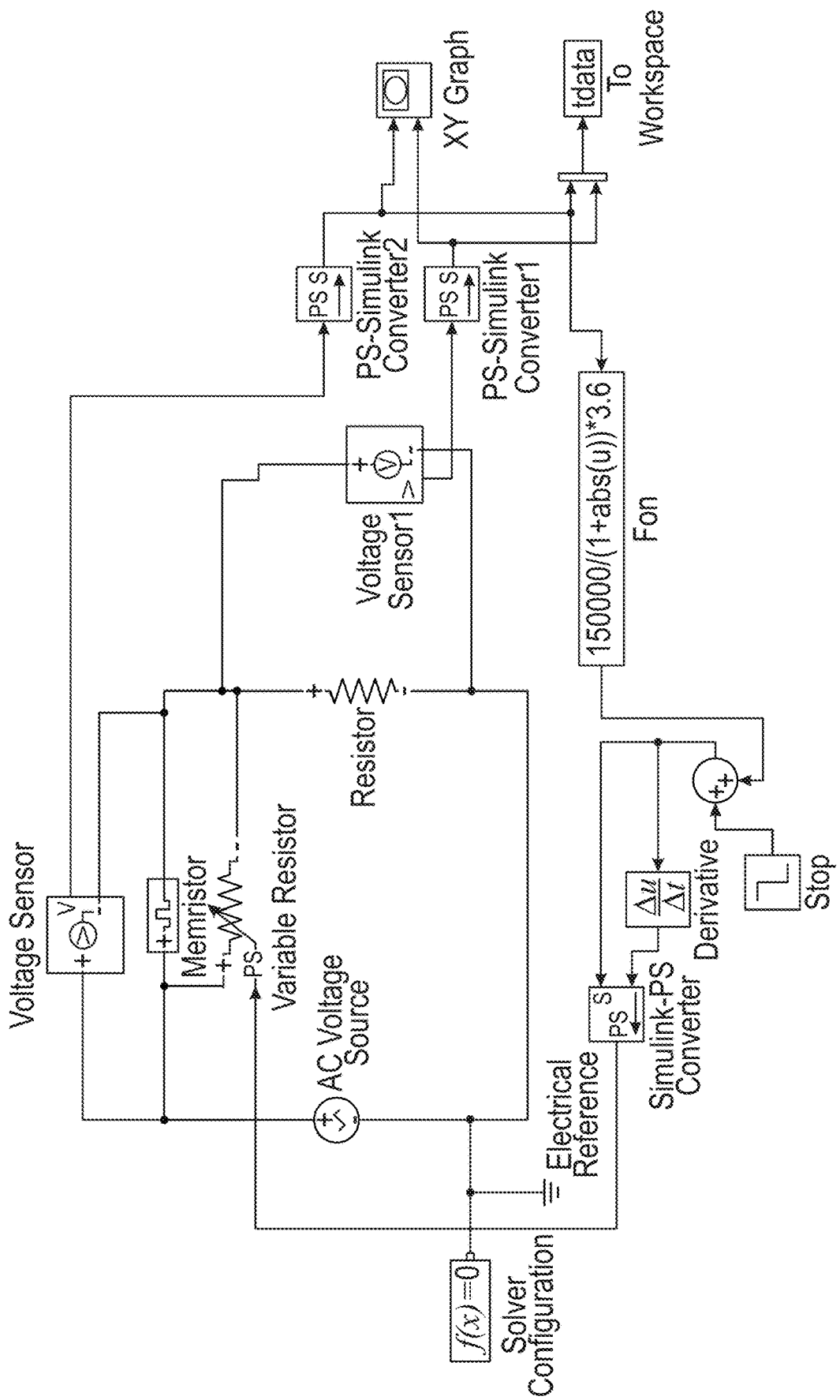
FIG. 6 is a Simulink Model representation of the electrical behavior response of nano-grease materials in accordance with embodiments of the present invention.
Figure 7:
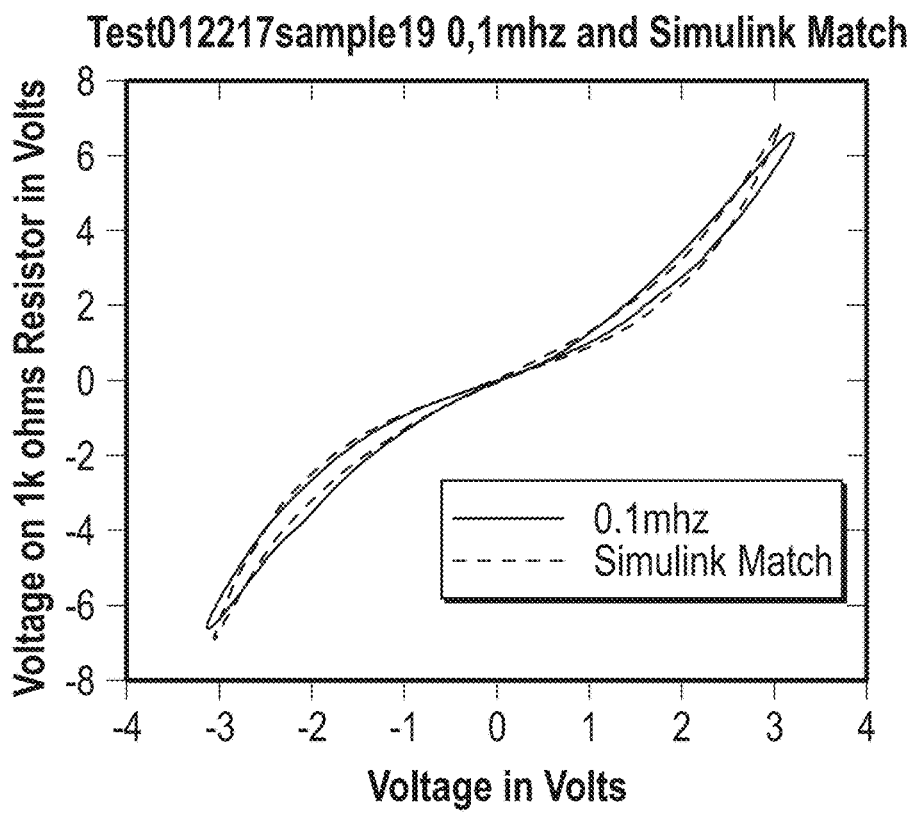
FIG. 7 is a Simulink Model plot of a Simulink Model representation of a memristor circuit and a plot of the electrical response for the nano-grease materials in accordance with an embodiment of the present invention.

With reference to FIGS. 6 & 7 a Simulink Model representation and plot of the electrical behavior of nano-grease materials in accordance with the present invention is shown. To determine the electrical behavioral properties of the nano-grease detailed below, the inventors set out to create a Simulink Model of a memristor at 0.1 Mhz. Simulink is a graphical programming environment for modeling, simulating and analyzing multidomain dynamical systems. Its primary interface is a graphical block diagramming tool and a customizable set of block libraries. It offers tight integration with the MATLAB environment and can either drive MATLAB or be scripted from it. Simulink is widely used in automatic control and digital signal processing for multidomain simulation and Model-Based Design.

From the graph shown in FIG. 7, it can be seen the memristive Simulink Model of FIG. 6 plots almost overtop of the test results on the nano-grease. Thus, the inventors have found a material which provides substantial memristive properties and can be utilized to create nano-scale memory circuits.

Figure 8:
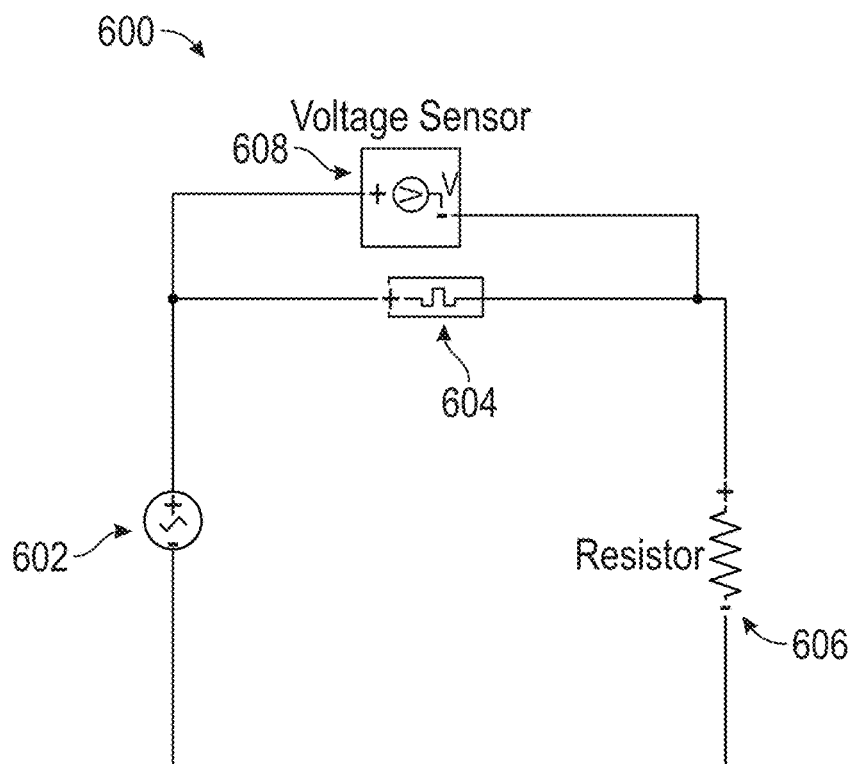
FIG. 8 is a pictorial representation of a nano-grease memristor circuit in accordance with an embodiment of the present invention.

With reference to FIG. 8, a pictorial representation of a circuit having a nano-grease memristor structure with a significantly reduced amount of carbon nanotubes (SWNT and MWNT) in accordance with an embodiment of the present invention is shown. Nano non-volatile memory circuit 600 is a general and simplified depiction of a non-volatile memory circuit in accordance with an embodiment of the present invention. As can be seen, logic source 602 is only shown connected to one carbon nanotube memristor 604, however, it is fully contemplated logic source 602 could be the input for several nanotube memristors 604 up to tens of trillions of carbon nanotube memristors 604. Logic source 602 could be most any input to a nano non-volatile memory circuit 600 without departing from the spirit of the invention.

In the structure of memristor 604, nano-grease 300 is the material separating the two terminal conductors.

The logic source 602 may include circuitry, chips and other digital logic. The logic source 602 may represent hardware, software, firmware or any combination thereof. In one embodiment, the logic source 602 may include one or more processors. Logic source 602 may also represent an application specific integrated circuit (ASIC), system-on-a-chip (SOC) or field programmable gate array (FPGA). In one embodiment, the logic source 602 is circuitry or logic enabled to control execution of a set of instructions and provide an output to memristor 604. The logic source 602 may be one or more microprocessors, digital signal processors, application-specific integrated circuits (ASIC), central processing units, analog input or other devices suitable for controlling an electronic device including one or more hardware and software elements, executing software, instructions, programs, and applications, converting and processing signals and information and performing other related tasks. The logic source 602 may be a single chip or integrated with other computing or communications components.

Logic source 602 could be most any level of voltage, such as an analog input, and could represent binary states (e.g., 1, 0 or 1, 0, −1). Logic source 602 could be any analog, digital and/or combination source providing the current state of a system. The structure of carbon nanotube memristor 604 having enhanced electrical properties is fully discussed in detail above and below. A 1 kohm resistor 606 is shown in series with carbon nanotube memristor 604. Voltage sensor 608 is shown in parallel with carbon nanotube memristor 604 and is used to detect the voltage drop across carbon nanotube memristor 604. The voltage drop across carbon nanotube memristor 604 will show the state of carbon nanotube memristor 604. E.g., either a high state, a zero state, a low state or an analog voltage, current or magnetic flux.

The inventors had additionally found other beneficial properties to the nano-grease described in detail below. Memristor 604 can handle relatively high-power inputs up to and including greater than 4 Watts. Further, memristor 604 is not sensitive to ESD. The current memristor cell 604 takes up 1 cubic centimeter, which is significantly smaller than previous designs. Further, the total cost of memristor cell 604 for production is $2 per unit; therefore, significantly less expensive than previous memristors.

Figure 9:
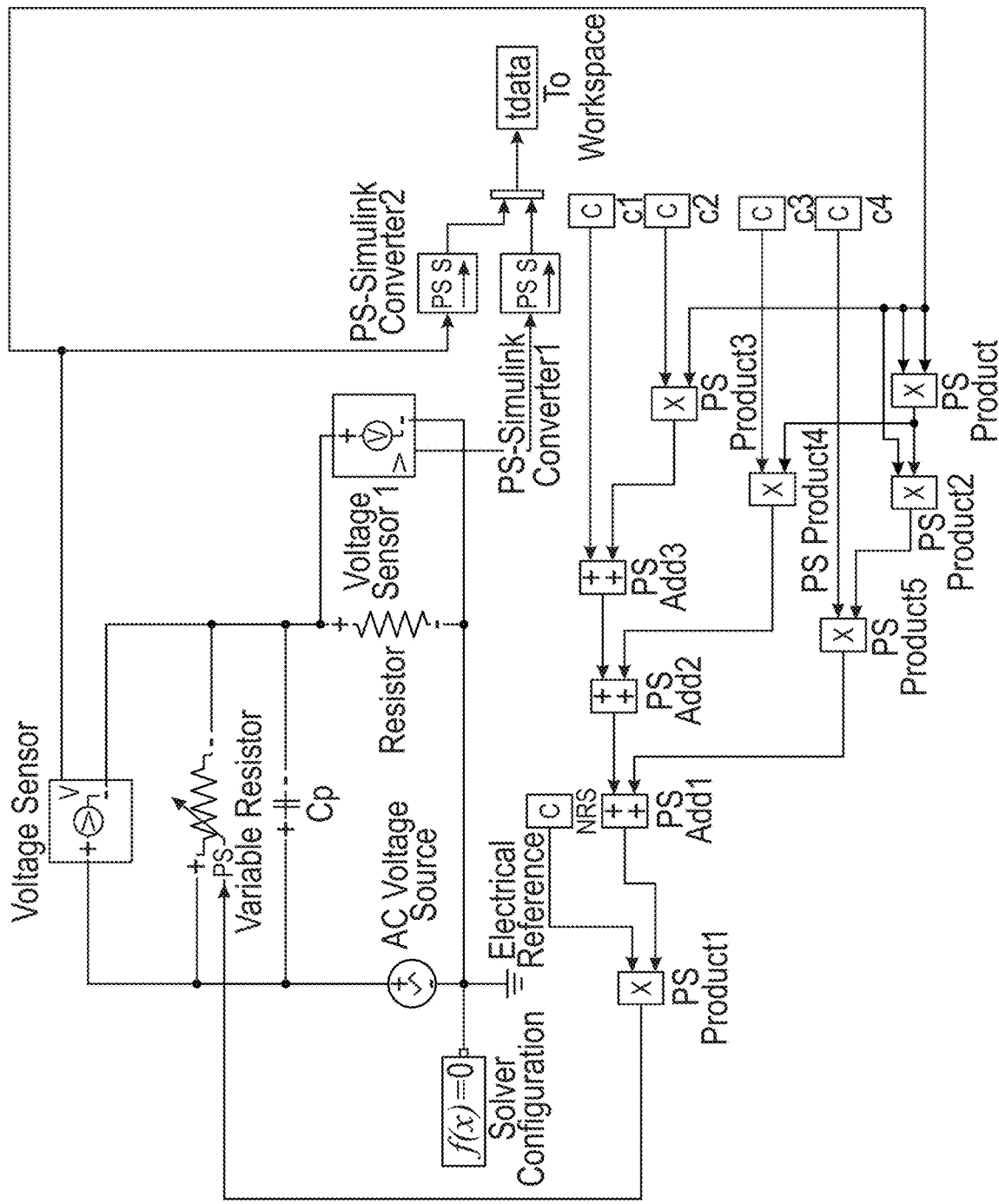
FIG. 9 is a pictorial representation of a Simulink Model representation of a nano-grease memcapacitor circuit in accordance with an embodiment of the present invention.
Figure 10A:
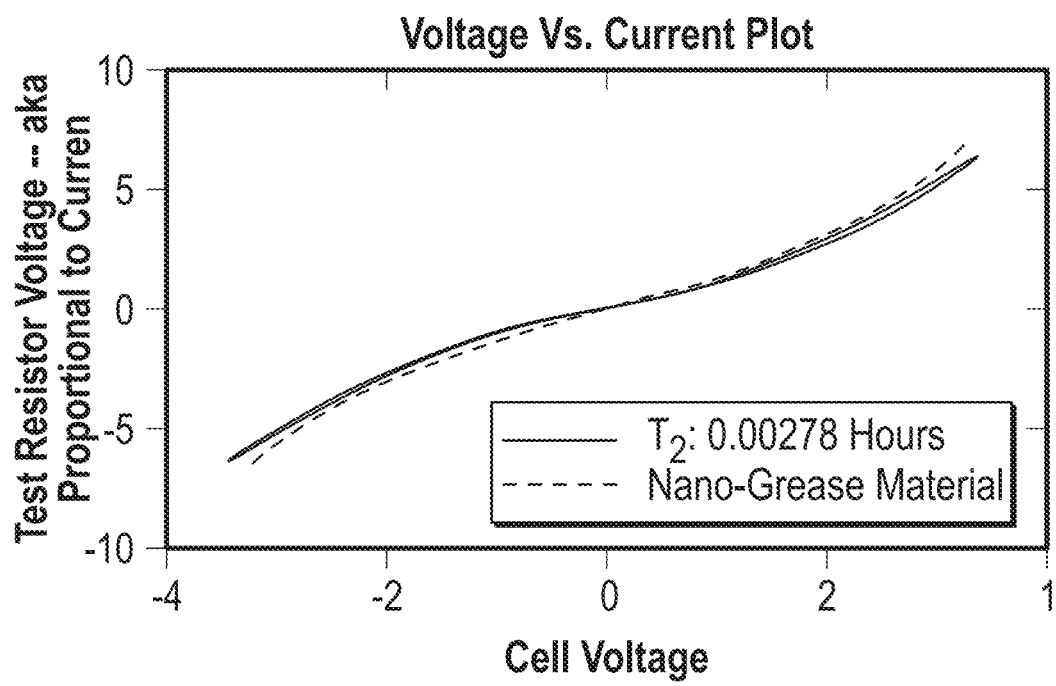
FIGS. 10A-D are a Simulink Model plots of a Simulink Model representation of a memcapacitor circuit and plot for the electrical response of the nano-grease materials in accordance with an embodiment of the present invention.
Figure 10B:
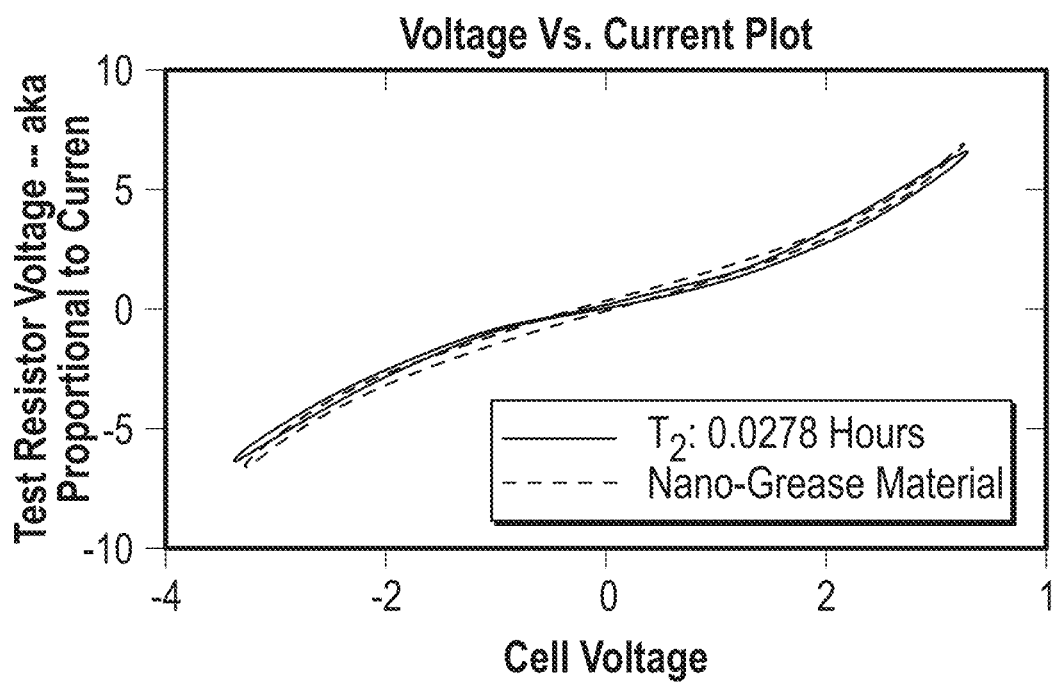
Figure 10C:
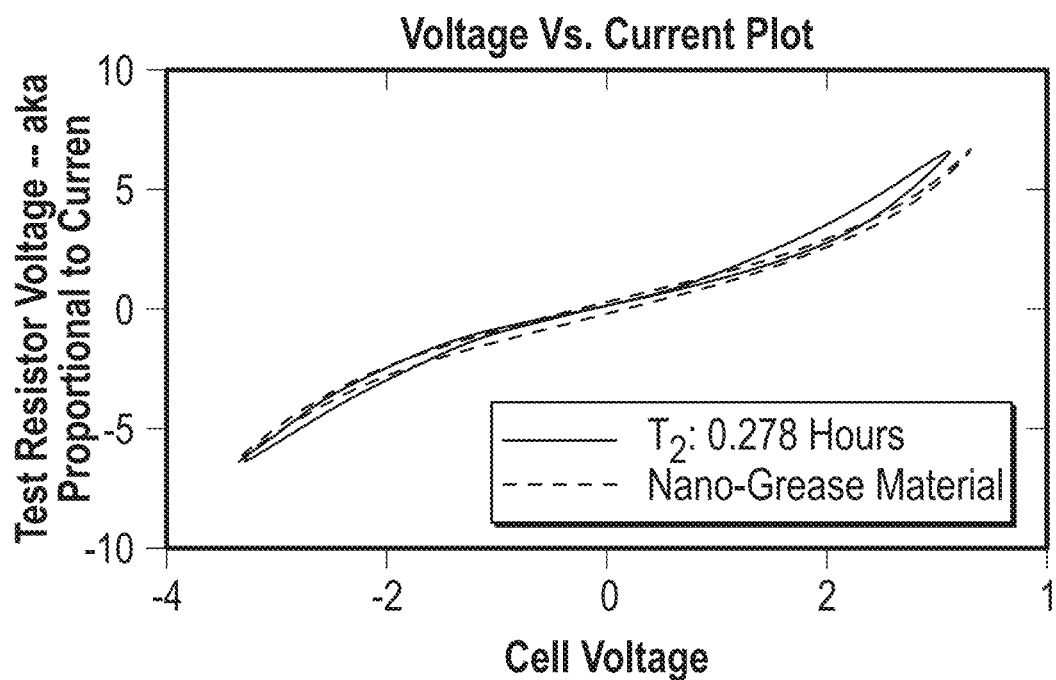
Figure 10D:
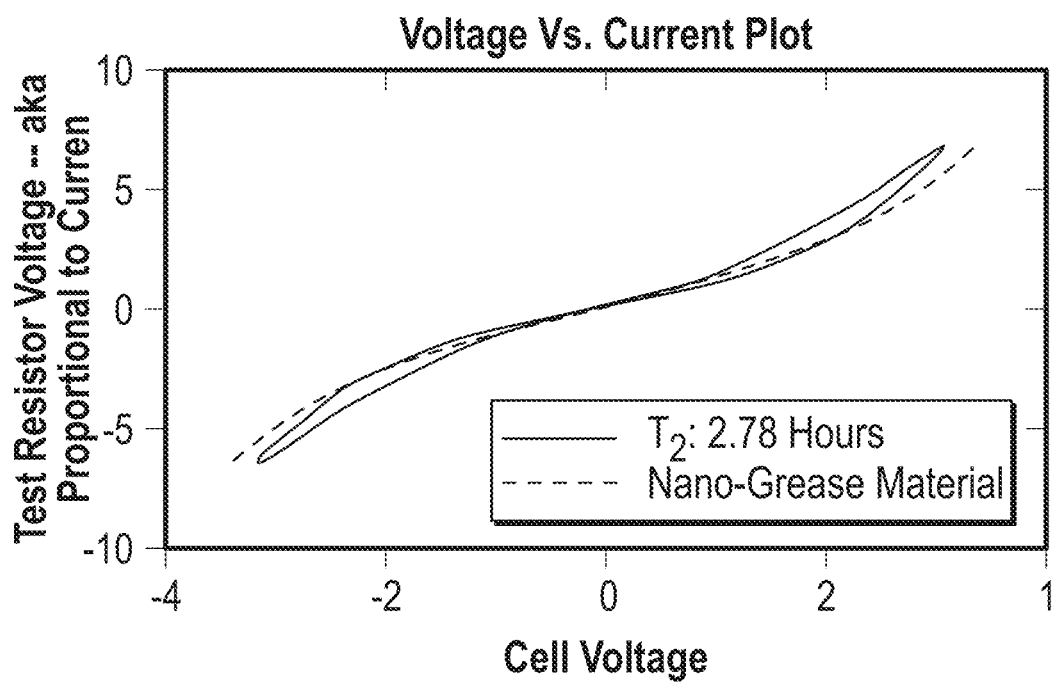

With reference to FIG. 9 a pictorial representation of a Simulink Model representation of a memcapacitor circuit of the nano-grease materials in accordance with an embodiment of the present invention is shown. What the inventors have discovered is the nano-grease discussed in detail below displays memcapacitive and meminductive properties as well. The Simulink Model of FIG. 9 shows a sample circuit of a memcapacitive circuit. With these properties known, it is fully contemplated a nano-grease gel cell, such as memristive circuit 604 could be used in most any memory utility to perform non-static memory functions. It could function as a memristor, memcapacitor or meminductor. The only variables to decide its function would be the varying input, either voltage or magnetic flux.

With reference to FIGS. 10A-D Simulink Model plots of a Simulink Model representation of a memcapacitor circuit and plot for the nano-grease materials electrical response in accordance with an embodiment of the present invention is shown. From the charts on FIGS. 10A-D it can be seen the charge on the memcapacitive cell plots almost on top of the Simulink Model. Thus, the inventors have discovered the nano-grease material can be placed in a cell and the materials have capacitive properties having a non-volatile memory property. Also, from the plots, it can be shown these properties held up over a period. From plot A where the tests were run for 10 seconds, to plot B where the tests were run for 1 minute 40 seconds, to plot C where the tests were run for 16 minutes 40 seconds and finally to plot D where the tests were run for 2 hours 46 minutes and 28 seconds it can be shown the nano-grease material holds its non-volatile memory capacity over time as well.

Figure 11:
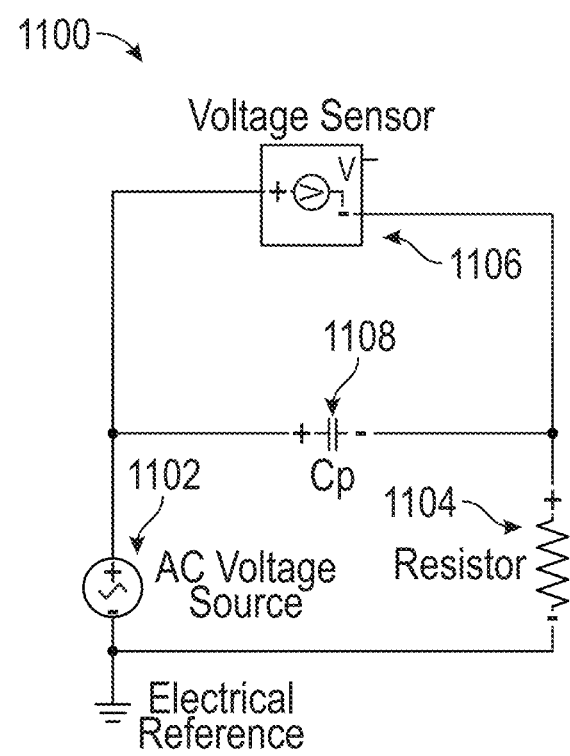
FIG. 11 is a pictorial representation of a nano-grease memcapacitor circuit in accordance with an embodiment of the present invention.

With reference to FIG. 11 a pictorial representation of a nano-grease memcapacitor circuit in accordance with an embodiment of the present invention is shown. Memcapacitive gel cell circuit 1100 may have an AC voltage source 1102, a resistor 1104, a memcapacitive gel cell 1108 and a voltage sensor 1106 in a most simplified and basic sense. Memcapacitive gel cell circuit 1100 is a general and simplified depiction of a non-volatile memory circuit in accordance with an embodiment of the present invention. As can be seen, AC voltage source 1102 is only shown connected to one memcapacitor gel cell 1108, however, it is fully contemplated AC voltage source 1102 could be the input for several memcapacitive gel cells 1108 up to tens of trillions of memcapacitive gel cells 1108. AC voltage source 1102 could be most any varying voltage, current or magnetic flux input to a nano non-volatile memory circuit without departing from the spirit of the invention.

In the structure of memcapacitor gel cell 1108, nano-grease 300 is the dielectric within the capacitor. In the structure of meminductor, nano-grease 300 is the core within the inductor.

AC voltage source 1102 could be most any level of voltage, such as an analog input, and could represent binary states (e.g., 1, 0 or 1, 0, −1). A 1 kohm resistor 1104 is shown in series with memcapacitive gel cell 1108. Voltage sensor 1106 is shown in parallel with memcapacitive gel cell 1108 and is used to detect the charge across memcapacitive gel cell 1108. The charge on memcapacitive gel cell 1108 will show the state of memcapacitive gel cell 1108. E.g., either a high state, a zero state, a low state or an analog voltage, current or magnetic flux.

Figure 12:
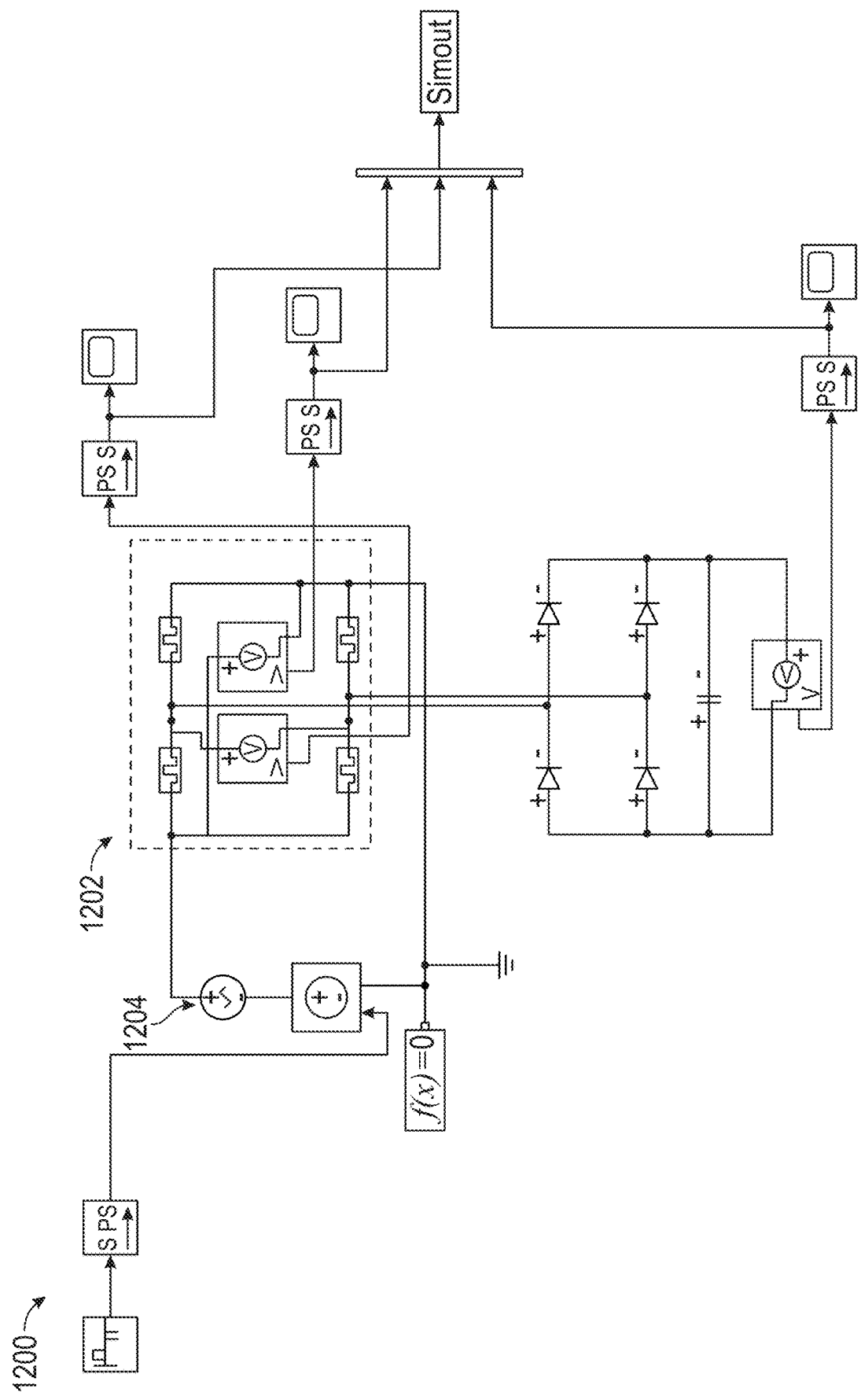
FIG. 12 is a Simulink Model representation of a power memristor circuit for a variable DC power supply using a memristor bridge in accordance with an embodiment of the present invention.
Figure 15A:
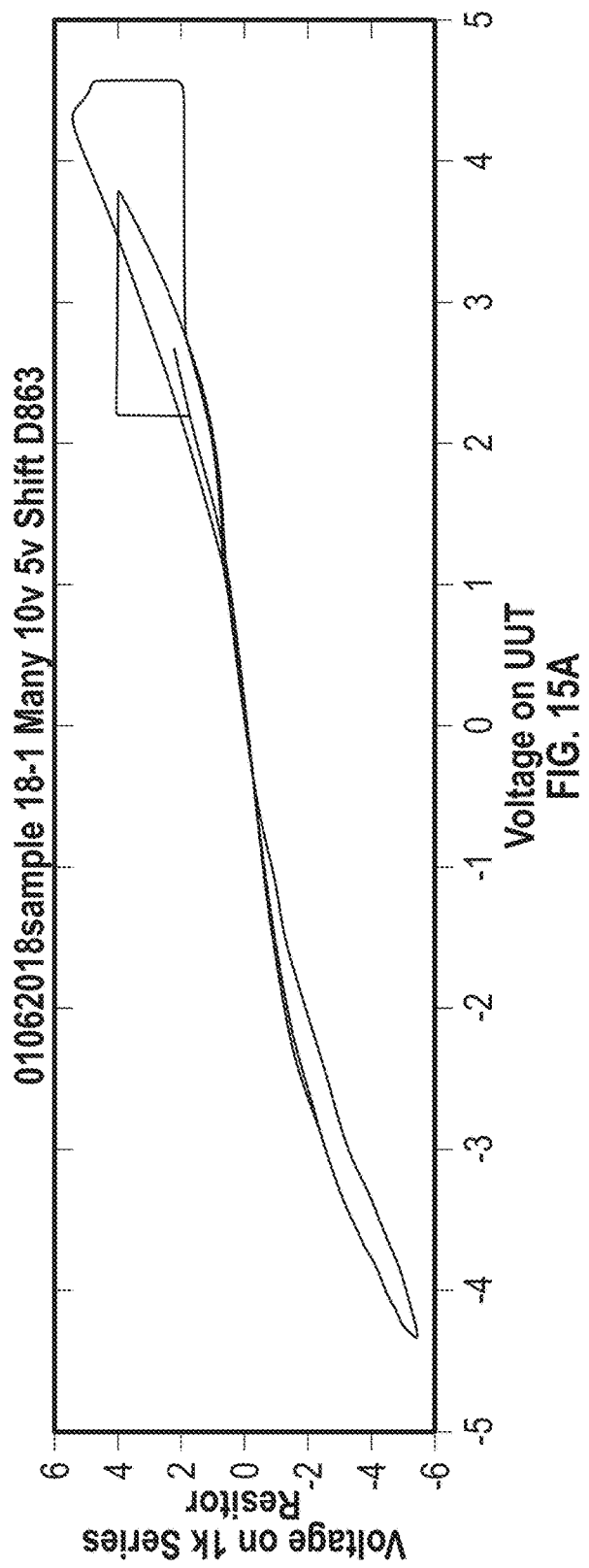
FIGS. 15A-C are Simulink Model plots of a Simulink Model representation of a memristor circuit in accordance with an embodiment of the present invention.
Figure 15B:
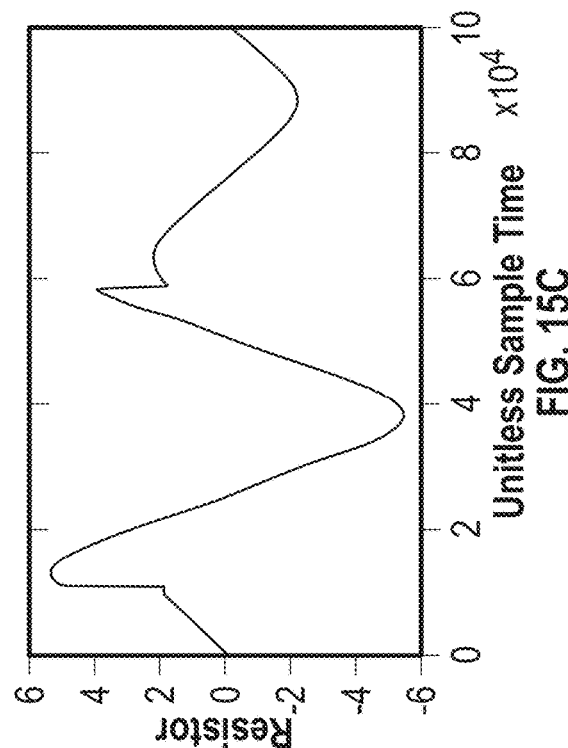
Figure 15C:
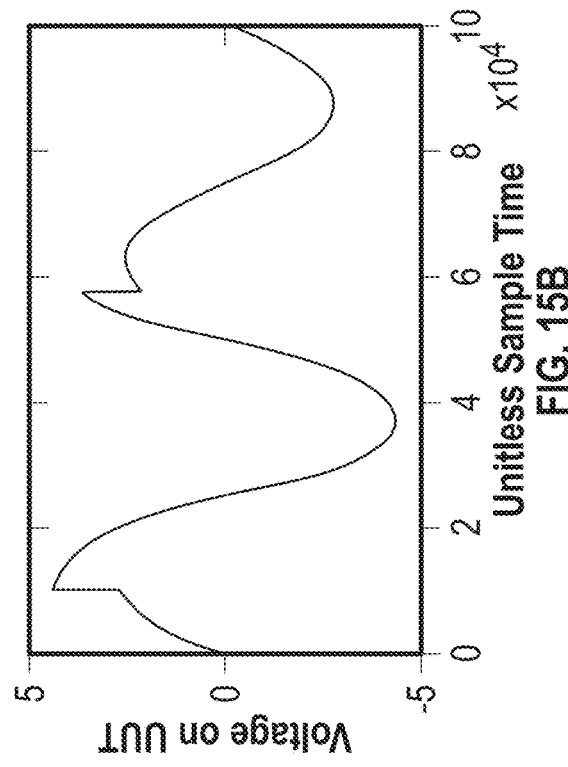

With reference to FIG. 12 a Simulink Model representation of a power memristor circuit for a variable DC power supply using a memristor bridge in accordance with an embodiment of the present invention is shown. Power memristor circuit 1200 for a variable DC power supply using a memristor bridge 1202. Power memristor circuit 1200 can be controlled by DC offsets in the driving signal and the sinusoidal AC power source 1204 could also be substituted with an AC pulse width modulation (PWM) source for greater power efficiency.

With reference to FIGS. 13A-C are Simulink Model plots of a Simulink Model representation of a power memristor circuit for a variable DC power supply using a memristor bridge in accordance with an embodiment of the present invention is shown. The plots of FIG. 13 verify the functionality of the memristor circuit 1200. Several DC output setpoints are shown having successfully achieved varying DC outputs.

FIGS. 14A-C are Simulink Model plots of a Simulink Model representation of a memristor circuit in accordance with an embodiment of the present invention is shown. FIG. 14 shows plots verifying the memristor circuits discussed above provide non-volatile memory. Moreover, the plots in FIG. 14 show the nano-grease 300 resistance is a function of the applied electric potential and/or current history of the device. It's interesting to note, the slow change in voltage curve (1400) varies from the fast change in voltage curve (1402), but when the voltage variation returns to a similar pattern the curves converge together over time. In a non-memory device, any change would simply track the same curve (albeit at a different rate). In a similar fashion, rapid changes of voltage are deviations from the slow variation curve but converge to the limit cycle when it returns to its sinusoidal pattern.

Figure 16:
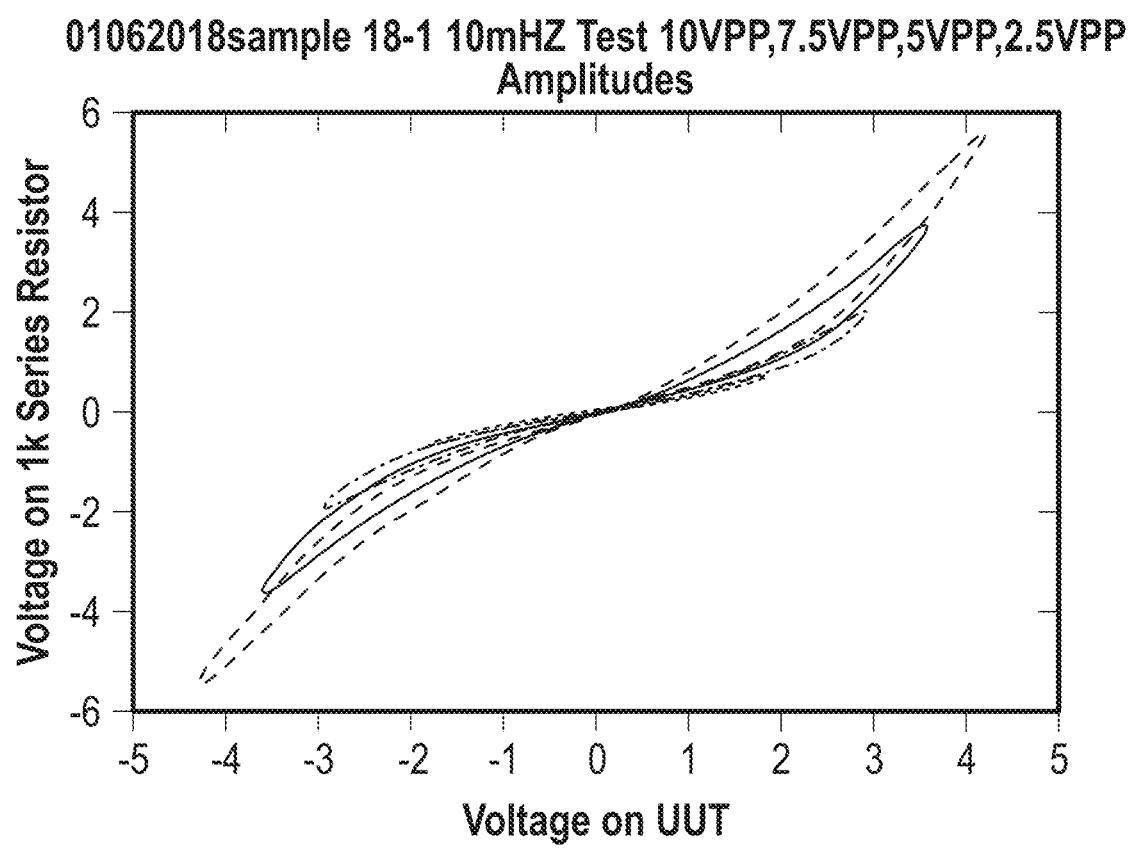
FIG. 16 are Simulink Model plots of a Simulink Model representation of a memristor circuit in accordance with an embodiment of the present invention.
Figure 17:
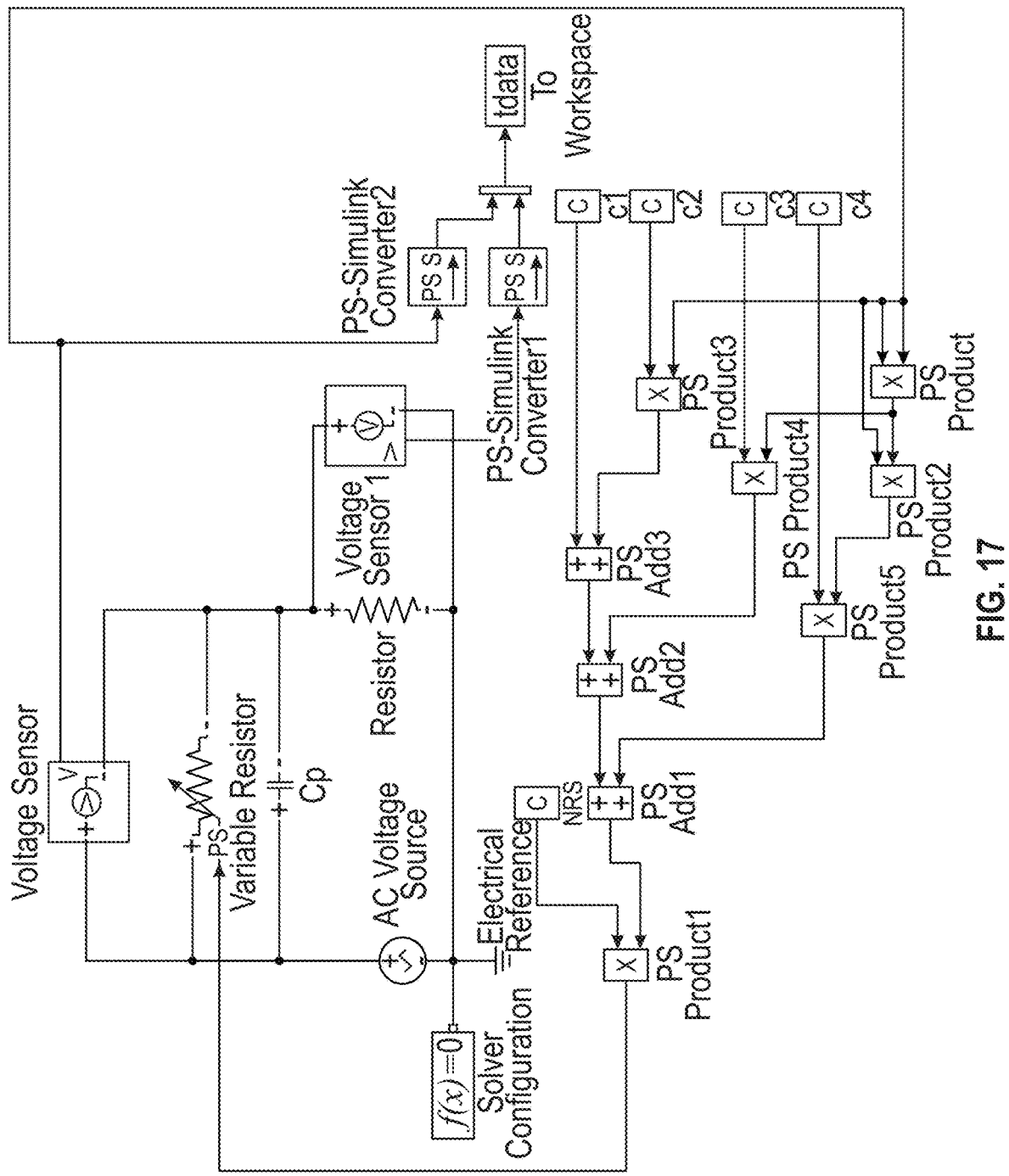
FIG. 17 is a Simulink Model representation of a variable resistor circuit in accordance with the prior art.
Figure 18A:
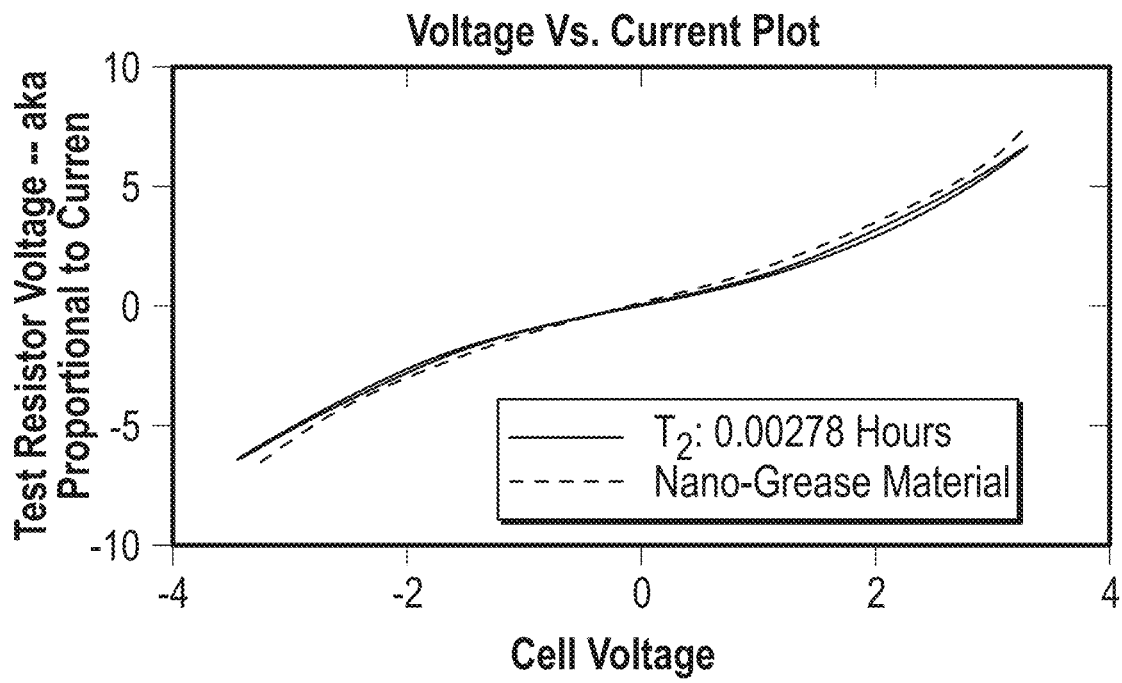
FIGS. 18A-D are Simulink Model plots of a Simulink Model representation of a variable resistor circuit in accordance with the prior art.
Figure 18B:
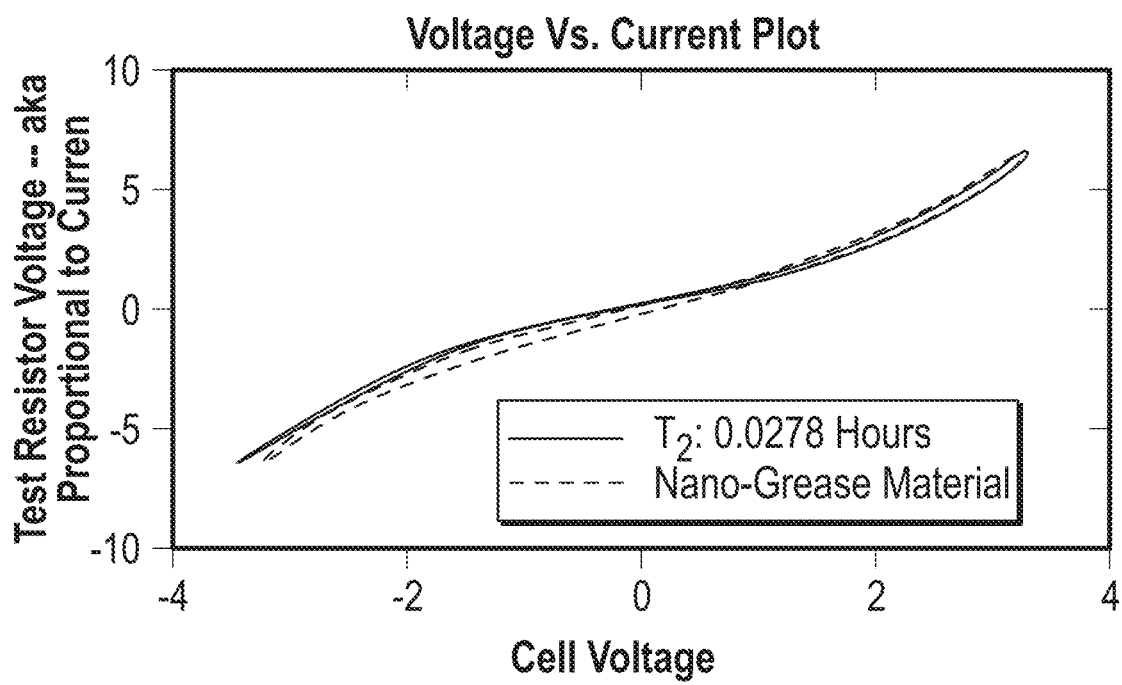
Figure 18C:
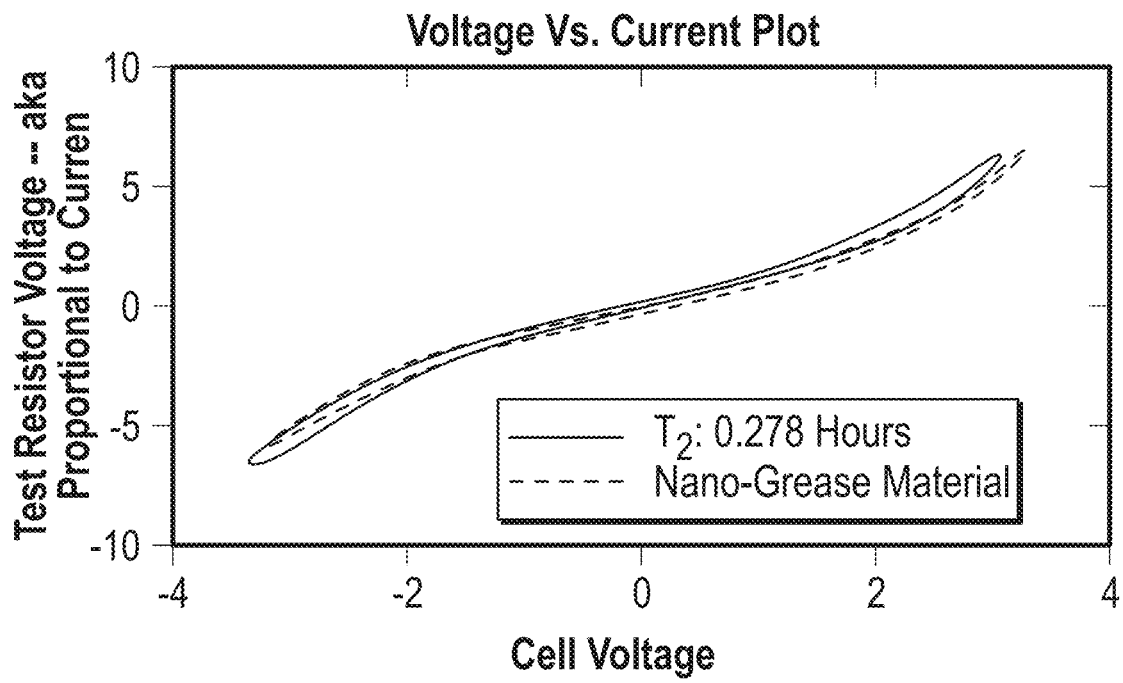
Figure 18D:
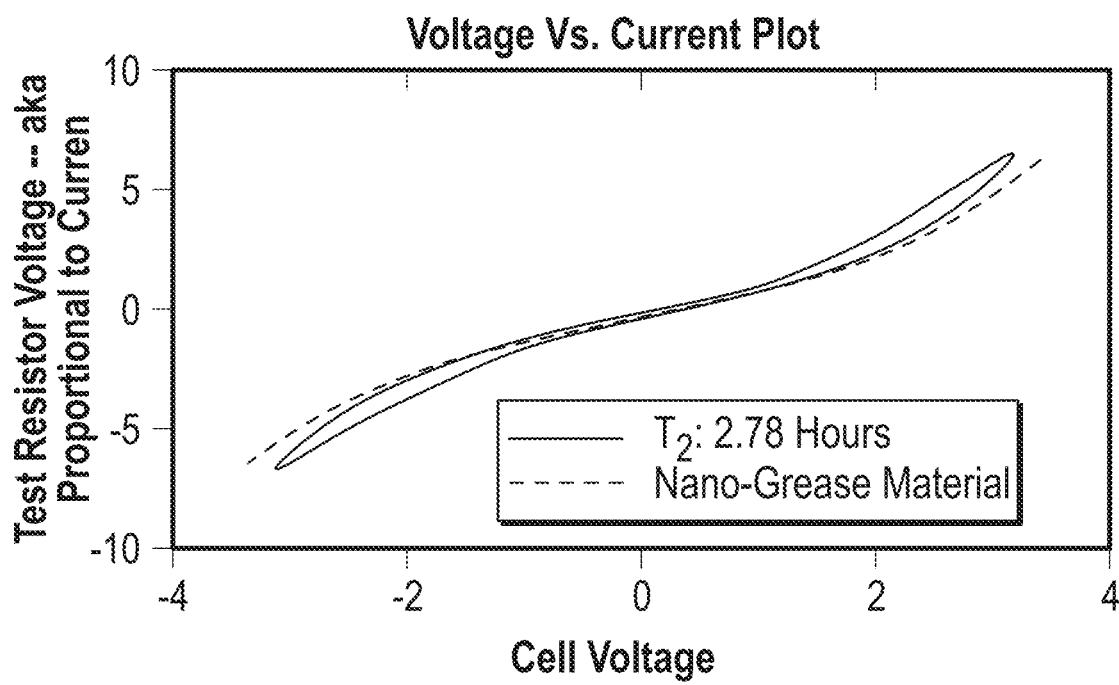

With reference to FIGS. 15A-C & 16 Simulink Model plots of a Simulink Model representation of a memristor circuit in accordance with an embodiment of the present invention is shown. FIGS. 15 and 16 show examples of nano-grease 300 consistence over variations in applied amplitudes.

Figure 19:
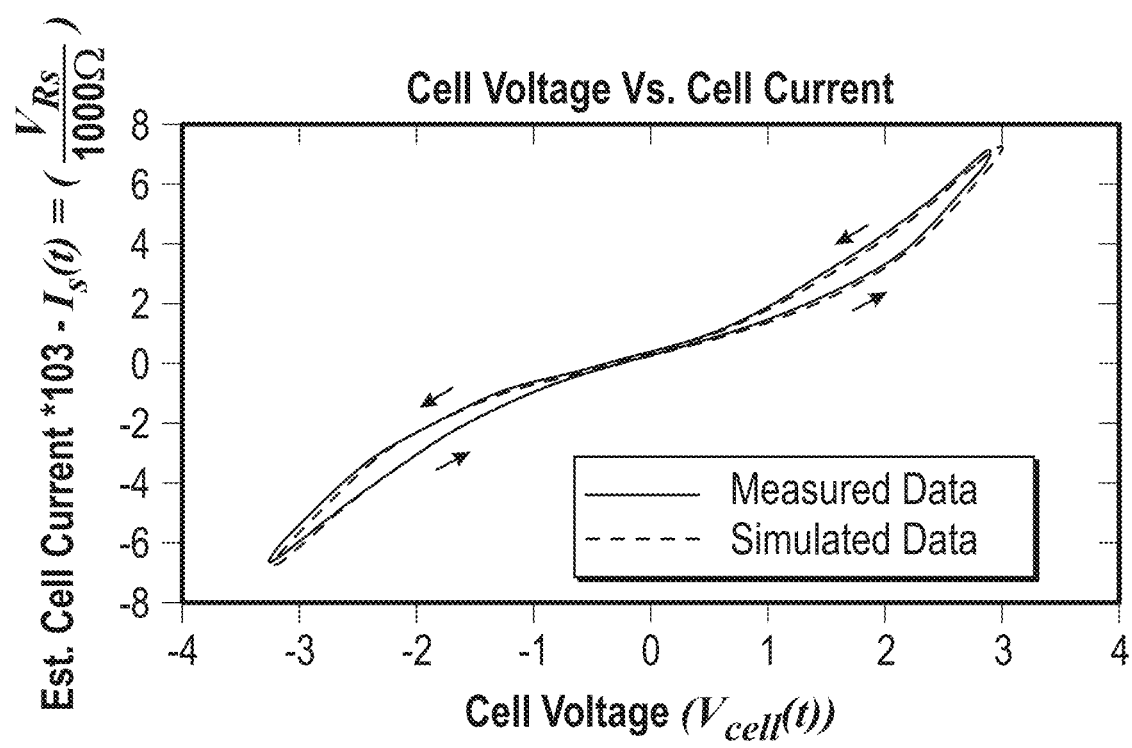
FIG. 19 are Simulink Model plots of a Simulink Model representation of a memdevice circuit in accordance with an embodiment of the present invention.
Figure 20A:
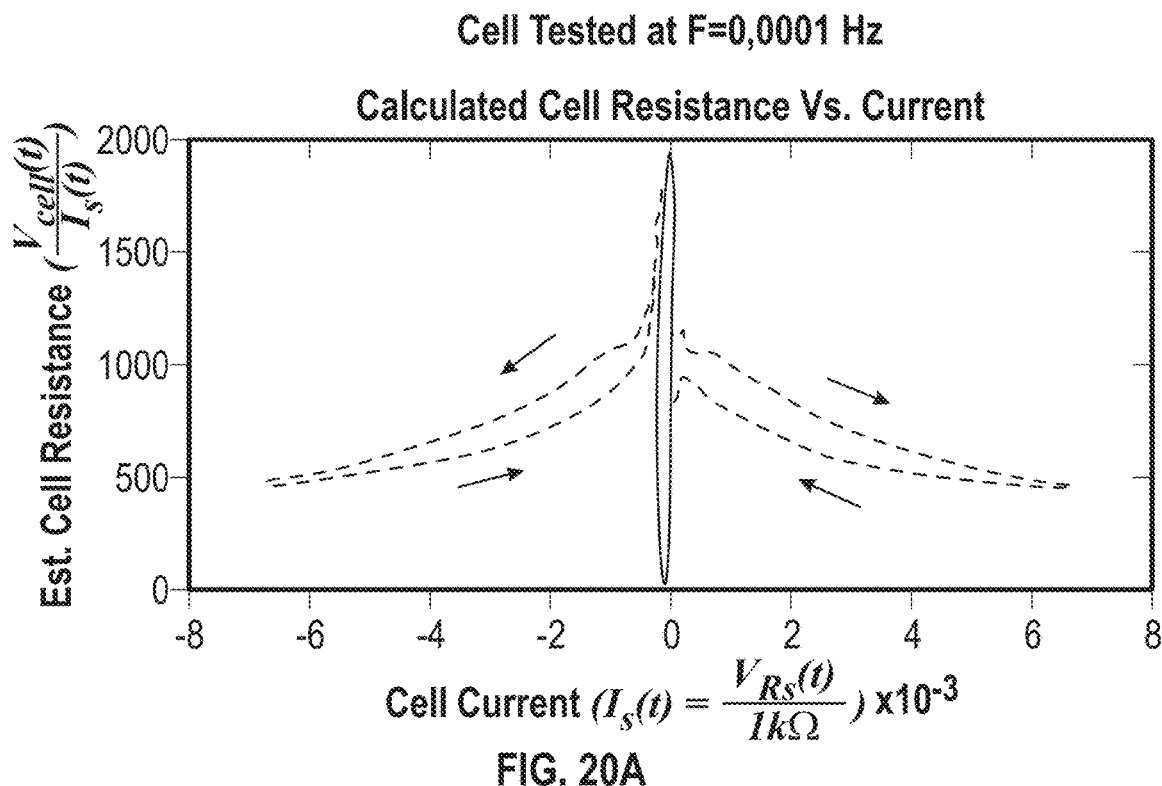
FIGS. 20A-D are Simulink Model plots of a Simulink Model representation of a memdevice circuit in accordance with an embodiment of the present invention.
Figure 20B:
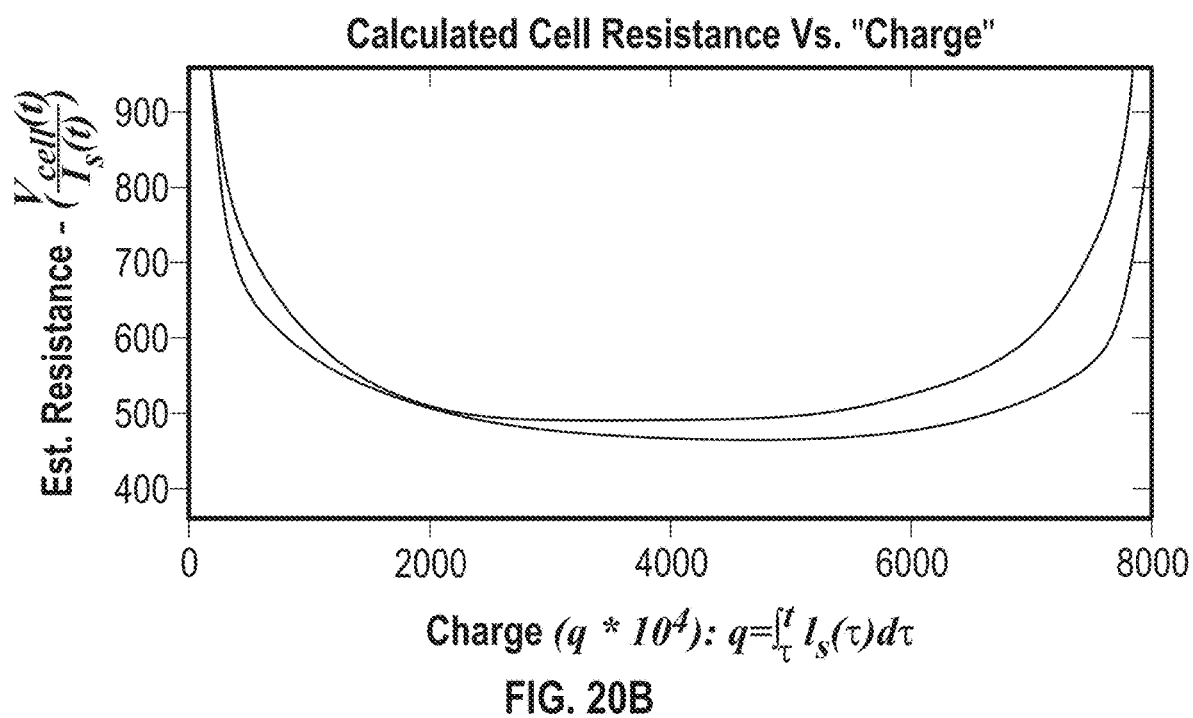
Figure 20C:
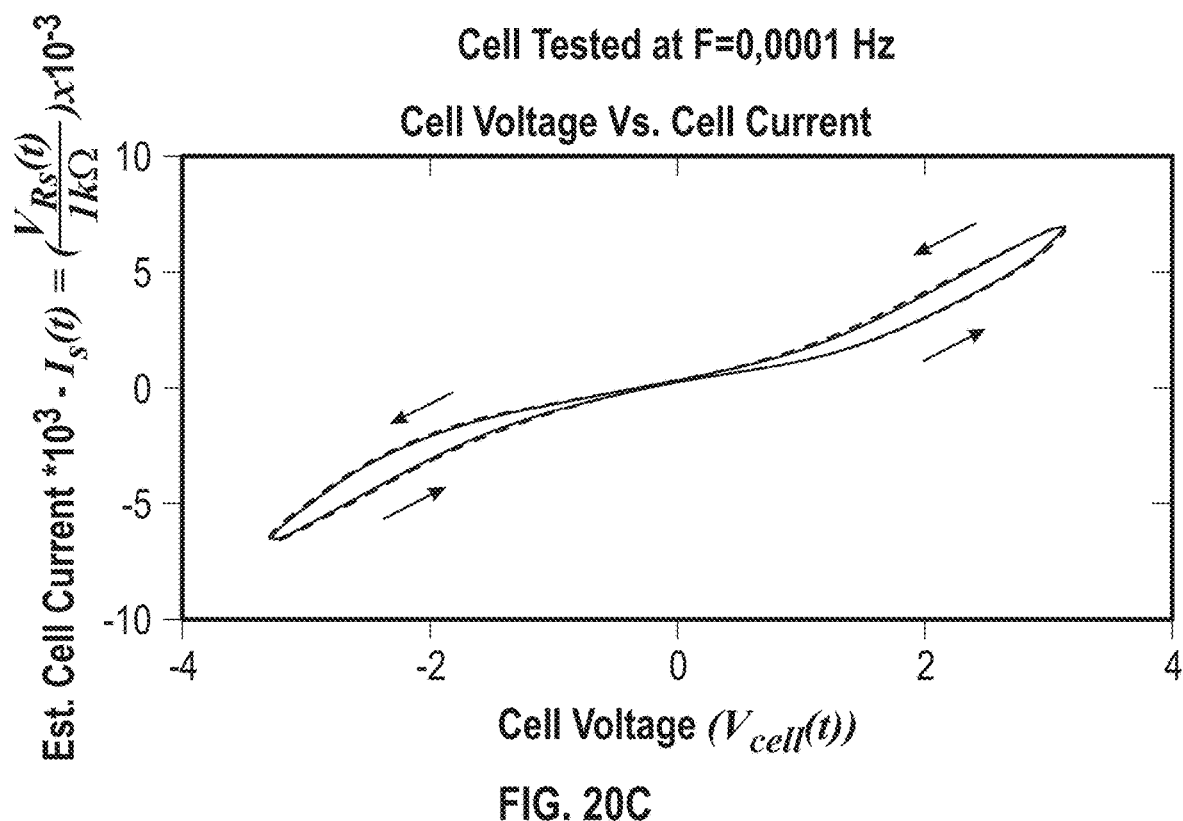
Figure 20D:
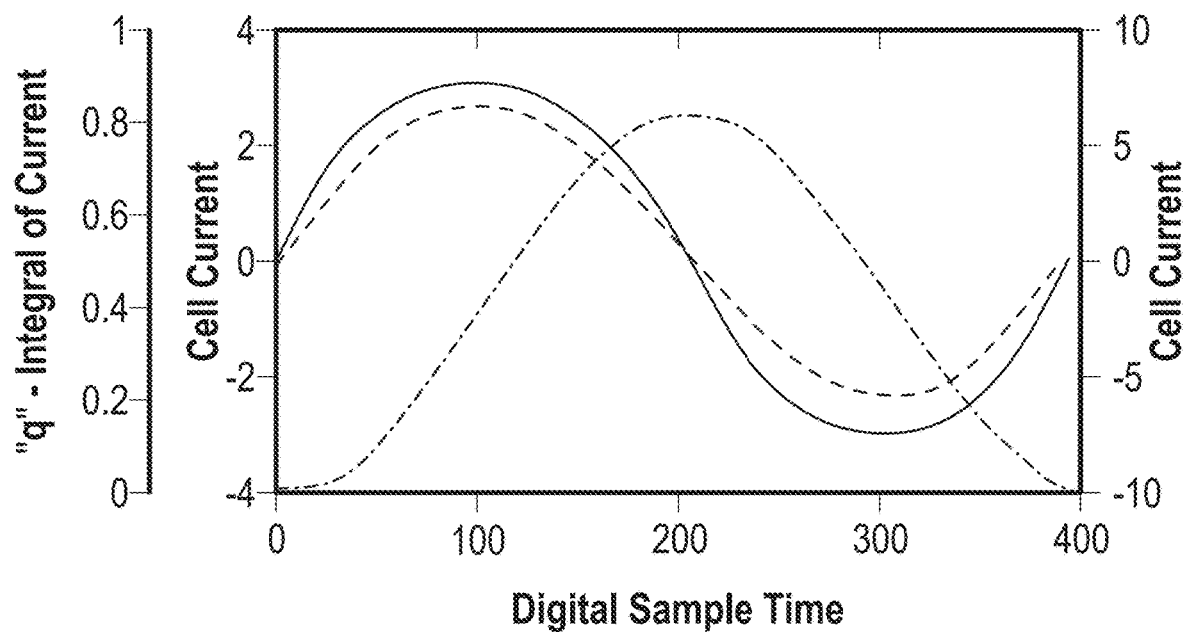
Figure 21A:
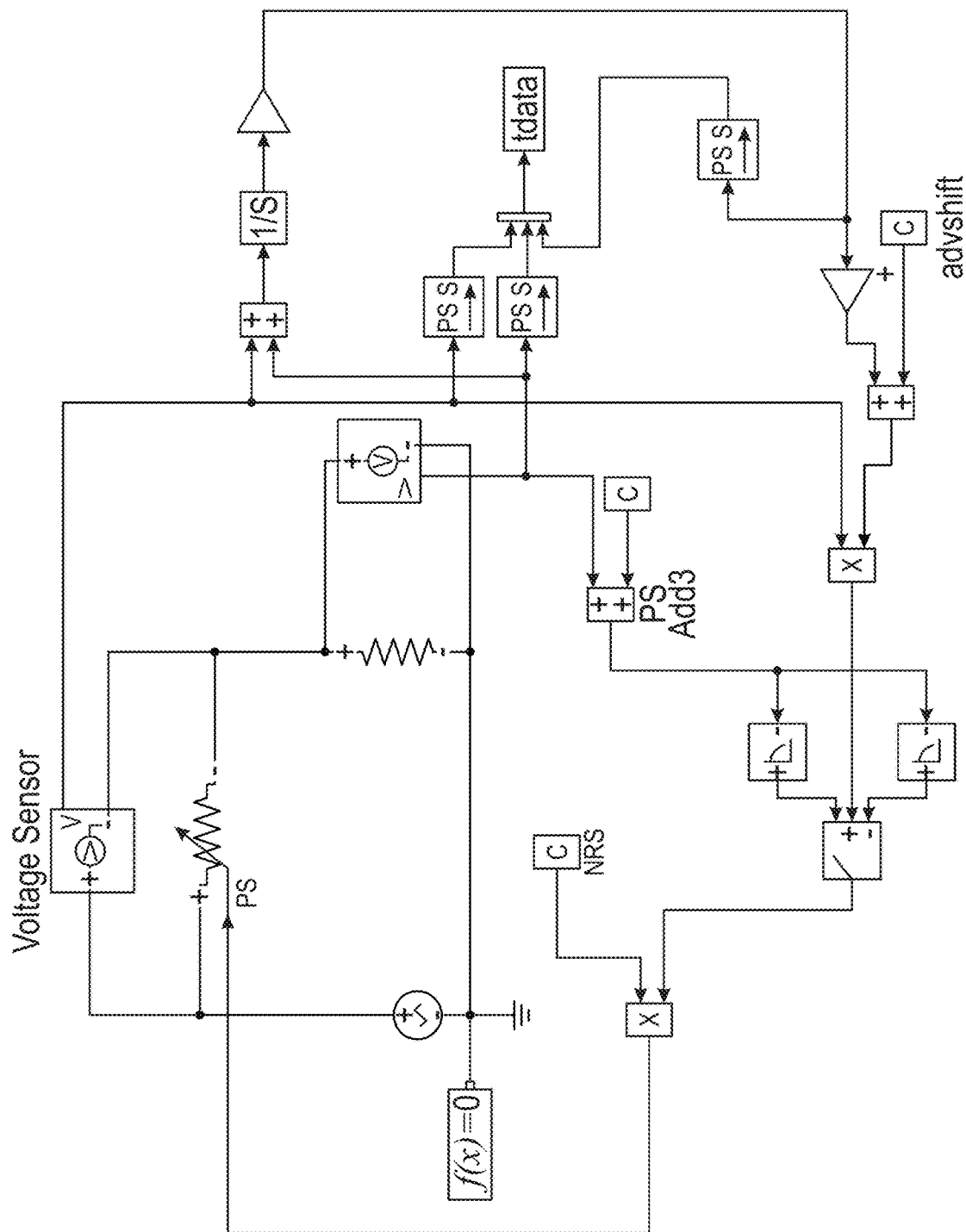
FIGS. 21A and B are a Simulink Model and plot of a Simulink Model representation of a memdevice circuit in accordance with an embodiment of the present invention.
Figure 21B:
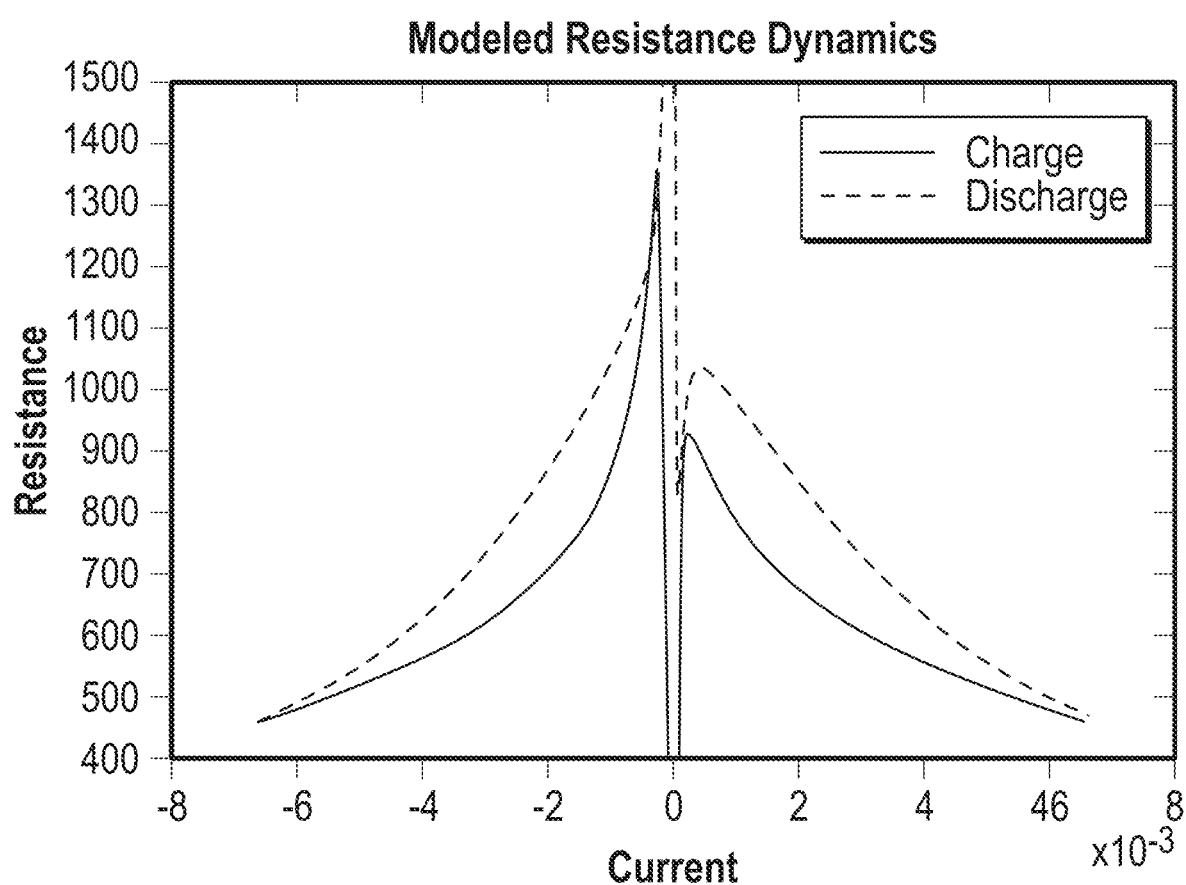
Figure 22:
FIG. 22 shows the grease based on 7.5 wt % MWNT-OH/92.5 wt % Ester oil.
Figure 23:
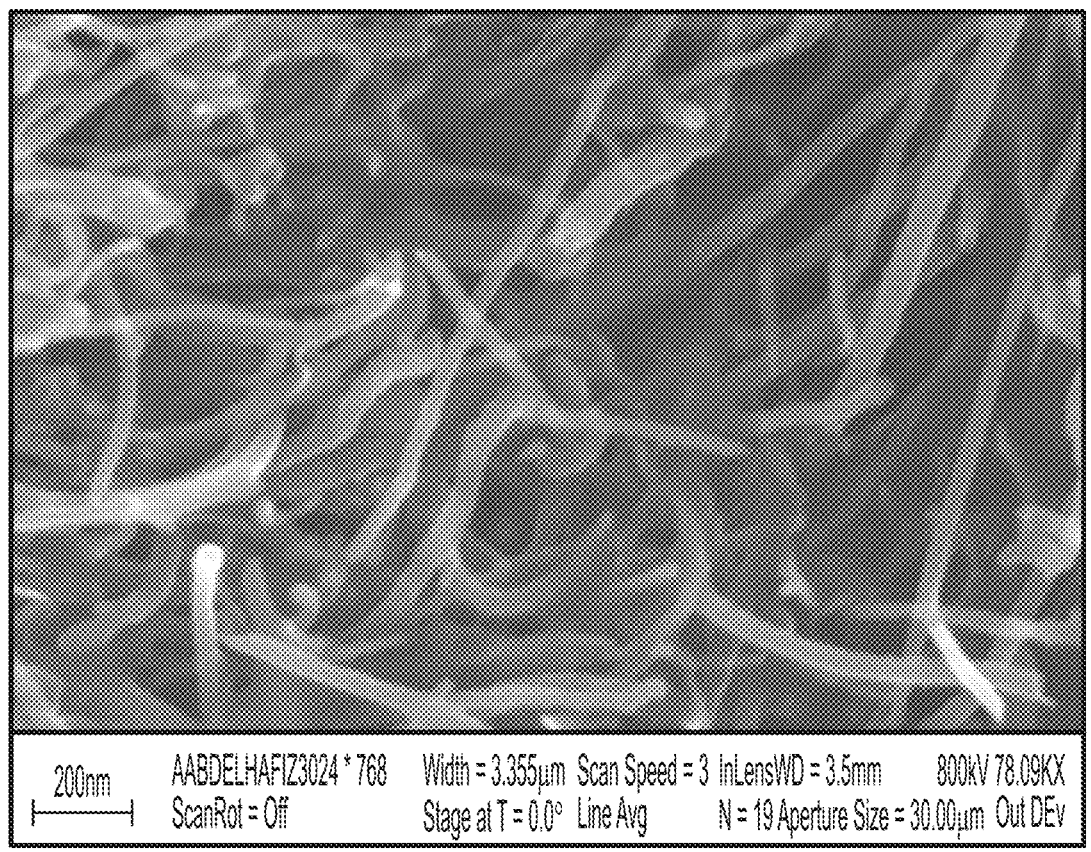
FIG. 23 shows a scanning electron microscope (SEM) image of the grease based on 7.5 wt % MWNT-OH/92.5 wt % Ester oil.
Figure 24A:
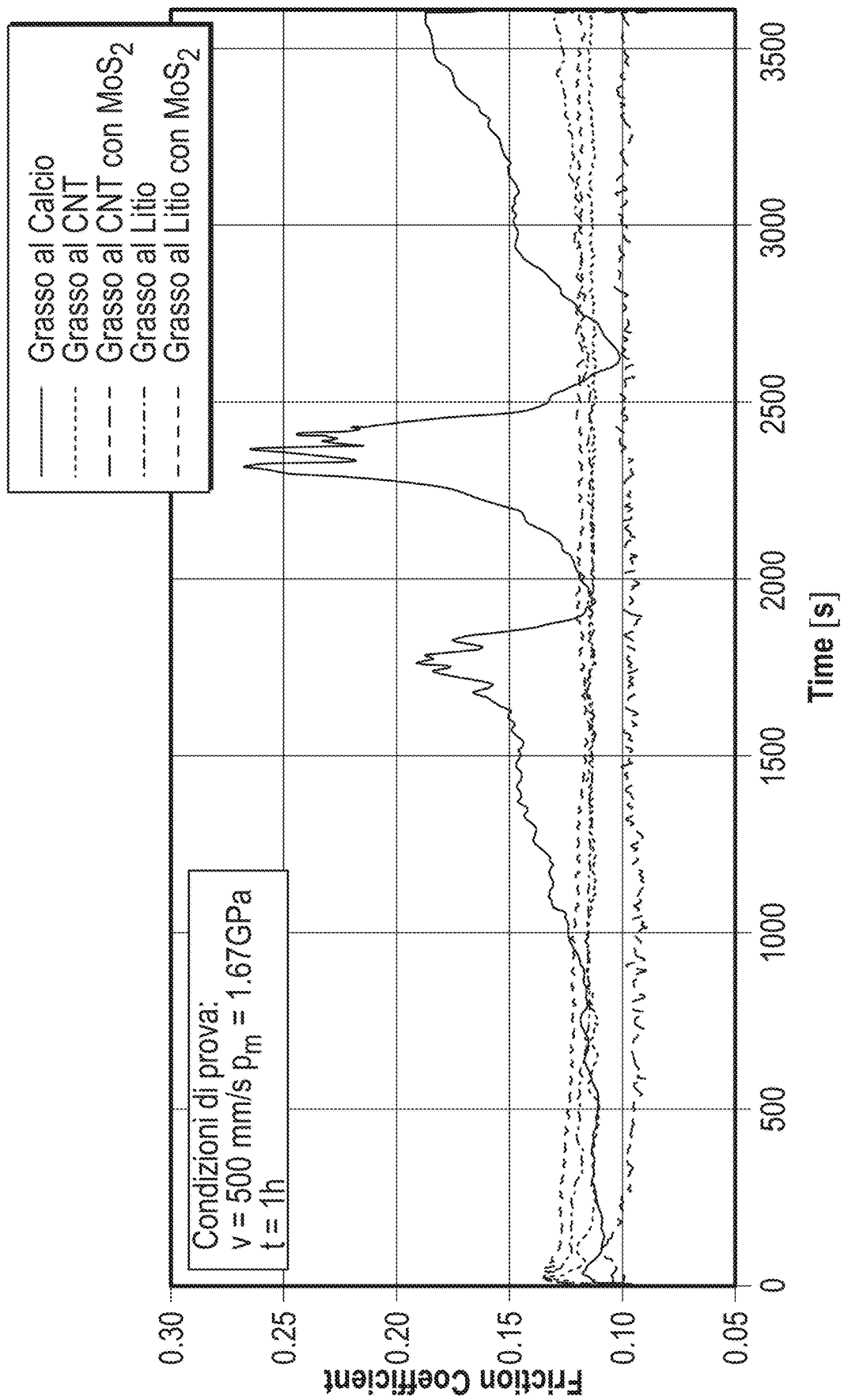
FIGS. 24A-24D shows the friction coefficients exhibited by CNT-based greases and three other conventional lubricant greases.
Figure 24B:
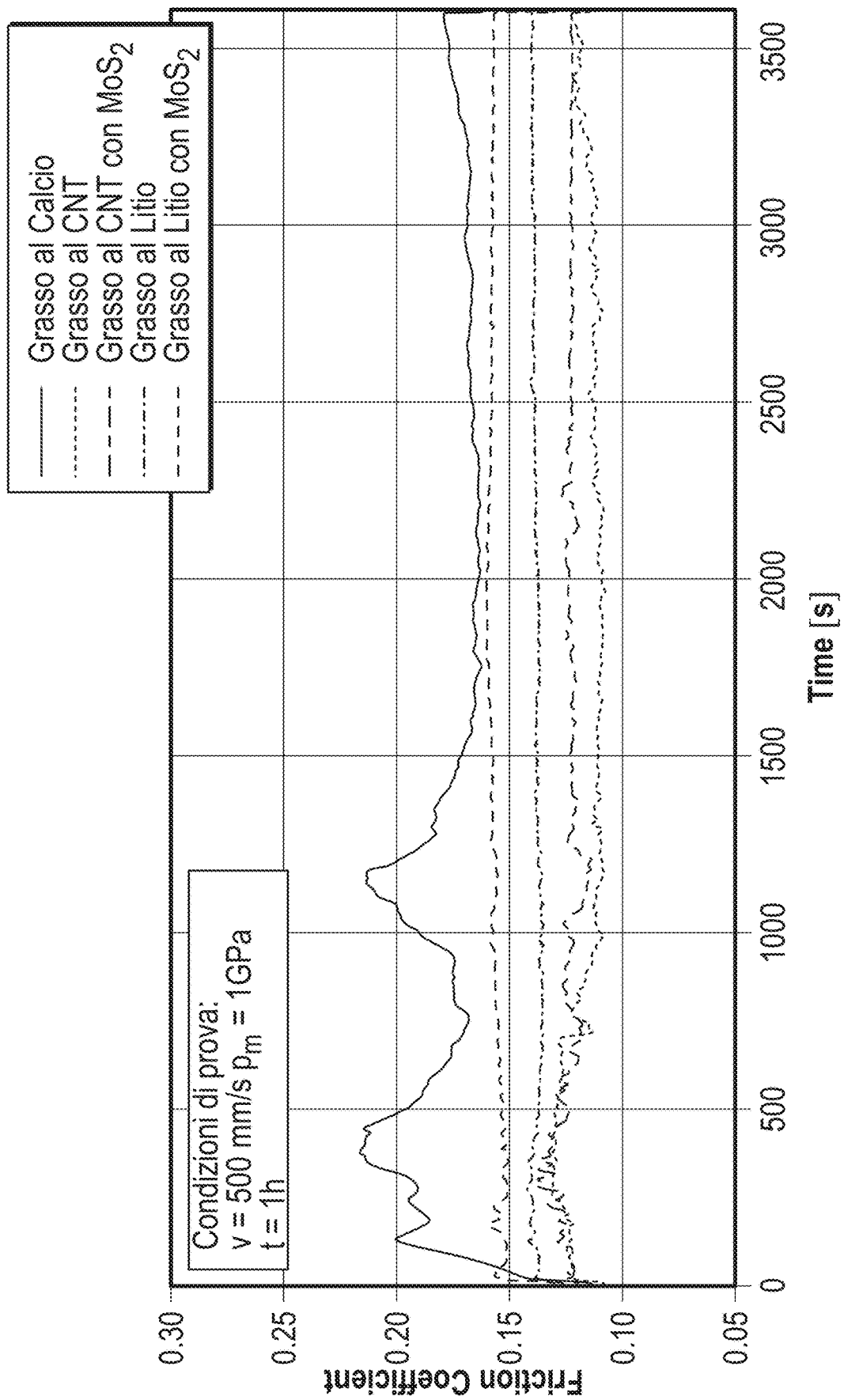
Figure 24C:
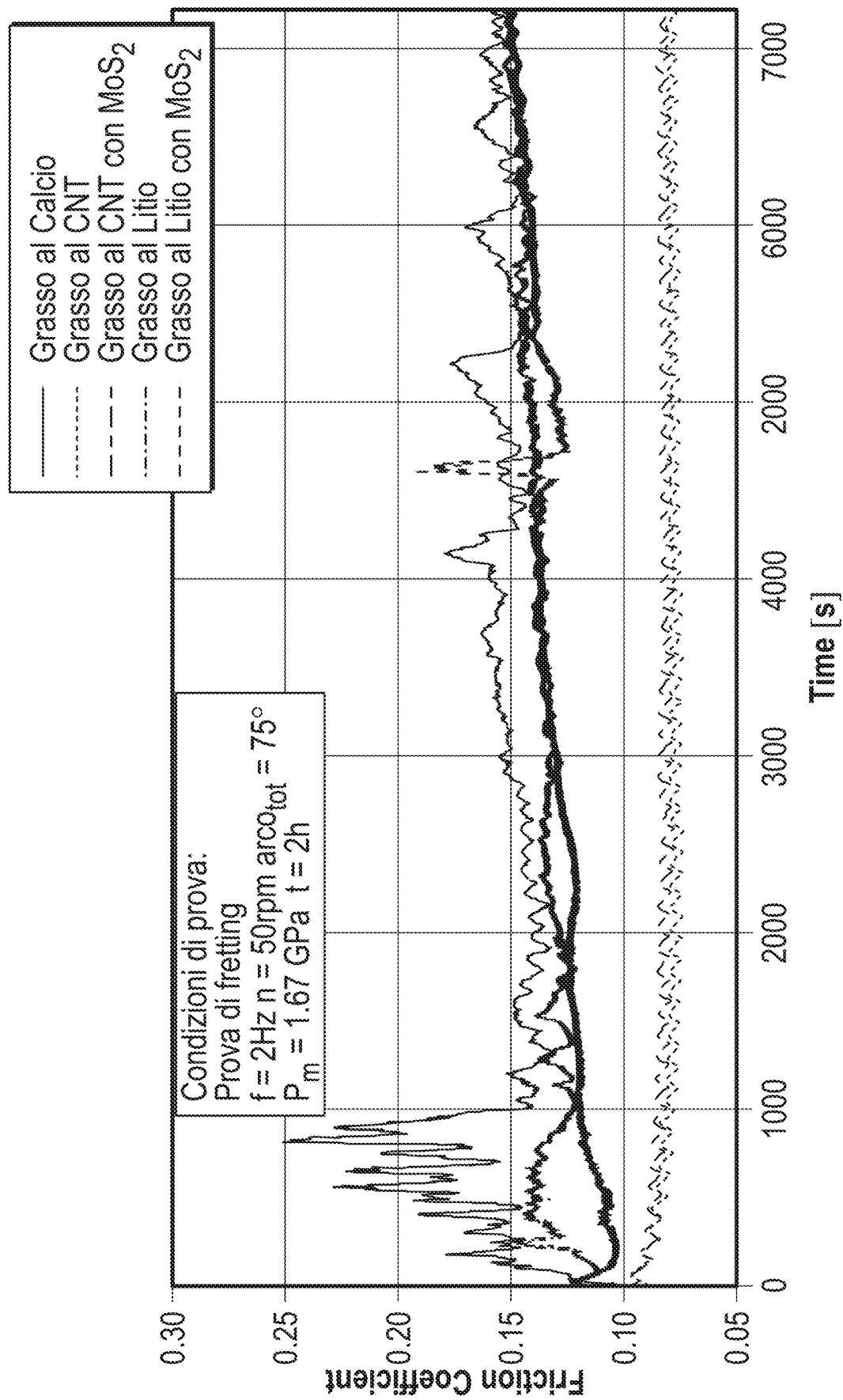
Figure 24D:
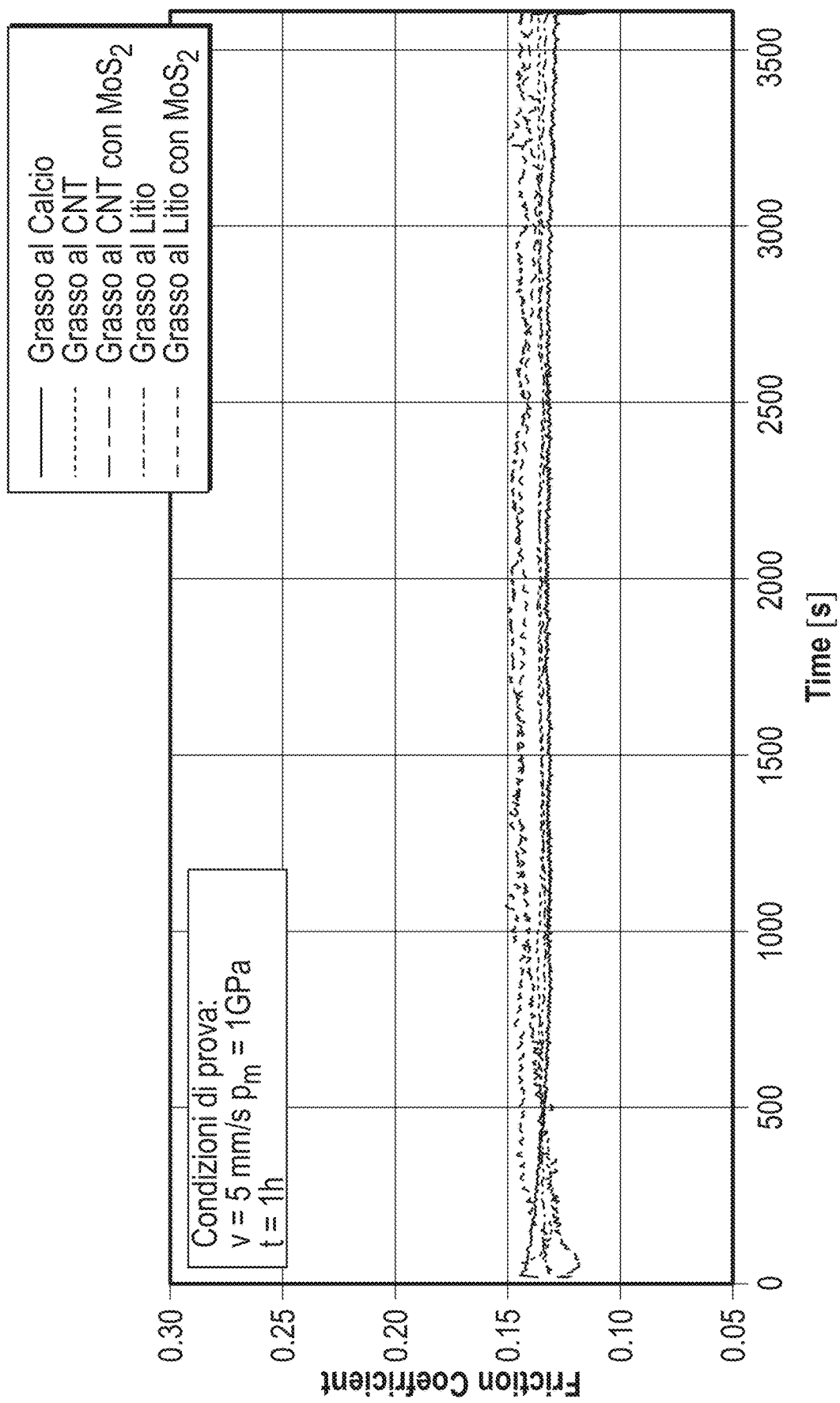

With reference to FIGS. 19, 20A-D & 21A & B, Simulink Model plots of a Simulink Model representation of a memdevice circuit in accordance with an embodiment of the present invention are shown. The memresistor, memcapacitor and meminductor of the present invention exhibit what is called a type two pinched hysteresis curve which is unique for memdevices. Standard memdevices are type one meaning they follow a figure eight crossing pattern through the origin, while the memdevices of embodiments of the current invention would be classified as a type two. Further, the memdevice of the embodiments of the current invention exhibit a charging style and dis-charging style curve as shown in FIG. 19. Further, FIG. 21B shows a modeled charging curve reproducing the memdevice's voltage-current curves shown in FIG. 20.

Conductive greases have been prepared using carbon nanotubes for a variety of applications. They have been found to be particularly good thermal transfer fluids. Such compositions have required relatively high concentrations of carbon nanotubes, e.g., greater than 15 wt. % or even greater than 20 wt. %. As disclosed in U.S. Pat. No. 7,871,533, a stable and homogeneous grease based on carbon nanotubes (CNTs, single-wall and multi-wall) in polyalphaolefin oil has been produced without using a chemical surfactant. For example, with a 22-24 wt % (14-15 vol %) multi-wall CNT loading, a grease has a thermal conductivity (TC) 70-80% increase compared to one with no nanotube loading. In addition, such a grease has a high dropping point, good temperature resistance, and does not react with copper at temperatures up to 177° C.

However, such a grease with a high carbon nanotube loading has a low electrical conductivity and has proven to be difficult for use in electrical applications. Thus, there is a need to prepare grease compositions have both stability and improved electrical conductivity.

Accordingly, it is an objective of the present disclosure to develop a stable nanogrease composition with an improved thermal and/or electrical conductivity.

A further object of the invention is to provide a grease composition with low carbon nanotube loading (<2 wt %) and improved thermal and/or electrical properties.

Other objects, advantages and features of the present invention will become apparent from the following specification taken in conjunction with the accompanying figures.

An advantage of the invention is enhanced thermal and/or electrical conductivity of the disclosed grease compositions. It is an advantage of the present invention the conductive greases have unexpectedly improved electrical conductivity. This is particularly surprising given the low weight percentage loading of carbon particles.

In one aspect, disclosed herein is a stable conductive grease composition comprising a base oil and nanomaterial, wherein the nanomaterial is a functionalized nanomaterial having one or more of a first functional group capable of forming a hydrogen bond or boron nanomaterial; and wherein the base oil comprises one or more of a second functional group capable of forming a hydrogen bond with the first function group of the nanomaterial.

In another aspect, the present disclosure is a method of enhancing thermal or electric conductivity of a grease composition, the method comprises adding into a grease composition a nanomaterial to form an improved grease composition, wherein the nanomaterial is a functionalized carbon nanomaterial having one or more of a first functional group capable of forming a hydrogen bond with a second functional group in the grease composition or boron nanomaterial.

While multiple embodiments are disclosed, still other embodiments of the present invention will become apparent to those skilled in the art from the following detailed description, which shows and describes illustrative embodiments of the invention. Accordingly, the figures and detailed description are to be regarded as illustrative in nature and not restrictive.

Various embodiments of the present invention will be described in detail with reference to the figures. Reference to various embodiments does not limit the scope of the invention. Figures represented herein are not limitations to the various embodiments according to the invention and are presented for exemplary illustration of the invention.

The present invention relates to conductive greases comprising carbon particles. The conductive greases have many advantages over existing nanogreases. For example, the conductive greases have significantly improved electrical conductivity over nanogreases used in many electrical transfer fluid applications. Furthermore, these improvements occur with a reduction in the amount of carbon added to the conductive grease when compared to existing conductive greases comprising carbon nanotubes. This improvement is unexpected given the reduction in carbon loading as carbon nanotubes are conductive. Additionally, it was previously seen thermal conduction properties for thermal nanofluids comprising carbon nanotubes were increased with increasing concentrations of carbon nanotubes.

Definitions

So, the present invention may be more readily understood, certain terms are first defined. Unless defined otherwise, all technical and scientific terms used herein have the same meaning as commonly understood by one of ordinary skill in the art to which embodiments of the invention pertain. Many methods and materials similar, modified, or equivalent to those described herein can be used in the practice of the embodiments of the present invention without undue experimentation, the preferred materials and methods are described herein. In describing and claiming the embodiments of the present invention, the following terminology will be used in accordance with the definitions set out below. Moreover, the embodiments of this invention are not limited to particular electrical conductive grease applications, which can vary and are understood by skilled artisans. It is further to be understood all terminology used herein is for the purpose of describing embodiments only and is not intended to be limiting in any manner or scope.

As used in this specification and the appended claims, the singular forms "a," "an" and "the" can include plural references unless the content clearly indicates otherwise. Further, all units, prefixes, and symbols may be denoted in its SI accepted form.

Numeric ranges recited within the specification are inclusive of the numbers defining the range and include each integer within the defined range. Throughout this disclosure, various aspects of this invention are presented in a range format. The description in range format is merely for convenience and brevity and should not be construed as an inflexible limitation on the scope of the invention. Accordingly, the description of a range should be considered to have specifically disclosed all the possible sub-ranges, fractions, and individual numerical values within range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within range, for example, 1, 2, 3, 4, 5, and 6, and decimals and fractions, for example, 1.2, 3.8, 1½, and 4¾% This applies regardless of the breadth of the range.

The term "about," as used herein, refers to variation in the numerical quantity can occur, for example, through typical measuring techniques and equipment, with respect to any quantifiable variable, including, but not limited to, mass, volume, time, distance, wave length, frequency, voltage, current, and electromagnetic field. Further, given solid and liquid handling procedures used in the real world, there is certain error and variation is likely through differences in the manufacture, source, or purity of the ingredients used to make the compositions or carry out the methods and the like. The term "about" also encompasses these variations. Whether or not modified by the term "about," the claims include equivalents to the quantities.

The methods and compositions of the present invention may comprise, consist essentially of, or consist of the components and ingredients of the present invention as well as other ingredients described herein. As used herein, "consisting essentially of" means the methods, systems, apparatuses and compositions may include additional steps, components or ingredients, but only if the additional steps, components or ingredients do not materially alter the basic and novel characteristics of the claimed methods, systems, apparatuses, and compositions.

As used herein, the term "alkyl" or "alkyl groups" refers to saturated hydrocarbons having one or more carbon atoms, including straight-chain alkyl groups (e.g., methyl, ethyl, propyl, butyl, pentyl, hexyl, heptyl, octyl, nonyl, decyl, etc.), cyclic alkyl groups (or "cycloalkyl" or "alicyclic" or "carbocyclic" groups) (e.g., cyclopropyl, cyclopentyl, cyclohexyl, cycloheptyl, cyclooctyl, etc.), branched-chain alkyl groups (e.g., isopropyl, tert-butyl, sec-butyl, isobutyl, etc.), and alkyl-substituted alkyl groups (e.g., alkyl-substituted cycloalkyl groups and cycloalkyl-substituted alkyl groups).

Unless otherwise specified, the term "alkyl" includes both "unsubstituted alkyls" and "substituted alkyls." As used herein, the term "substituted alkyls" refers to alkyl groups having substituents replacing one or more hydrogens on one or more carbons of the hydrocarbon backbone. Such substituents may include, for example, alkenyl, alkynyl, halogeno, hydroxyl, alkylcarbonyloxy, arylcarbonyloxy, alkoxycarbonyloxy, aryloxy, aryloxy carbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), imino, sulfhydryl, alkylthio, arylthio, thiocarboxylate, sulfates, alkylsulfinyl, sulfonates, sulfamoyl, sulfonamido, nitro, trifluoromethyl, cyano, azido, heterocyclic, alkylaryl, or aromatic (including heteroaromatic) groups.

In some embodiments, substituted alkyls can include a heterocyclic group. As used herein, the term "heterocyclic group" includes closed ring structures analogous to carbocyclic groups in which one or more of the carbon atoms in the ring is an element other than carbon, for example, nitrogen, sulfur or oxygen. Heterocyclic groups may be saturated or unsaturated. Exemplary heterocyclic groups include, but are not limited to, aziridine, ethylene oxide (epoxides, oxiranes), thiirane (episulfides), dioxirane, azetidine, oxetane, thietane, dioxetane, dithietane, dithiete, azolidine, pyrrolidine, pyrroline, oxolane, dihydrofuran, and furan.

The term "polyol ester" refers to an ester of an organic compound containing at least two hydroxyls with at least one carboxylic acid.

The term "surfactant" refers to a molecule having surface activity, including wetting agents, dispersants, emulsifiers, detergents, and foaming agents, and the like. It is understood to be inclusive of the use of a single surfactant or multiple surfactants.

The term "weight percent," "wt. %," "wt-%," "percent by weight," "% by weight," and variations thereof, as used herein, refer to the concentration of a substance as the weight of substance divided by the total weight of the composition and multiplied by 100.

As used herein, the term "free of a compound" refers to a composition, mixture, or ingredient does not contain the compound or to which the compound has not been added. Should the compound be present through contamination of a composition, mixture, or ingredients free of the compound, the amount of the compound shall be less than 0.5 wt %. More preferably, the amount of the compound is less than 0.1 wt-%, and most preferably, the amount of phosphate is less than 0.01 wt %. In this disclosure, the compound the disclosed grease composition is free of can be a surfactant, additive, or combination thereof.

As used herein, the term "an existing grease composition" refers to a grease composition does not contain any functionalized carbon nanomaterial or boron nanomaterial. Such an existing grease composition can contain non-functionalized carbon nanomaterial.

The methods, systems, apparatuses, and compositions of the present invention may comprise, consist essentially of, or consist of the components and ingredients of the present invention as well as other ingredients described herein. As used herein, "consisting essentially of" means the methods, systems, apparatuses and compositions may include additional steps, components or ingredients, but only if the additional steps, components or ingredients do not materially alter the basic and novel characteristics of the claimed methods, systems, apparatuses, and compositions.

Further terms are defined in the detailed description.

Conductive Grease Compositions

The conductive grease compositions comprise a fluid capable of hydrogen bonding and a nanomaterial. Preferred fluids capable of hydrogen bonding, include, a base oil capable of hydrogen bonding. Preferred nanomaterials are those functionalized having one or more of a first functional group capable of forming an electrostatic attraction, including, but not limited to, a hydrogen bond or boron nanomaterial; and wherein the fluid comprises one or more of a second functional group capable of forming an electrostatic attraction, including, but not limited to, a hydrogen bond with the first function group of the nanomaterial. Preferably, the conductive grease composition is stable. Preferably, the conductive grease is a nanogrease. Non-limiting, exemplary conductive grease compositions are shown the following table.

| | First Exemplary Composition (wt. %) | Second Exemplary Composition (wt. %) | Third Exemplary Composition (wt. %) |
|---|---|---|---|
| Fluid Component | 25-99.9 | 50-99.5 | 75-95 |
| Nanomaterial | 0.1-20 | 0.5-10 | 0.5-5 |
| Optional Additional Components | 0-70 | 0-47 | 0-23 |

The conductive grease compositions preferably have improved electrical conductivity and improved resistance. Preferably, the resistance is improved (lowered) over the base oil alone by at least about 10%, 20%, 30%, 40%, 50%, 60%, 70%, 80% when measured by the same test under the same conditions. Preferably, the electrical conductivity is improved (increased) over the base oil alone by at least about 10%, 20%, 50%, 100%, 200%, 250%, 300%, 400%, 500%, when measured by the same test under the same conditions.

The conductive grease compositions preferably have improved thermal conductivity. Preferably, the thermal conductivity is improved (increased) over the base oil alone by at least about 10%, 20%, 30%, 40%, 50%, 60%, 70% 80%, 90% 100%, 150%, 200%, 250%, 300%, 350%, when measured by the same test under the same conditions.

The conductive grease compositions can optionally comprise one or more additional components added to provide properties to the grease. For example, such components can include grease additives, surfactants, viscosity modifiers, conductive particles, or combinations or mixtures thereof. Other additional components can also be added.

Fluid Component

In some embodiments, the base oil comprises an alkyl alcohol, alkylene glycols, polyol ester, or a combination thereof. In some other embodiments, the base oil comprises ethylene glycol or diethylene glycol, a combination thereof. In yet some other embodiments, wherein the base oil comprises a silicone transfer compound. In some other embodiments, the base oil comprises glycerol.

In some embodiments, the grease composition further comprises water. In some embodiments, the base oil is an existing grease composition. In some other embodiments, the base oil is an existing commercially available common grease composition. In some embodiments, the base oil comprises Valvoline Cerulean Grease, NYE grease, Krytox XHT 750, PAO Durasyn 166, Petro-Canada NH650HT, or Royco 500.

In some embodiments, the composition comprises from about 25 wt-% to about 99 wt-% of the base oil. In some other embodiments, the composition comprises from about 25 wt-% to about 90 wt-%, from about 25 wt-% to about 85 wt-%, from about 25 wt-% to about 80 wt-%, from about 25 wt-% to about 75 wt-%, from about 25 wt-% to about 70 wt-%, from about 25 wt-% to about 65 wt-%, from about 25 wt-% to about 60 wt-%, from about 25 wt-% to about 55 wt-%, from about 25 wt-% to about 50 wt-%, from about 25 wt-% to about 45 wt-%, from about 25 wt-% to about 40 wt-%, from about 25 wt-% to about 35 wt-%, from about 25 wt-% to about 30 wt-%, from about 30 wt-% to about 99 wt-%, from about 35 wt-% to about 99 wt-%, from about 45 wt-% to about 99 wt-%, from about 55 wt-% to about 99 wt-%, from about 65 wt-% to about 99 wt-%, from about 75 wt-% to about 99 wt-%, from about 80 wt-% to about 99 wt-%, from about 85 wt-% to about 99 wt-%, from about 99 wt-% to about 25 wt-% to about 95 wt-%, from about 35 wt-% to about 95 wt-%, from about 45 wt-% to about 95 wt-%, from about 55 wt-% to about 95 wt-%, from about 65 wt-% to about 95 wt-%, from about 75 wt-% to about 95 wt-%, from about 85 wt-% to about 95 wt-%, from about 25 wt-% to about 85 wt-%, from about 35 wt-% to about 75 wt-%, from about 45 wt-% to about 65 wt-%, from about 55 wt-% to about 60 wt-%, about 25 wt-%, about 35 wt-%, about 40 wt-%, about 45 wt-%, about 55 wt-%, about 60 wt-%, about 65 wt-%, about 70 wt-%, about 75 wt-%, about 80 wt-%, about 85 wt-%, about 90 wt-%, about 95 wt-%, about 99 wt-%, or any value therebetween of the base oil.

In another aspect, the present disclosure is a method of enhancing thermal or electric conductivity and/or resistance of a grease composition, the method comprises adding into a grease composition a nanomaterial to form an improved grease composition, wherein the nanomaterial is a functionalized carbon nanomaterial having one or more of a first functional group capable of forming a an electrostatic attraction, including, but not limited to, a hydrogen bond with a second functional group in the grease composition or boron nanomaterial.

In some other embodiments the method further comprising adding water or a base oil, wherein the base oil comprises a functional group capable of forming an electrostatic attraction, including, but not limited to, a hydrogen bond with the first functional group of the nanomaterial.

In some embodiments, the nanomaterial comprises a carbon nanomaterial, boron nanomaterial, or combination thereof. In some embodiments, the nanomaterial comprises a single-walled carbon, multiple-walled carbon, single-walled boron, multiple-walled boron nanomaterial, or combination thereof. In some embodiments, the improved grease composition is one of the grease compositions disclosed herein.

Base Oil

A preferred fluid for use in the conductive grease compositions is a base oil. Suitable base oils are preferably capable of hydrogen bonding. A base oil may be selected from a wide variety of well-known organic oils, including petroleum distillates, synthetic petroleum oils, greases, gels, oil-soluble polymer composition, vegetable oils, and combinations thereof. Petroleum distillates, also known as mineral oils, generally include paraffins, naphthenes and aromatics. Preferably, the base oil can form hydrogen bonds or similar electrostatic attractions. The American Petroleum Institute (API) generally sorts base oils into five groups, three of which are mineral oils and two of which are synthetic: (1) solvent refined paraffinic mineral oils, (2) saturated paraffinic mineral oils, (3) synthesized hydrocarbon paraffinic mineral oils, (4) polyalphaolefin (PAO) synthetic oils, and (5) non-PAO synthetic oils.

Mineral Oils

Solvent refined paraffinic mineral oils (API Group I Oils), typically have less than 90% saturates, greater than 0.03% sulfur, and a viscosity-index range of about 80 to about 120. The temperature range for these oils is from about 32 to about 150° F.

Saturated paraffinic mineral oils (API Group II Oils), sometimes referred to as hydrotreated oils, also typically have greater than 90% saturates, less than 0.03% sulfur, and a viscosity-index range of about 80 to about 120. These oils are often clearer than the solvent refined paraffinic mineral oils.

Synthesized hydrocarbon paraffinic mineral oils (API Group III Oils), sometimes referred to as hydrocracked oils, typically have greater than 90% saturates, less than 0.03% sulfur, and a viscosity-index greater than about 120.

Synthetic Oils

PAO synthetic oils (API Group IV Oils) are synthetic oils based on polymers of an alpha olefin structure. They are suitable for use in a broad temperature range. PAO synthetic oils can be preferred for use in very cold conditions or in high-heat conditions.

Non-PAO oils (API Group V Oils) are synthetic oils not based on the alpha olefin structure. The most common non-PAO synthetic oils are ester-based oils, however, other types are common too. For example, non-PAO synthetic oils include, but are not limited to, silicone oils, phosphate ester oils, hindered ester oils, polyalkylene glycol (PAG) oils, polyglycol oils, polyolester oils, water-glycol fluids, diesters (dibasic acid ester), biolubes, naphthenic oil, alkylated naphthalene (AN), polyether, phenyl ether polymer or polyphenyl ethers (PPEs), Polyvinyl ether (PVE), halogenated hydrocarbons, Fluids based on halogenated (fluorinated and/or chlorinated) hydrocarbons include chlorofluorcarbons (CFC), halogenated fluorocarbons (HFC), halogenated chlorofluorocarbon (HCFC), and perfluorocarbon (PFC) fluids, and other synthetic fluids. Silicone base oils can include, but are not limited to, fluorosilicones, alkylmethylsilicones, and other silicone-based oils.

While the compositions of the invention can use a wide variety of oils, preferred base oils include synthetic oils. Preferred base oils for use in the compositions and methods include, but are not limited to, alkylaryls such as dodecylbenzenes, tetradecylbenzenes, dinonylbenzenes, and di-(2-ethylhexyl)benzenes; polyphenyls such as biphenyls, terphenyls, and alkylated polyphenyls; fluorocarbons such as polychlorotritluoroethylenes and copolymers of perfluoroethylene and perfluoropropylene; polymerized olefins such as polybutylenes, polypropylenes, propylene-isobutylene copolymers, chlorinated polybutylenes, poly(1-octenes), and poly(1-decenes); organic phosphates such as triaryl or trialkyl phosphates, tricresyl phosphate, trioctyl phosphate, and diethyl ester of decylphosphonic acid; and silicates such as tetra(2-ethylhexyl) silicate, tetra(2-ethylbutyl) silicate, and hexa(2-ethylbutoxy) disiloxane. Other examples include polyol esters, polyglycols, polyphenyl ethers, polymeric tetrahydrofurans, and silicones.

In one embodiment of the present disclosure, the base oil is a diester which is formed through the condensation of a dicarboxylic acid, such as adipic acid, azelaic acid, fumaric acid, maleic acid, phthalic acid, sebacic acid, suberic acid, and succinic acid, with a variety of alcohols with both straight, cyclic, and branched chains, such as butyl alcohol, dodecyl alcohol, ethylene glycol diethylene glycol monoether, 2-ethylhexyl alcohol, isodecyl alcohol, hexyl alcohol, pentaerythritol, propylene glycol, tridecyl alcohol, and trimethylolpropane. Modified dicarboxylic acids, such as alkenyl malonic acids, alkyl succinic acids, and alkenyl succinic acids, can also be used. Specific examples of these esters include dibutyl adipate, diisodecyl azelate, diisooctyl azelate, di-hexyl fumarate, dioctyl phthalate, didecyl phthalate, di(2-ethylhexyl) sebacate, dioctyl sebacate, dieicosyl sebacate, and the 2-ethylhexyl diester of linoleic acid dimer, the complex ester formed by reacting one mole of sebacic acid with two moles of tetraethylene glycol and two moles of 2-ethylhexanoic acid.

In another embodiment, the base oil is a polyalphaoletin which is formed through oligomerization of 1-olefines containing 2 to 32 carbon atoms, or mixtures of such olefins. Some common alphaolefins are 1-octene, 1-decene, and 1-dodecene. Examples of polyalphaolefins include poly-1-octene, poly-1-decene, poly-1-dodecene, mixtures thereof, and mixed olefin-derived polyolefins. Polyalphaolefins are commercially available from various sources, including DURASYN® 162, 164, 166, 168, and 174 (BP-Amoco Chemicals, Naperville, IL.), which have viscosities of 6, 18, 32, 45, and 460 centistokes, respectively.

In yet another embodiment, the base oil is a polyol ester which is formed through the condensation of a monocarboxylic acid containing 5 to 12 carbons and a polyol and a polyol ether such as neopentyl glycol, trimethylolpropane, pentaerythritol, dipentaerythritol, and tripentaerythritol. Examples of commercially available polyol esters are ROYCO® 500, ROYCO® 555, and ROYCO® 808. ROYCO® 500 contains about 95% of pentaerythritol esters of saturated straight fatty acids with 5 to 10 carbons, about 2% of tricresyl phosphate, about 2% of N-phenyl-alpha-naphthylamine, and about 1% of other minor additives. ROYCO® 808 are about 30 to 40% by weight of trimethylolpropane esters of heptanoic, caprylic and capric acids, 20 to 40% by weight of trimethylolpropane esters of valerie and heptanoic acids, about 30 to 40% by weight of neopentyl glycol esters of fatty acids, and other minor additives. Generally, polyol esters have good oxidation and hydrolytic stability. The polyol ester for use herein preferably has a pour point of about −100° C. or lower to −40° C. and a viscosity of about 2 to 100 centistoke at 100° C.

In yet another embodiment, the base is a polyglycol which is an alkylene oxide polymer or copolymer. The terminal hydroxyl groups of a polyglycol can be further modified by esterification or etherification to generate another class of known synthetic oils. Interestingly, mixtures of propylene and ethylene oxides in the polymerization process will produce a water-soluble lubricant oil. Liquid or oil type polyglycols have lower viscosities and molecular weights of about 400, whereas 3,000 molecular weight polyglycols are viscous polymers at room temperature.

In yet another embodiment, the base oil is a combination of two or more selected from the group consisting of petroleum distillates, synthetic petroleum oils, greases, gels, oil-soluble polymer composition, and vegetable oils. Suitable examples include, but not limited to, a mixture of two polyalphaolefins, a mixture of two polyol esters, a mixture of one polyalphaolefine and one polyol ester, a mixture of three polyalphaolefins, a mixture of two polyalphaolefins and one polyol ester, a mixture of one polyalphaolefin and two polyol esters, and a mixture of three polyol esters. In all the embodiments, the base oil preferably has a viscosity of from about 1 to about 1,000 centistokes, more preferably from about 2 to about 800 centistokes, and most preferably from about 5 to about 500 centistokes.

In yet another embodiment, the base oil is grease which is made by combining a petroleum or synthetic lubricating fluid with a thickening agent. The thickeners are generally silica gel and fatty acid soaps of lithium, calcium, strontium, sodium, aluminum, and barium. The grease formulation may also include coated clays, such as bentonite and hectorite clays coated with quaternary ammonium compounds. Sometimes carbon black is added as a thickener to enhance high-temperature properties of petroleum and synthetic lubricant greases. The addition of organic pigments and powders which include aryl urea compounds indanthrene, ureides, and phthalocyanines provide high temperature stability. Sometimes, solid powders such as graphite, molybdenum disulfide, asbestos, talc, and zinc oxide are also added to provide boundary lubrication. Formulating the foregoing grease compositions with thickeners provides specialty greases. The synthetic lubricant oils include, without limitation, diesters, polyalphaolefins, polyol esters, polyglycols, silicone-diester, and silicone lubricants. Non-melting thickeners are especially preferred such as copper phthalocyanine, arylureas, indanthrene, and organic surfactant coated clays.

Nanomaterials

The conductive grease compositions comprise a nanomaterial. Preferred nanomaterials are those functionalized having one or more of a first functional group capable of forming an electrostatic attraction, including, but not limited to, a hydrogen bond or boron nanomaterial; and wherein the fluid comprises one or more of a second functional group capable of forming an electrostatic attraction, including, but not limited to, a hydrogen bond with the first function group of the nanomaterial. Preferred nanomaterials include, but are not limited to, carbon particles and boron nanomaterials.

In some embodiments, the first and second functional group is a hydrophilic functional group. In some other embodiments, the first and second function group are independently —OH, —NH, —COOH, —F, —BH, —O—, —N—, or combination thereof. In yet some other embodiments, the first functional group is sulfonate, carboxyl, hydroxyl, amino, amide, urea, carbamate, urethane, or phosphate and the second functional group is —OH, —NH, —COOH, —F, —BH, —O—, —N—, or combination thereof. In some embodiments, the base oil comprises at least one compound have at least one functional group can form an electrostatic attraction, including, but not limited to, a hydrogen bond with at least one functional group in a functionalized carbon nanomaterial or boron nanomaterial.

In some embodiments, the nanomaterial is carbon nanomaterial. In some other embodiments, the nanomaterial is carbon nanotube. In some embodiments, the nanomaterial is a single-walled, multiple-walled nanotube, or a mixture thereof. In some other embodiments, the nanomaterial is a OH functionalized carbon nanomaterial. In yet some other embodiments, the nanomaterial is a fluorine functionalized carbon nanomaterial.

In some embodiments, the nanomaterial is a OH functionalized carbon multi-walled nanotube. In some other embodiments, the nanomaterial is a fluorine functionalized carbon multi-walled nanotube. In yet some other embodiments, the nanomaterial is a OH functionalized carbon single-walled nanotube. In some other embodiments, the nanomaterial is a fluorine functionalized carbon single-walled nanotube.

In some embodiments, the nanomaterial is boron nanomaterial. In some other embodiments, the nanomaterial is a single-walled boron nanotube. In yet some other embodiments, the nanomaterial is a multiple-walled boron nanotube.

In some embodiments, the nanomaterial comprises both carbon and boron nanomaterial. In some other embodiments, wherein the nanomaterial comprises both carbon and boron nanotubes. In some other embodiments, the nanomaterial comprises single-walled carbon, multiple-walled carbon, single-walled boron, multiple-walled boron nanotube, or a combination thereof.

In some embodiments, the improved grease composition comprises from about 0.1 wt-% to about 20 wt-% of the nanomaterial, more preferably between about 0.5 wt % and about 10 wt. %, still more preferably from about 0.1 wt-% to about 5-% of the nanomaterial. In some other embodiments, wherein the composition comprises from about 0.5 wt-% to about 3 wt-% of the nanomaterial. In yet some other embodiments, the composition comprises from about 0.5 wt-% to about 2 wt-% of the nanomaterial. In some other embodiments, the composition comprises from about 0.5 wt-% to about 1.5 wt-% of the nanomaterial. An advantage of the conductive greases described herein is greases can be prepared with less carbon loading than previously done while maintaining or improving the thermal and/or electrical properties. This provides a cost reduction in addition to conductivity improvement.

Carbon Particles and Boron Nanomaterials

The conductive grease compositions and methods of making the same comprise carbon particles and/or boron nanomaterials. The carbon particles are preferably nanoparticles or nanomaterials. As used herein the reference to nanoparticles or nanomaterials (carbon or boron) includes particles or materials having at least one dimension is less than 10,000 nanometers. Preferably, the nanoparticles and/or nanomaterials have at least one dimension less than 5000 nanometers, more preferably 1000 nanometers, still more preferably less than 750 nanometers, even more preferably less than 500 nanometers, and most preferably less than 250 nanometers. The terms "nanoparticle" and "nanomaterial" include, for example "nanospheres," "nanorods," "nanocups," "nanowires," "nanoclusters," "nanofibers," "nanolayers," "nanotubes," "nanocrystals," "nanobeads," "nanobelts," and "nanodisks."

The terms "carbon nanoparticle" and "carbon nanomaterial" refer to a nanoparticle or nanomaterial which contain primarily carbon element, including, but not limited to, diamond, graphite, fullerenes, carbon nanotubes, carbon fibers, and combinations thereof. Similarly, the terms "boron nanoparticle" and "boron nanomaterial" refers to a nanoparticle or nanomaterial which primarily contain boron element or boron compounds.

The term "nanotube" refers to a class of nanoparticle or nanomaterial which have a shape of a long thin cylinder and contain primarily carbon element. The term "aspect ratio" refers to a ratio of the length over the diameter of a particle. The term "SWNT" refers to a single-walled nanotube. The term "MWNT" refers to a multi-walled nanotube. The term "D-WNT" refers to a double-walled nanotube. The term "F-SWNT" refers to a fluorinated SWNT.

Similarly, the term "carbon nanotube" refers to a class of carbon nanoparticle which have a shape of a long thin cylinder and contain primarily carbon element. The term "boron nanotube" refers to a class of boron nanoparticle which have a shape of a long thin cylinder and contain primarily carbon element. Both carbon and boron nanotube can be multi-wall or single walled nanotube.

Carbon nanotubes ("CNT") are nanoparticles in the shape of a long thin cylinder often with a diameter in few nanometers. The basic structural element in a carbon nanotube is a hexagon which is the same as found in graphite. Based on the orientation of the tube axis with respect to the hexagonal lattice, a carbon nanotube can have three different configurations: armchair, zigzag, and chiral (also known as spiral). In armchair configuration, the tube axis is perpendicular to two of six carbon-carbon bonds of the hexagonal lattice. In zigzag configuration, the tube axis is parallel to two of six carbon-carbon bonds of the hexagonal lattice. Both these two configurations are achiral. In chiral configuration, the tube axis forms an angle other than 90 or 180 degrees with any of six carbon-carbon bonds of the hexagonal lattice.

Carbon nanotubes of these configurations often exhibit different physical and chemical properties. For example, an armchair nanotube is always metallic whereas a zigzag nanotube can be metallic or semi-conductive depending on the diameter of the nanotube. All three different nanotubes are expected to be very good thermal conductors along the tube axis, exhibiting a property known as "ballistic conduction," but good insulators laterally to the tube axis.

In addition to the common hexagonal structure, the cylinder of a carbon nanotube molecule can also contain other size rings, such as pentagon and heptagon. Replacement of some regular hexagons with pentagons and/or heptagons can cause cylinders to bend, twist, or change diameter, and thus lead to some interesting structures such as "Y-," "T-," and "X-junctions," and different chemical activities. Those various structural variations and configurations can be found in both SWNT and MWNT. However, the present invention is not limited by any configuration and structural variation. The carbon nanotube used in the present invention can be in the configuration of armchair, zigzag, chiral, or combinations thereof. The carbon nanotube can also contain structural elements other than hexagon, such as pentagon, heptagon, octagon, or combinations thereof.

Another structural variation for MWNT molecules is the arrangement of the multiple tubes. A perfect MWNT is like a stack of graphene sheets rolled up into concentric cylinders with each wall parallel to the central axis. However, the tubes can also be arranged so an angle between the graphite basal planes and the tube axis is formed. Such MWNT is known as a stacked cone, Chevron, bamboo, ice cream cone, or piled cone structures. A stacked cone MWNT can reach a diameter of about 100 nm. Despite these structural variations, all MWNTs are suitable for the present invention if they have an excellent thermal conductivity. The term MWNT used herein also includes double-walled nanotubes ("D-WNT").

In some embodiments, the carbon nanotubes are single-walled nanotubes ("SWNT"), double-walled nanotubes ("DWNT"), multi-walled nanotubes ("MWNT"), or a combination of the same. In some other embodiment, the carbon nanotubes include carbon SWNT, MWNT, and/or DWNT. As used herein, the term MWNT is inclusive of DWNTs.

In some embodiments, the boron nanotubes are single-walled nanotubes ("SWNT"), double-walled nanotubes ("DWNT"), multi-walled nanotubes ("MWNT"), or a combination of the same. In some other embodiment, the boron nanotubes include boron SWNT, MWNT, and/or DWNT.

Carbon or boron nanotubes used in the present invention can also encapsulate other elements and/or molecules within their enclosed tubular structures. Such elements include Si, Ti, V, Cr, Mn, Fe, Co, Ni, Cu, Y, Zr, Mo, Ta, Au, Th, La, Ce, Pr, Nb, Gd, Tb, Dy, Ho, Er, Tm, Yb, Lu, Mo, Pd, Sn, and W. Carbon nanotubes used in the present disclosure also include alloys of these elements such as alloys of cobalt with S, Br, Pb, Pt, Y, Cu, B, and Mg, and compounds such as the carbides (i.e. TiC, MoC, etc.) The present of these elements, alloys and compounds within the core structure of fullerenes and nanotubes can enhance the thermal conductivity of these nanotubes which then translates to a higher thermal conductive nanofluid when these nanotubes are suspend in a heat transfer fluid.

Carbon nanotubes used in the present invention can also be chemically modified and functionalized to be so-called "functionalized carbon nanotubes", such as covalently attached hydrophilic groups to increase their solubility in hydrophilic fluids or lipophilic chains to increase their solubility in hydrophobic oils. Covalent functionalization of carbon nanotubes, especially fullerenes, has commonly been accomplished by three different approaches, namely, thermally activated chemistry, electrochemical modification, and photochemical functionalization. The most common methods of thermally activated chemical functionalization are addition reactions on the sidewalls. For example, the extensive treatment of a nanotube with concentrated nitric and sulfuric acids leads to the oxidative opening of the tube caps as well as the formation of holes in the sidewalls and thus produces a nanotube decorated with carboxyl groups, which can be further modified through the creation of amide and ester bonds to generate a vast variety of functional groups.

The carbon nanotube can also be modified through addition reactions with various chemical reagents such halogens and ozone. Unlike thermally controlled modification, electrochemical modification of carbon nanotubes can be carried out in more selective and controlled manner. Interestingly, a SWNT can be selectively modified or functionalized either on the cylinder sidewall or the optional end caps. These two distinct structural moieties often display different chemical and physical characteristics. The functional group on functionalized carbon nanotubes may be attached directly to the carbon atoms of a carbon nanotubes or via chemical linkers, such as alkylene or arylene groups. To increase hydrophilicity, carbon nanotubes can be functionalized with one or more hydrophilic functional groups, such as, sulfonate, carboxyl, hydroxyl, amino, amide, urea, carbamate, urethane, and phosphate. To increase hydrophobicity, carbon nanoparticles may be functionalized with one or more hydrophobic alkyl or aryl groups. The functionalized carbon nanoparticle may have no less than about 2, no less than about 5, no less than about 10, no less than about 20, or no less than about 50 functional groups on average.

The term "carbon nanotube" or "boron nanotube" used herein refers to all structural variations and modification of SWNT and MWNT discussed hereinabove, including configurations, structural defects and variations, tube arrangements, chemical modification and functionalization, and encapsulation.

To some extent, any carbon nanomaterial can be chemically modified or functionalized to become a "functionalized carbon nanomaterial", in a similar way for carbon nanotubes.

Carbon nanotubes are commercially available from a variety of sources. Single walled carbon nanotubes can be obtained from Carbolex (Broomall, PA), MER Corporation (Tucson, Arizona), and Carbon Nanotechnologies Incorporation ("CNI", Houston, Texas). Multi-walled carbon nanotubes can be obtained from MER Corporation (Tucson, Arizona) and Helix material solution (Richardson, Texas). However, the present invention is not limited by the source of carbon nanotubes. In addition, many publications are available with enough information to allow one to manufacture nanotubes with desired structures and properties. The most common techniques are arc discharge, laser ablation, chemical vapor deposition, and flame synthesis. In general, the chemical vapor deposition has shown the most promise in being able to produce larger quantities of nanotubes at lower cost. This is usually done by reacting a carbon containing gas, such as acetylene, ethylene, ethanol, etc., with a metal catalyst particle, such as cobalt, nickel, or ion, at temperatures above 600° C.

The selection of a carbon nanomaterial depends on several factors. The most important factor is the carbon nanomaterial is a functionalized carbon nanomaterial having one or more functional groups forming a hydrogen bond with another functional group existing in an already existing base oil or just co-existing base oil. Boron nanomaterial can generally form hydrogen bond with another functional group capable of forming hydrogen bond.

Another important consideration is the nanomaterial must be compatible with an already existing base oil discussed thereafter. Other factors include heat transfer properties, electrical transfer properties, cost effectiveness, solubility, dispersion and settling characteristics. In some embodiments of the present disclosure, the carbon nanomaterial selected contain predominantly single-walled functionalized carbon nanotubes. In some other embodiments, the nanomaterial selected contain predominantly multi-walled functionalized carbon nanotubes. In some embodiments of the present disclosure, the carbon nanomaterial selected contain predominantly single-walled boron nanotubes. In some other embodiments, the nanomaterial selected contain predominantly multi-walled boron nanotubes.

In one aspect, the carbon nanotube has a carbon content of no less than about 60%, no less than about 80%, no less than about 90%, no less than about 95%, no less than about 98%, or no less than about 99%.

In another aspect, the carbon or boron nanotube has a diameter of from about 0.2 to about 100 nm, from about 0.4 to about 80 nm, from about 0.5 to about 60 nm, or from about 0.5 to about 50 nm. In yet another aspect, the carbon nanotube is no greater than about 200 micrometers, no greater than 100 micrometers, no greater than about 50 micrometers, or no greater than 20 micrometers in length. In yet another aspect, the carbon nanotube has an aspect ratio of not greater than 1,000,000, no greater than 100,000, no greater than 10,000, no greater than 1,000, no greater than about 500, no greater than about 200, or no greater than about 100.

Grease Additives

In some embodiments, the conductive grease compositions further comprise a grease additive. In some other embodiments, the composition further comprises $MoS_2$ as an additive. In some other embodiments, the conductive grease composition is free of other grease additive.

Surfactants

The conductive grease compositions can include a surfactant or be free of surfactant. Surfactants suitable for use with the compositions of the present invention include, but are not limited to, nonionic surfactants, anionic surfactants, and zwitterionic surfactants. In some embodiments, the compositions of the present invention include about 10 wt % to about 50 wt % of a surfactant. In other embodiments the compositions of the present invention include about 15 wt % to about 30% of a surfactant. In still yet other embodiments, the compositions of the present invention include about 25 wt % of a surfactant. In some embodiments, the compositions of the present invention include about 100 ppm to about 1000 ppm of a surfactant.

Viscosity Modifiers

The conductive grease compositions can optionally comprise a viscosity modifier. Preferred viscosity modifiers include thickeners.

Methods of Preparing the Conductive Grease Compositions

The conductive grease compositions can be prepared with a variety of equipment and under conditions specific to the ingredients for the conductive grease composition. For example, the method may include heating the fluid, such carbon particles and/or boron nanomaterials can be dispersed therein. The precise temperature of the heating may be dictated by the melting point or boiling point of the fluid.

The conductive grease compositions can be prepared in batch or continuous processes. To prepare the conductive grease compositions, the fluid may be heated. Preferably, the fluid is heated. The temperature of heating may vary based on the fluid. Preferably it is a temperature between about 60° C. and about 200° C., more preferably a temperature between about 70° C. and about 180° C. In some embodiments, heating is not necessary. For example, in an embodiment where water is the fluid or comprises a significant percentage of the fluid, heating is not required.

After heating the base oil, carbon particles and/or boron nanomaterials can be added to the base oil. The carbon particles and/or boron nanomaterials can be added all at once or sequentially in smaller portions. Preferably, the carbon particles and/or boron nanomaterials are mixed or stirred in the fluid to form a conductive grease composition. If the carbon particles and/or boron nanomaterials are added sequentially in small portions, the mixing and/or stirring can be performed as the nanotubes are being added and/or between sequential additions. Preferred mixing and stirring methods, include, but are not limited to, automatic mixers (such as paddle mixers), stir bars, manual stirring or manual mixing, sonication, etc. The intensity and speed of the mixing or stirring can vary. Preferably, the intensity and/or speed are not too vigorous to break or degrade the carbon particle and/or boron nanomaterial structures. The stirring can occur for any amount of time enough to disperse the carbon particles and/or boron nanomaterials. Preferably, the carbon particles and/or boron nanomaterials are thoroughly dispersed; most preferably, the carbon particles and/or boron nanomaterials are homogenously dispersed in the fluid. Preferred mixing and/or stirring times can be between about 1 minute and 2 hours; more preferably, between about 2 minutes and about 1 hour; most preferably between 5 minutes and 30 minutes. In an embodiment where the preparation of the conductive grease compositions is a continuous process, the mixing may be continuous.

After mixing, the conductive grease composition can optionally be heated, cooled, or maintained at the same temperature. If the conductive grease composition is heated, it is preferably heated to a temperature between about 80° C. and about 240° C., more preferably to a temperature between about 100° C. and about 220° C. The heating can be performed for a time between about 1 minute and about 2 hours; more preferably between about 5 minutes and about 90 minutes; most preferably between about 10 minutes and about 1 hour.

Preferably the conductive grease is passed through a roller mill, an extruder, a manual or mechanical stirrer. Preferably, the conductive grease is passed through a roller mill. Preferred roller mills include, but are not limited to, two-roll mills and three-roll mills. Preferably the conductive grease composition is passed through a roller mill enough times to obtain a smooth consistency. In a preferred method, the conductive grease is passed through a roller mill between 1 and 20 times, more preferably between 2 and 15 times, most preferably between 3 and 10 times. The conductive grease can be passed through the same roller mill multiple times or through a series of roller mills to achieve the desired number of pass-throughs.

After passing the conductive grease through a roller mill, the conductive grease can be heated, cooled, or maintained at the same temperature.

While an understanding of the mechanism is not necessary to practice the present invention and while the present invention is not limited to any mechanism of action, it is contemplated the combination of a fluid and nanomaterial can form an electrostatic attraction, including, but not limited to, a hydrogen bond among them leads to enhanced thermal and electrical conductivity. Because of this combination, the disclosed grease compositions herein possess an enhanced thermal and/or electrical conductivity. The disclosed grease compositions are also more stable even under tough conditions.

All publications and patent applications in this specification are indicative of the level of ordinary skill in the art to which this invention pertains. All publications and patent applications are herein incorporated by reference to the same extent as if each individual publication or patent application was specifically and individually indicated as incorporated by reference.

EXAMPLES

Embodiments of the present invention are further defined in the following non-limiting Examples. These Examples, while indicating certain embodiments of the invention, are given by way of illustration only. From the above discussion and these Examples, one skilled in the art can ascertain the essential characteristics of this invention, and without departing from the spirit and scope thereof, can make various changes and modifications of the embodiments of the invention to adapt it to various usages and conditions. Thus, various modifications of the embodiments of the invention, in addition to those shown and described herein, will be apparent to those skilled in the art from the foregoing description. Such modifications are also intended to fall within the scope of the appended claims.

Example 1

In this Example, a series of greases by three roll mills and their resistances were measured, respectively.

An exemplary procedure to make a grease is following. First, heat 92.5 g N650HT Oil to 120° C. on a hot plate; slowly add 7.5 g multi wall carbon nanotubes (MWNT-OH Industrial Grade) while stirring at a speed setting of 3 of hot plate. Once all carbon nanotubes have been added, continue to stir for 10 minutes. Then, raise temperature to 150° C. while stirring for 30 minutes at 150° C. Afterwards, allow the product to cool down while stirring until it is safe to handle. Finally, manufacture the grease through the three-roll mill 8-times to obtain a smooth consistency grease. FIG. 1 shows the grease based on 7.5 wt % MWNT-OH/92.5 wt % Ester oil. FIG. 2 shows a SEM image of the grease based on 7.5 wt % MWNT-OH/92.5 wt % Ester oil. This image clearly indicates nanotubes form a network is contributing the conductivity.

Table 1 lists the ingredients and the measured resistances. The resistance was measured with a Keithly instrument 2401.

TABLE 1

The ingredients and measured resistance of some exemplary greases.

| Base Oil | Carbon Material | Carbon wt. % | Resistance (ohm · cm) |
| --- | --- | --- | --- |
| Petro-Canada NH650HT | MWNT-OH (Industrial) | 7.5 | 22.4 |
| ROYCO 500 | MWNT-OH (Industrial) | 7.5 | 80 |
| PAO Durasyn 166 | MWNT-OH (Industrial) | 7.5 | 4.5k |
| Petro-Canada NH650HT | Nano C SWNT | 2 | 2.3k |
| Petro-Canada NH650HT | CNT-MWCNT | 8.4 | 7.88k |
| Krytox XHT750 | Helix MWNT | 15 | 40 |
| Krytox XHT750 | MWNT-OH (Industrial) | 1.8 | 18.6 |
| Ethylene Glycol | MWNT-OH (Industrial) | 4.46 | 96 |
| Ethylene Glycol | MWNT (Industrial) | 12.53 | 46 |
| Glycerol | MWNT-OH (Industrial) | 4.5 | 28 |
| Glycerol | MWNT (Industrial) | 12.5 | 48.5 |
| 75% Glycerol/25% Water | MWNT-OH (Industrial) | 4.5 | 10 |
| 50% Glycerol/50% Water | MWNT-OH (Industrial) | 4.5 | 20 |
| 50% Glycerol/(25% Water/25% EG) | MWNT-OH (Industrial) | 4.5 | 16.83 |
| 50% Ethylene Glycol/50% Water | MWNT-OH (Industrial) | 5.68 | 11.9 |
| PAO Durasyn 166 | Helix MWNT | 20 | 2.7k |
| Petro-Canada NH650HT | Pyrograf Pr-19-XT-HHT | 10 | 16.1k |
| PAO Durasyn 166 | Pyrograf Pr-19-XT-HHT | 12 | 227 |
| Glycerol | Pyrograf Pr-19-XT-HHT | 12 | 175 |
| PAO Durasyn 166 | Pyrograf Pr-19-XT-HHT CNF and MWNT-OH (Industrial) | 4.48 each | 138 |
| 50% Glycerol/50% Water | MWNT-OH (Industrial) | 4.5 (10% NaCl Added) | 130 |
| Glycerol | MWNT-OH (Industrial) | 4.5 (3% Cu Nanoparticles added) | 178 |
| Commercial grease Nyogel 758G | unknown | unknown | 300-500 |

All greases made were found to be stable. No oil leaks were found for these grease samples for at least 10 days after they were applied to a test device. The stability of the grease compositions was assessed visually. If unstable the oil will separate and collect on top of the grease. This was not observed for any of the exemplary samples prepared and examined.

As shown in Table 1, some greases are better than the common commercial grease in terms of electrical resistances. Some samples show 4-5 times conductivity enhancement. Closer study of the measured resistance values leads to an unexpected observation, is, the combination of a carbon nanotubes and base oil have functional groups for forming the hydrogen boding between them leads to a high conductivity grease. In other words, hydrogen bonding between a carbon nanotube and base oil is the reason to have extra high conductivity.

For examples, the highest conductivity sample is 75% Glycerol/25% Water with MWNT-OH (4.5 wt %), in which water or glycerol can form hydrogen bonds with MWNT-OH, OH functionalized multiple wall nanotubes. On the other hand, the lowest conductivity grease is Petro-Canada NH650HT with MWNT (8.4 wt %) and fiber (10 wt %), in which no hydrogen bond is possible between the MWNT and base oil. Predictably, oil has strong hydrogen bonding capability (krytox XHT750) leads to a very low nanotube loading (<2 wt %) and yet high conductivity.

Example 2

In this Example, friction coefficients of some exemplary greases were measured. FIG. 24A-FIG. 24D show the friction coefficients exhibited by CNT-based greases and three other conventional lubricant greases, Li-based grease, Ca-based grease, and Li-based greases with MoS2 as additive, in steady-state and fretting/oscillating motion condition as well.

As shown in FIG. 24A-24D, in nearly all test conditions, CNT or CNT+MoS2 based greases provided the lowest friction coefficients. The testing in FIG. 3C is representative of difficult conditions consistent with tough industrial operations thermal greases may be exposed to), CNT-based greases achieved friction reduction by more than 50%. These results are also unexpected.

In summary, comparing to the current commercial electrically conductive grease which are made by mixing commercial Li grease and carbon particles, the grease disclosed herein show unexpected better conductivity, long stability, reduced friction coefficient.

The unexpected results in this disclosure also lead to an improved way to significantly enhance the electrical conductivity of greases while reduce the nanotube loading percentage. The new discovery here is hydrogen bonding between nanotube and oil is the key element for a good conductivity performance. This discovery is totally different with the prior art, in which non-functional nanotubes in high percentages were used for greases with higher thermal conductive, instead of electrical conductivity.

The sole thickener of carbon nanotubes in our grease structure makes our grease unique and valuable. Compared to commercial grease carbon is added without bonding and conductivity decreased with the time, the conductivity of our grease shall keep stable.

Example 3

In this Example, the ability of the greases disclosed herein to increase thermal conductivity of some common high thermal conductivity greases. High thermal conductive grease was usually made by nanomaterial, such as carbon and boron nanomaterial, and base oils. It was discovered unexpectedly adding both water, oil/nanomaterials have functional groups for forming the hydrogen bonds between them can increase greases' thermal conductivity as well. In other words, hydrogen bonding is the key to have extra high thermal conductivity in a grease, like have extra electrical conductivity. It was also found out boron nanotube function similarly to increase thermal conductivity as carbon nanotubes. Boron nanomaterial can form the hydrogen bonding as well.

The most unexpected results are a few percentages of the greases disclosed herein or nanomaterial can form hydrogen bond with another functional group existing in a commercial grease, the thermal conductivity of the commercial grease enhance significantly. Table 2 shows the results of adding various hydrogen bond forming water, or nanomaterials into a base oil or greases. For example, 1 wt % loading could lead to 50 percent TC enhancement and 2-3 wt % loading lead to more than 100% TC enhancement.

TABLE 2

Thermal Conductivities Enhancement of adding carbon or boron nanomaterial to grease compositions.

| Base Fluid | 2nd Base Fluid | 1st particles | 2nd particles | TC (W/mK) | TC Percent Increase |
|---|---|---|---|---|---|
| 17.2 g Glycerol | N/A | BN nano 2.8 g (14%) | N/A | 0.4584 | 47% |
| 17.2 g PAO | N/A | BN nano 2.8 g (14%) | N/A | 0.2320 | 36.6% |
| 14.3 g Fromblin #4000 | N/A | BN nano 1.3796 (8.78%) | N/A | 0.1562 | 44.50% |
| Glycerol 8.6 g (43%) | Water 8.6 g (43%) | BN-nano 2.8 g (14%) | N/A | 0.6528 | 45.8% |
| 17.2 g Glycerol | N/A | BN-nano 1.4 g (7%) | CNF-19 1.4 g (7%) | 1.4453 | 366% |
| 17.2 g Glycerol | N/A | CNF-19 0.7 g 25% (3.5%) | BN nano 2.1 g 75% (10.5%) | 0.8975 | 188% |
| 14 g Krytox XHT 750 | N/A | BN nano 1.0 g (9.1%) | N/A | 0.1487 | 31.5% |
| Glycerol 8.6 g (43%) | Water 8.6 g (43%) | BN-nano 1.4 g (7%) | CNF-19 1.4 g (7%) | 1.7885 | 299.5% |
| 17.2 g Used Silicon oil from water bath heater | N/A | BN nano 2.8 g (14%) | N/A | 0.2618 | 44% |
| 23.87 g Used Silicon oil from water bath heater | N/A | CNF-19 1.24 g (4.9%) | N/A | 0.5097 | 180.5% |
| Used Silicon oil from water bath heater | N/A | Silica nano 1.23 g (5.1%) | N/A | 0.1968 | 8% |
| Used 18.6 g Silicon oil from water bath heater | N/A | MWNT-OH 1.4 g (7%) | N/A | 0.3390 | 86.6% |
| NYE 758G grease | N/A | CNF-19 (5%) | N/A | 0.4781 | 163.3 |
| 10 g Valvoline Cerulean Grease | N/A | CNF-19 0.38 g (3.66%) | N/A | 0.3479 | 108.7% |
| 5 g Glycerol (25%) | 15 g H2O (75%) | CNF-19 1.4 g (6.54%) | N/A | 1.9487 | 261.5% |
| Old Grease Sample 9-1 (PAO with SWNT or MWNT) | N/A | CNF-19 (5%) | N/A | 0.5027 | 98.9% |
| 5.0453 g (4-6-2017 6% CNF-19 94% NYE 758G blank grease) | 1.0513 g NYE 758G grease | final is 4.97% CNF-19 | N/A | 0.48662 | N/A |
| 10 g Valvoline Cerulean Grease | N/A | CNF-19 0.19 g (1.83%) | Graphene nano platelets 0.19 g (1.83%) | 0.2136 | 28% |
| 10 g Valvoline Cerulean Grease | N/A | CNF-19 0.19 g (1.83%) | BN nano 0.19 g (1.83%) | 0.2295 | 37.7% |
| 5 g (2-15-2017 7.5% MWNT-OH 92.5% PAO 166) | N/A | CNF-19 0.265 g (5%) | N/A | 0.6704 | 109.6% |
| 5 g (MG Chemicals Silicone Heat Transfer Compound) | N/A | CNF-19 0.265 g (5%) | N/A | 1.6995 | 143.4% |
| 5 g (MG Chemicals Silicone Heat Transfer Compound) | N/A | CNF-19 0.155 g (3%) | N/A | 1.333 | 91% |
| 5 g (MG Chemicals Silicone Heat Transfer Compound) | N/A | CNF-19 0.051 g (1%) | N/A | 0.9871 | 41.4% |

The thermal conductivity data was obtained using the Hot Disk™ thermal constants analyzer, using the following parameters:

measurement depth: 6 mm
room temperature: 25° C.
power: 0.025 W
measurement time: 16 seconds
sensor radius: 2.001 mm
TCR: 0.0471/K,
disk type: Kapton
temperature drift rec: yes As can be seen in Table 2, the grease compositions prepared according to the methods of the invention, having carbon particles or boron nanomaterials, had improved thermal conductivity values often of at least 40% and even over 100%. Further, the Table demonstrates conductive greases prepared with boron nanomaterials also provide improved thermal properties.

There is an increasing interest in the development of conductive coatings. Conductive coatings have a wide variety of applicability. For example, conductive coatings can be used for lightening shielding in aircraft or to prevent the buildup of a static charge on containers handling explosive materials. Others have sought to address these issues. For example, U.S. Pat. No. 5,498,372 to Winston L. Hedges disclosed an electrically conductive polymeric composition for coating volatile chemical containers. However, Hedges' disclosure suffered from problems with the components agglomerating. U.S. Published Patent Application Number 2011/0014356 to Fornes et al. provides another example disclosing a complex layered material for covering a substrate to protect from lightning strikes. However, this material contains twelve layers of varying materials, including multiple layers of carbon plies. Not only is the material complex to prepare, but expensive in terms of time and components. There is need for improved conductive coating materials.

Accordingly, it is an objective of the present disclosure to provide conductive coating materials with enhanced electrical, thermal, and/or semiconducting properties.

A further object of the invention is to provide conductive coating materials are flexible and can be employed to a variety of surfaces.

Other objects, advantages and features of the present invention will become apparent from the following specification taken in conjunction with the accompanying figures.

Figure 25A:
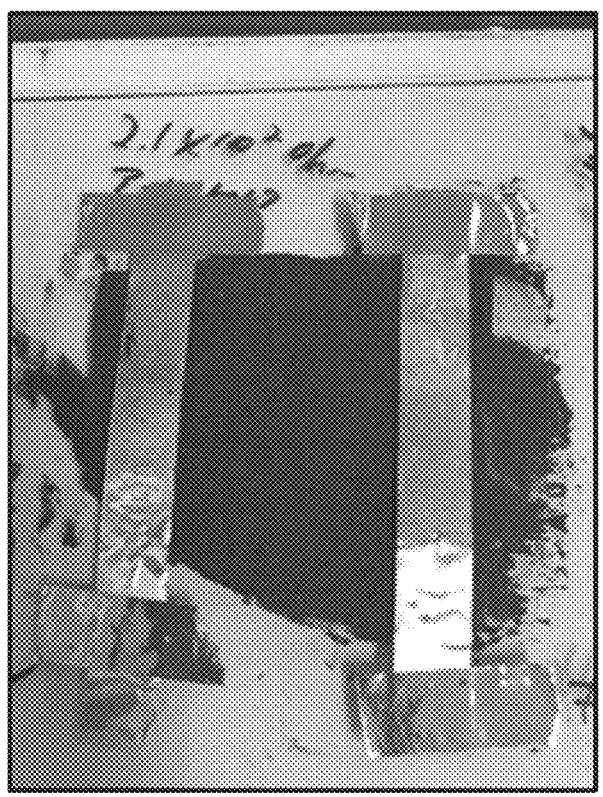
FIGS. 25A and 25B show photographs of an exemplary conductive flexible coating composition comprising carbon nanomaterial and providing enhanced conductor/semiconductor properties on a surface.
Figure 25B:
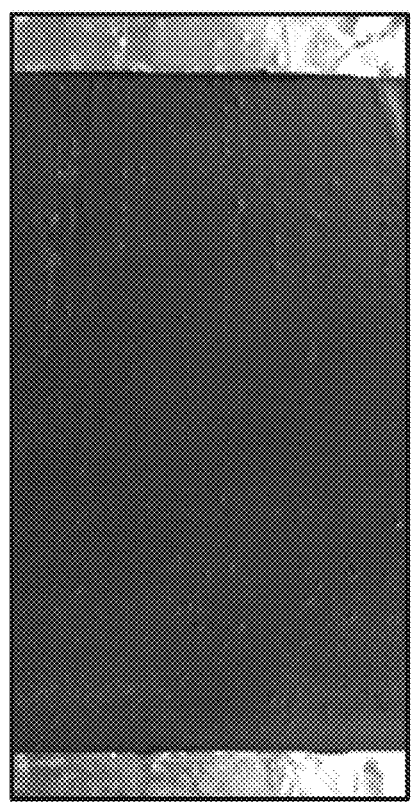

FIGS. 25A and 25B show photographs of an exemplary conductive flexible coating composition comprising carbon nanomaterial and providing enhanced conductor/semiconductor properties on a surface.

While multiple embodiments are disclosed, still other embodiments of the present invention will become apparent to those skilled in the art from the following detailed description, which shows and describes illustrative embodiments of the invention. Accordingly, the figures and detailed description are to be regarded as illustrative in nature and not restrictive. Figures represented herein are not limitations to the various embodiments according to the invention and are presented for exemplary illustration of the invention.

The present invention relates to conductive coating compositions comprising a fluid capable of hydrogen bonding and a nanomaterial. The conductive coatings have many advantages over existing conductive coatings. For example, the conductive coatings have significantly enhanced electrical, thermal, and/or semiconducting properties. Furthermore, the conductive coating compositions are flexible and can be applied to a variety of surfaces.

Definitions

So, the present invention may be more readily understood, certain terms are first defined. Unless defined otherwise, all technical and scientific terms used herein have the same meaning as commonly understood by one of ordinary skill in the art to which embodiments of the invention pertain. Many methods and materials similar, modified, or equivalent to those described herein can be used in the practice of the embodiments of the present invention without undue experimentation, the preferred materials and methods are described herein. In describing and claiming the embodiments of the present invention, the following terminology will be used in accordance with the definitions set out below. Moreover, the embodiments of this invention are not limited to electrically conductive coating applications, which can vary and are understood by skilled artisans. It is further to be understood all terminology used herein is for the purpose of describing embodiments only and is not intended to be limiting in any manner or scope.

As used in this specification and the appended claims, the singular forms "a," "an" and "the" can include plural referents unless the content clearly indicates otherwise. Further, all units, prefixes, and symbols may be denoted in its SI accepted form.

Numeric ranges recited within the specification are inclusive of the numbers defining the range and include each integer within the defined range. Throughout this disclosure, various aspects of this invention are presented in a range format. The description in range format is merely for convenience and brevity and should not be construed as an inflexible limitation on the scope of the invention. Accordingly, the description of a range should be considered to have specifically disclosed all the possible sub-ranges, fractions, and individual numerical values within range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within range, for example, 1, 2, 3, 4, 5, and 6, and decimals and fractions, for example, 1.2, 3.8, 1½, and 4¾% This applies regardless of the breadth of the range.

The term "about," as used herein, refers to variation in the numerical quantity can occur, for example, through typical measuring techniques and equipment, with respect to any quantifiable variable, including, but not limited to, mass, volume, time, distance, wave length, frequency, voltage, current, and electromagnetic field. Further, given solid and liquid handling procedures used in the real world, there is certain error and variation is likely through differences in the manufacture, source, or purity of the ingredients used to make the compositions or carry out the methods and the like. The term "about" also encompasses these variations. Whether or not modified by the term "about," the claims include equivalents to the quantities.

The methods and compositions of the present invention may comprise, consist essentially of, or consist of the components and ingredients of the present invention as well as other ingredients described herein. As used herein, "consisting essentially of" means the methods, systems, apparatuses and compositions may include additional steps, components or ingredients, but only if the additional steps, components or ingredients do not materially alter the basic and novel characteristics of the claimed methods, systems, apparatuses, and compositions.

As used herein, the term "alkyl" or "alkyl groups" refers to saturated hydrocarbons having one or more carbon atoms, including straight-chain alkyl groups (e.g., methyl, ethyl, propyl, butyl, pentyl, hexyl, heptyl, octyl, nonyl, decyl, etc.), cyclic alkyl groups (or "cycloalkyl" or "alicyclic" or "carbocyclic" groups) (e.g., cyclopropyl, cyclopentyl, cyclohexyl, cycloheptyl, cyclooctyl, etc.), branched-chain alkyl groups (e.g., isopropyl, tert-butyl, sec-butyl, isobutyl, etc.), and alkyl-substituted alkyl groups (e.g., alkyl-substituted cycloalkyl groups and cycloalkyl-substituted alkyl groups).

Unless otherwise specified, the term "alkyl" includes both "unsubstituted alkyls" and "substituted alkyls." As used herein, the term "substituted alkyls" refers to alkyl groups having substituents replacing one or more hydrogens on one or more carbons of the hydrocarbon backbone. Such substituents may include, for example, alkenyl, alkynyl, halogeno, hydroxyl, alkylcarbonyloxy, arylcarbonyloxy, alkoxycarbonyloxy, aryloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), imino, sulfhydryl, alkylthio, arylthio, thiocarboxylate, sulfates, alkylsulfinyl, sulfonates, sulfamoyl, sulfonamido, nitro, trifluoromethyl, cyano, azido, heterocyclic, alkylaryl, or aromatic (including heteroaromatic) groups.

In some embodiments, substituted alkyls can include a heterocyclic group. As used herein, the term "heterocyclic group" includes closed ring structures analogous to carbocyclic groups in which one or more of the carbon atoms in the ring is an element other than carbon, for example, nitrogen, sulfur or oxygen. Heterocyclic groups may be saturated or unsaturated. Exemplary heterocyclic groups include, but are not limited to, aziridine, ethylene oxide (epoxides, oxiranes), thiirane (episulfides), dioxirane, azetidine, oxetane, thietane, dioxetane, dithietane, dithiete, azolidine, pyrrolidine, pyrroline, oxolane, dihydrofuran, and furan.

The term "polyol ester" refers to an ester of an organic compound containing at least two hydroxyls with at least one carboxylic acid.

The term "surfactant" refers to a molecule having surface activity, including wetting agents, dispersants, emulsifiers, detergents, and foaming agents, and the like. It is understood to be inclusive of the use of a single surfactant or multiple surfactants.

The term "water miscible" as used herein, means the component (e.g., solvent) is soluble or dispersible in water at about 20° C. at a concentration greater than about 0.2 g/L, preferably at about 1 g/L or greater, more preferably at 10 g/L or greater, and most preferably at about 50 g/L or greater.

The term "weight percent," "wt. %," "wt-%," "percent by weight," "% by weight," and variations thereof, as used herein, refer to the concentration of a substance as the weight of substance divided by the total weight of the composition and multiplied by 100.

As used herein, the term "free of a compound" refers to a composition, mixture, or ingredient does not contain the compound or to which the compound has not been added. Should the compound be present through contamination of a composition, mixture, or ingredients free of the compound, the amount of the compound shall be less than 0.5 wt %. More preferably, the amount of the compound is less than 0.1 wt-%, and most preferably, the amount of phosphate is less than 0.01 wt %. In this disclosure, the compound the disclosed conductive coating composition is free of can be a surfactant, additive, or combination thereof.

As used herein, the term "an existing conductive coating composition" refers to a conductive coating composition does not contain any functionalized carbon nanomaterial or boron nanomaterial. Such an existing conductive coating composition can contain non-functionalized carbon nanomaterial.

The methods, systems, apparatuses, and compositions of the present invention may comprise, consist essentially of, or consist of the components and ingredients of the present invention as well as other ingredients described herein. As used herein, "consisting essentially of" means the methods, systems, apparatuses and compositions may include additional steps, components or ingredients, but only if the additional steps, components or ingredients do not materially alter the basic and novel characteristics of the claimed methods, systems, apparatuses, and compositions.

Further terms are defined in the detailed description.

Conductive Coating Compositions

The conductive coating compositions comprise a fluid capable of hydrogen bonding and a nanomaterial. Preferred fluids capable of hydrogen bonding, include, a fluid component capable of hydrogen bonding. The nanomaterials can be capable of hydrogen bonding or not capable of hydrogen bonding. Preferred nanomaterials are those functionalized having one or more of a first functional group capable of forming an electrostatic attraction, including, but not limited to, a hydrogen bond or boron nanomaterial; and wherein the fluid comprises one or more of a second functional group capable of forming an electrostatic attraction, including, but not limited to, a hydrogen bond with the first function group of the nanomaterial. Preferably, the conductive coating composition is stable. Preferably, the conductive coating composition is flexible. Preferably, the conductive coating material is paintable and will adhere to a surface as a coating material does not crack. Non-limiting, exemplary conductive coating compositions are shown the Table 3.

TABLE 3

| | First Exemplary Composition (wt. %) | Second Exemplary Composition (wt. %) | Third Exemplary Composition (wt. %) |
|---|---|---|---|
| Fluid Component | 25-99.9 | 50-99.5 | 75-95 |
| Nanomaterial | 0.1-20 | 0.5-10 | 0.5-5 |
| Optional Additional Components | 0-70 | 0-47 | 0-23 |

The conductive coating compositions preferably have improved electrical conductivity and improved resistance. Preferably, the resistance is improved (lowered) over the fluid component alone by at least about 10%, 20%, 30%, 40%, 50%, 60%, 70%, 80% when measured by the same test under the same conditions. Preferably, the electrical conductivity is improved (increased) over the fluid component alone by at least about 10%, 20%, 50%, 100%, 200%, 250%, 300%, 400%, 500%, when measured by the same test under the same conditions.

The conductive coating compositions preferably have improved thermal conductivity. Preferably, the thermal conductivity is improved (increased) over the fluid component alone by at least about 10%, 20%, 30%, 40%, 50%, 60%, 70% 80%, 90% 100%, 150%, 200%, 250%, 300%, 350%, when measured by the same test under the same conditions.

The conductive coating compositions can optionally comprise one or more additional components added to provide properties to the coating compositions. For example, such components can include conductive particles, dyes, reflective materials, surfactants, viscosity modifiers, or combinations or mixtures thereof. Other additional components can also be added.

Fluid Component

The conductive coating compositions and methods described herein comprise a fluid component comprises a polymer. Preferably, the polymer is a self-curing polymer. Preferably, the polymer is a thermoset polymer or a thermoplastic polymer. In some embodiments, the polymer comprises a polyacrylic acid, a methacrylate (such as poly (methyl methacrylate)), an acrylamide, a nylon, a polyethylene, a polyvinyl chloride, polyol, a polyurethane, an epoxy (preferably, a water-based epoxy), or a mixture or combination thereof. In some embodiments, the fluid component is an existing coating composition.

In a preferred embodiment, the fluid component can further comprise water, a water miscible solvent, an alcohol, or a mixture thereof. Preferred alcohols for incorporation in the fluid component include, but are not limited to, those having a carbon chain between 2 and 20 carbons. Particularly preferred alcohols include, but are not limited to ethanol, methanol, isopropyl alcohol, and mixtures thereof. Preferred water miscible solvents include, but are not limited to, dimethylformamide, tetrahydrofuran, and mixtures thereof.

Preferably, the polymer comprises between about 1 wt. % and about 100 wt. % of the fluid component, more preferably between about 5 wt. % and about 95 wt. % of the fluid component, still more preferably between about 10 wt. % and about 90 wt. % of the fluid component, yet more preferably between about 15 wt. % and about 85 wt. % of the fluid component, even more preferably between about 20 wt. % and about 80 wt. % of the fluid component.

In some embodiments, the composition comprises from about 25 wt-% to about 99 wt-% of the fluid component. In some other embodiments, the composition comprises from about 25 wt-% to about 90 wt-%, from about 25 wt-% to about 85 wt-%, from about 25 wt-% to about 80 wt-%, from about 25 wt-% to about 75 wt-%, from about 25 wt-% to about 70 wt-%, from about 25 wt-% to about 65 wt-%, from about 25 wt-% to about 60 wt-%, from about 25 wt-% to about 55 wt-%, from about 25 wt-% to about 50 wt-%, from about 25 wt-% to about 45 wt-%, from about 25 wt-% to about 40 wt-%, from about 25 wt-% to about 35 wt-%, from about 25 wt-% to about 30 wt-%, from about 30 wt-% to about 99 wt-%, from about 35 wt-% to about 99 wt-%, from about 45 wt-% to about 99 wt-%, from about 55 wt-% to about 99 wt-%, from about 65 wt-% to about 99 wt-%, from about 75 wt-% to about 99 wt-%, from about 80 wt-% to about 99 wt-%, from about 85 wt-% to about 99 wt-%, from about 90 wt-% to about 99 wt-%, from about 25 wt-% to about 95 wt-%, from about 35 wt-% to about 95 wt-%, from about 45 wt-% to about 95 wt-%, from about 55 wt-% to about 95 wt-%, from about 65 wt-% to about 95 wt-%, from about 75 wt-% to about 95 wt-%, from about 85 wt-% to about 95 wt-%, from about 25 wt-% to about 85 wt-%, from about 35 wt-% to about 75 wt-%, from about 45 wt-% to about 65 wt-%, from about 55 wt-% to about 60 wt-%, about 25 wt-%, about 35 wt-%, about 40 wt-%, about 45 wt-%, about 55 wt-%, about 60 wt-%, about 65 wt-%, about 70 wt-%, about 75 wt-%, about 80 wt-%, about 85 wt-%, about 90 wt-%, about 95 wt-%, about 99 wt-%, or any value therebetween of the fluid component.

In another aspect, the present disclosure is a method of enhancing thermal or electric conductivity and/or resistance of a conductive coating composition, the method comprises adding into a coating composition a nanomaterial to form an improved coating composition, wherein the nanomaterial is a functionalized carbon nanomaterial having one or more of a first functional group capable of forming an electrostatic attraction, including, but not limited to, a hydrogen bond with a second functional group in the coating composition or boron nanomaterial.

In some other embodiments the method further comprising adding water or a fluid component, wherein the fluid component comprises a functional group capable of forming an electrostatic attraction, including, but not limited to, a hydrogen bond with the first functional group of the nanomaterial.

Nanomaterials

The conductive coating compositions comprise a nanomaterial. In some embodiments, the nanomaterial is capable of hydrogen bonding. In some embodiments, the nanomaterial is not capable of hydrogen bonding. In some embodiments, the nanomaterial comprises a carbon nanomaterial, boron nanomaterial, or combination thereof. In some embodiments, the nanomaterial comprises a carbon nanofiber, a single-walled carbon, multiple-walled carbon, single-walled boron, multiple-walled boron nanomaterial, or combination thereof.

Preferred nanomaterials are those functionalized having one or more of a first functional group capable of forming an electrostatic attraction, including, but not limited to, a hydrogen bond or boron nanomaterial; and wherein the fluid comprises one or more of a second functional group capable of forming an electrostatic attraction, including, but not limited to, a hydrogen bond with the first function group of the nanomaterial. Preferred nanomaterials include, but are not limited to, carbon particles and boron nanomaterials.

In some embodiments, the first and second functional group is a hydrophilic functional group. In some other embodiments, the first and second function group are independently —OH, —NH, —COOH, —F, —BH, —O—, —N—, or combination thereof. In yet some other embodiments, the first functional group is sulfonate, carboxyl, hydroxyl, amino, amide, urea, carbamate, urethane, or phosphate and the second functional group is —OH, —NH, —COOH, —F, —BH, —O—, —N—, or combination thereof. In some embodiments, the fluid component comprises at least one compound have at least one functional group can form an electrostatic attraction, including, but not limited to, a hydrogen bond with at least one functional group in a functionalized carbon nanomaterial or boron nanomaterial.

In some embodiments, the nanomaterial is carbon nanomaterial. In some other embodiments, the nanomaterial is carbon nanotube. In some embodiments, the nanomaterial is a single-walled, multiple-walled nanotube, or a mixture thereof. In some other embodiments, the nanomaterial is a OH functionalized carbon nanomaterial. In yet some other embodiments, the nanomaterial is a fluorine functionalized carbon nanomaterial.

In some embodiments, the nanomaterial is a OH functionalized carbon multi-walled nanotube. In some other embodiments, the nanomaterial is a fluorine functionalized carbon multi-walled nanotube. In yet some other embodiments, the nanomaterial is a OH functionalized carbon single-walled nanotube. In some other embodiments, the nanomaterial is a fluorine functionalized carbon single-walled nanotube.

In some embodiments, the nanomaterial is boron nanomaterial. In some embodiments, the nanomaterial is a single-walled boron nanotube. In yet some other embodiments, the nanomaterial is a multiple-walled boron nanotube.

In some embodiments, the nanomaterial comprises both carbon and boron nanomaterial. In some other embodiments, wherein the nanomaterial comprises both carbon and boron nanotubes. In some other embodiments, the nanomaterial comprises single-walled carbon, multiple-walled carbon, single-walled boron, multiple-walled boron nanotube, or a combination thereof.

In some embodiments, the improved coating composition comprises from about 0.1 wt-% to about 20 wt-% of the nanomaterial, more preferably between about 0.5 wt % and about 10 wt. %, still more preferably from about 0.1 wt-% to about 5-% of the nanomaterial. In some other embodiments, wherein the composition comprises from about 0.5 wt-% to about 3 wt-% of the nanomaterial. In yet some other embodiments, the composition comprises from about 0.5 wt-% to about 2 wt-% of the nanomaterial. In some other embodiments, the composition comprises from about 0.5 wt-% to about 1.5 wt-% of the nanomaterial.

Carbon Particles and Boron Nanomaterials

The conductive coating composition and methods of making the same comprise carbon particles and/or boron nanomaterials. The carbon particles are preferably nanoparticles or nanomaterials. As used herein the reference to nanoparticles or nanomaterials (carbon or boron) includes particles or materials having at least one dimension is less than 10,000 nanometers. Preferably, the nanoparticles and/or nanomaterials have at least one dimension less than 5000 nanometers, more preferably 1000 nanometers, still more preferably less than 750 nanometers, even more preferably less than 500 nanometers, and most preferably less than 250 nanometers. The terms "nanoparticle" and "nanomaterial" include, for example "nanospheres," "nanorods," "nanocups," "nanowires," "nanoclusters," "nanofibers," "nanolayers," "nanotubes," "nanocrystals," "nanobeads," "nanobelts," and "nanodisks."

The terms "carbon nanoparticle" and "carbon nanomaterial" refer to a nanoparticle or nanomaterial which contain primarily carbon element, including, but not limited to, diamond, graphite, fullerenes, carbon nanotubes, carbon fibers, and combinations thereof. Similarly, the terms "boron nanoparticle" and "boron nanomaterial" refers to a nanoparticle or nanomaterial which primarily contain boron element or boron compounds.

The term "nanotube" refers to a class of nanoparticle or nanomaterial which have a shape of a long thin cylinder and contain primarily carbon element. The term "aspect ratio" refers to a ratio of the length over the diameter of a particle. The term "SWNT" refers to a single-walled nanotube. The term "MWNT" refers to a multi-walled nanotube. The term "D-WNT" refers to a double-walled nanotube. The term "F-SWNT" refers to a fluorinated SWNT.

Similarly, the term "carbon nanotube" refers to a class of carbon nanoparticle which have a shape of a long thin cylinder and contain primarily carbon element. The term "boron nanotube" refers to a class of boron nanoparticle which have a shape of a long thin cylinder and contain primarily carbon element. Both carbon and boron nanotube can be multi-wall or single walled nanotube.

Carbon nanotubes ("CNT") are nanoparticles in the shape of a long thin cylinder often with a diameter in few nanometers. The basic structural element in a carbon nanotube is a hexagon which is the same as found in graphite. Based on the orientation of the tube axis with respect to the hexagonal lattice, a carbon nanotube can have three different configurations: armchair, zigzag, and chiral (also known as spiral). In armchair configuration, the tube axis is perpendicular to two of six carbon-carbon bonds of the hexagonal lattice. In zigzag configuration, the tube axis is parallel to two of six carbon-carbon bonds of the hexagonal lattice. Both these two configurations are achiral. In chiral configuration, the tube axis forms an angle other than 90 or 180 degrees with any of six carbon-carbon bonds of the hexagonal lattice.

Carbon nanotubes of these configurations often exhibit different physical and chemical properties. For example, an armchair nanotube is always metallic whereas a zigzag nanotube can be metallic or semi-conductive depending on the diameter of the nanotube. All three different nanotubes are expected to be very good thermal conductors along the tube axis, exhibiting a property known as "ballistic conduction," but good insulators laterally to the tube axis.

In addition to the common hexagonal structure, the cylinder of a carbon nanotube molecule can also contain other size rings, such as pentagon and heptagon. Replacement of some regular hexagons with pentagons and/or heptagons can cause cylinders to bend, twist, or change diameter, and thus lead to some interesting structures such as "Y-," "T-," and "X-junctions," and different chemical activities. Those various structural variations and configurations can be found in both SWNT and MWNT. However, the present invention is not limited by any configuration and structural variation. The carbon nanotube used in the present invention can be in the configuration of armchair, zigzag, chiral, or combinations thereof. The carbon nanotube can also contain structural elements other than hexagon, such as pentagon, heptagon, octagon, or combinations thereof.

Another structural variation for MWNT molecules is the arrangement of the multiple tubes. A perfect MWNT is like a stack of graphene sheets rolled up into concentric cylinders with each wall parallel to the central axis. However, the tubes can also be arranged so an angle between the graphite basal planes and the tube axis is formed. Such MWNT is known as a stacked cone, Chevron, bamboo, ice cream cone, or piled cone structures. A stacked cone MWNT can reach a diameter of about 100 nm. Despite these structural variations, all MWNTs are suitable for the present invention if they have an excellent thermal conductivity. The term MWNT used herein also includes double-walled nanotubes ("D-WNT").

In some embodiments, the carbon nanotubes are single-walled nanotubes ("SWNT"), double-walled nanotubes ("DWNT"), multi-walled nanotubes ("MWNT"), or a combination of the same. In some other embodiment, the carbon nanotubes include carbon SWNT, MWNT, and/or DWNT. As used herein, the term MWNT is inclusive of DWNTs.

In some embodiments, the boron nanotubes are single-walled nanotubes ("SWNT"), double-walled nanotubes ("DWNT"), multi-walled nanotubes ("MWNT"), or a combination of the same. In some other embodiment, the boron nanotubes include boron SWNT, MWNT, and/or DWNT.

Carbon or boron nanotubes used in the present invention can also encapsulate other elements and/or molecules within their enclosed tubular structures. Such elements include Si, Ti, V, Cr, Mn, Fe, Co, Ni, Cu, Y, Zr, Mo, Ta, Au, Th, La, Ce, Pr, Nb, Gd, Tb, Dy, Ho, Er, Tm, Yb, Lu, Mo, Pd, Sn, and W. Carbon nanotubes used in the present disclosure also include alloys of these elements such as alloys of cobalt with S, Br, Pb, Pt, Y, Cu, B, and Mg, and compounds such as the carbides (i.e. TiC, MoC, etc.) The present of these elements, alloys and compounds within the core structure of fullerenes and nanotubes can enhance the thermal conductivity of these nanotubes which then translates to a higher thermal conductive nanofluid when these nanotubes are suspend in a heat transfer fluid.

Carbon nanotubes used in the present invention can also be chemically modified and functionalized to be so-called "functionalized carbon nanotubes", such as covalently attached hydrophilic groups to increase their solubility in hydrophilic fluids or lipophilic chains to increase their solubility in hydrophobic oils. Covalent functionalization of carbon nanotubes, especially fullerenes, has commonly been accomplished by three different approaches, namely, thermally activated chemistry, electrochemical modification, and photochemical functionalization. The most common methods of thermally activated chemical functionalization are addition reactions on the sidewalls. For example, the extensive treatment of a nanotube with concentrated nitric and sulfuric acids leads to the oxidative opening of the tube caps as well as the formation of holes in the sidewalls and thus produces a nanotube decorated with carboxyl groups, which can be further modified through the creation of amide and ester bonds to generate a vast variety of functional groups.

The carbon nanotube can also be modified through addition reactions with various chemical reagents such halogens and ozone. Unlike thermally controlled modification, electrochemical modification of carbon nanotubes can be carried out in more selective and controlled manner. Interestingly, a SWNT can be selectively modified or functionalized either on the cylinder sidewall or the optional end caps. These two distinct structural moieties often display different chemical and physical characteristics. The functional group on functionalized carbon nanotubes may be attached directly to the carbon atoms of a carbon nanotubes or via chemical linkers, such as alkylene or arylene groups. To increase hydrophilicity, carbon nanotubes can be functionalized with one or more hydrophilic functional groups, such as, sulfonate, carboxyl, hydroxyl, amino, amide, urea, carbamate, urethane, and phosphate. To increase hydrophobicity, carbon nanoparticles may be functionalized with one or more hydrophobic alkyl or aryl groups. The functionalized carbon nanoparticle may have no less than about 2, no less than about 5, no less than about 10, no less than about 20, or no less than about 50 functional groups on average.

The term "carbon nanotube" or "boron nanotube" used herein refers to all structural variations and modification of SWNT and MWNT discussed hereinabove, including configurations, structural defects and variations, tube arrangements, chemical modification and functionalization, and encapsulation.

To some extent, any carbon nanomaterial can be chemically modified or functionalized to become a "functionalized carbon nanomaterial", in a similar way for carbon nanotubes.

Carbon nanotubes are commercially available from a variety of sources. Single walled carbon nanotubes can be obtained from Carbolex (Broomall, PA), MER Corporation (Tucson, Arizona), and Carbon Nanotechnologies Incorporation ("CNI", Houston, Texas). Multi-walled carbon nanotubes can be obtained from MER Corporation (Tucson, Arizona) and Helix material solution (Richardson, Texas). However, the present invention is not limited by the source of carbon nanotubes. In addition, many publications are available with enough information to allow one to manufacture nanotubes with desired structures and properties. The most common techniques are arc discharge, laser ablation, chemical vapor deposition, and flame synthesis. In general, the chemical vapor deposition has shown the most promise in being able to produce larger quantities of nanotubes at lower cost. This is usually done by reacting a carbon containing gas, such as acetylene, ethylene, ethanol, etc., with a metal catalyst particle, such as cobalt, nickel, or ion, at temperatures above 600° C.

The selection of a carbon nanomaterial depends on several factors. The most important factor is the carbon nanomaterial is a functionalized carbon nanomaterial having one or more functional groups forming a hydrogen bond with another functional group existing in an already existing fluid component or just co-existing fluid component. Boron nanomaterial can generally form hydrogen bond with another functional group capable of forming hydrogen bond.

Another important consideration is the nanomaterial must be compatible with an already existing fluid component discussed thereafter. Other factors include heat transfer properties, electrical transfer properties, cost effectiveness, solubility, dispersion and settling characteristics. In some embodiments of the present disclosure, the carbon nanomaterial selected contain predominantly single-walled functionalized carbon nanotubes. In some other embodiments, the nanomaterial selected contain predominantly multi-walled functionalized carbon nanotubes. In some embodiments of the present disclosure, the carbon nanomaterial selected contain predominantly single-walled boron nanotubes. In some other embodiments, the nanomaterial selected contain predominantly multi-walled boron nanotubes.

In one aspect, the carbon nanotube has a carbon content of no less than about 60%, no less than about 80%, no less than about 90%, no less than about 95%, no less than about 98%, or no less than about 99%.

In another aspect, the carbon or boron nanotube has a diameter of from about 0.2 to about 100 nm, from about 0.4 to about 80 nm, from about 0.5 to about 60 nm, or from about 0.5 to about 50 nm. In yet another aspect, the carbon nanotube is no greater than about 200 micrometers, no greater than 100 micrometers, no greater than about 50 micrometers, or no greater than 20 micrometers in length. In yet another aspect, the carbon nanotube has an aspect ratio of not greater than 1,000,000, no greater than 100,000, no greater than 10,000, no greater than 1,000, no greater than about 500, no greater than about 200, or no greater than about 100.

Dyes

In some embodiments, the conductive coating composition can include one or more dyes or components added to impart a color. In some embodiments, the conductive coating compositions can be free of a dye. If a dye is included, it is preferably in an amount between about 0.001 wt. % and about 35 wt. %.

Reflective Material

In some embodiments, the conductive coating composition can include a reflective material. Preferred reflective materials include reflective particles. In some embodiments, the conductive coating compositions can be free of a reflective particle. If a reflective material is included, it is preferably in an amount between about 0.001 wt. % and about 25 wt. %.

Surfactants

The conductive coating composition can include a surfactant or be free of surfactant. Surfactants suitable for use with the compositions of the present invention include, but are not limited to, nonionic surfactants, anionic surfactants, and zwitterionic surfactants. In some embodiments, the compositions of the present invention include about 0.001 wt % to about 30 wt. % of a surfactant. In other embodiments the compositions of the present invention include about 0.1 wt. % to about 25 wt. % of a surfactant. In still yet other embodiments, the compositions of the present invention include between about 1 wt. % and about 15 wt. % of a surfactant.

Viscosity Modifiers

The conductive coating composition can optionally comprise a viscosity modifier. Preferred viscosity modifiers include thickeners or thinners.

Methods of Preparing the Conductive Coating Compositions

The conductive coating compositions can be prepared with a variety of equipment and under conditions specific to the ingredients for the conductive coating composition. For example, the method may include heating the fluid, such carbon particles and/or boron nanomaterials can be dispersed therein. The precise temperature of the heating may be dictated by the melting point or boiling point of the fluid.

The conductive coating compositions can be prepared in batch or continuous processes. To prepare the conductive coating compositions, the fluid can be heated. In some embodiments the fluid component is heated; in some embodiments the fluid component is not heated. Whether the fluid component is heated can depend on the type of polymer included in the fluid component. For example, a polymer such as a thermoset may cure upon heating. The temperature of heating may vary based on the fluid component and species of polymer in the fluid component. In an embodiment, where the fluid component is heated, it is preferably heated to a temperature between about 20° C. and about 100° C., more preferably a temperature between about 23° C. and about 90° C. In some embodiments, heating is not necessary.

After heating the fluid component, carbon particles and/or boron nanomaterials can be added to the fluid component. The carbon particles and/or boron nanomaterials can be added all at once or sequentially in smaller portions. Preferably, the carbon particles and/or boron nanomaterials are mixed or stirred in the fluid to form a conductive coating composition. If the carbon particles and/or boron nanomaterials are added sequentially in small portions, the mixing and/or stirring can be performed as the nanotubes are being added and/or between sequential additions. Preferred mixing and stirring methods, include, but are not limited to, automatic mixers (such as paddle mixers), stir bars, manual stirring or manual mixing, sonication, etc. The intensity and speed of the mixing or stirring can vary. Preferably, the intensity and/or speed are not too vigorous to break or degrade the carbon particle and/or boron nanomaterial structures. The stirring can occur for any amount of time enough to disperse the carbon particles and/or boron nanomaterials. Preferably, the carbon particles and/or boron nanomaterials are thoroughly dispersed; most preferably, the carbon particles and/or boron nanomaterials are homogenously dispersed in the fluid. Preferred mixing and/or stirring times can be between about 1 minute and 2 hours; more preferably, between about 2 minutes and about 1 hour; most preferably between 5 minutes and 30 minutes. In an embodiment where the preparation of the conductive coating compositions is a continuous process, the mixing may be continuous.

After mixing, the conductive coating composition can optionally be heated, cooled, or maintained at the same temperature. If the conductive coating composition is heated, it is preferably heated to a temperature between about 20° C. and about 100° C., more preferably to a temperature between about 230° C. and about 90° C. The heating can be performed for a time between about 1 minute and about 2 hours; more preferably between about 5 minutes and about 90 minutes; most preferably between about 10 minutes and about 1 hour.

Preferably the conductive coating composition is passed through a roller mill, an extruder, a manual or mechanical stirrer. Preferably, the conductive coating composition is passed through a roller mill. Preferred roller mills include, but are not limited to, two-roll mills and three-roll mills. Preferably the conductive coating composition is passed through a roller mill enough times to obtain a smooth consistency. In a preferred method, the conductive coating composition is passed through a roller mill between 1 and 20 times, more preferably between 2 and 15 times, most preferably between 3 and 10 times. The conductive coating composition can be passed through the same roller mill multiple times or through a series of roller mills to achieve the desired number of pass-throughs.

After passing the conductive coating composition through a roller mill, the conductive coating composition can be heated, cooled, or maintained at the same temperature. The conductive coating composition can then be applied to a surface. Suitable methods of applying the conductive coating material to surface include, but are not limited to, painting, printing, spraying, manual application methods, automated or machine application methods, or a combination thereof.

Preferred printing methods include, but are not limited to 3D printing, inkjet printing, and Sonitek® printing.

After the conductive coating compositions are applied to a surface, the conductive coating compositions can be cured. Preferred methods of curing include, self-curing, UV curing, thermal curing (e.g., heating), free radical curing, or a combination thereof.

While an understanding of the mechanism is not necessary to practice the present invention and while the present invention is not limited to any mechanism of action, it is contemplated the combination of a fluid and nanomaterial can form an electrostatic attraction, including, but not limited to, a hydrogen bond among them leads to enhanced thermal and electrical conductivity. Because of this combination, the disclosed coating compositions herein possess an enhanced thermal and/or electrical conductivity. The disclosed coating compositions are also more stable even under tough conditions.

All publications and patent applications in this specification are indicative of the level of ordinary skill in the art to which this invention pertains. All publications and patent applications are herein incorporated by reference to the same extent as if each individual publication or patent application was specifically and individually indicated as incorporated by reference.

EXAMPLES

Embodiments of the present invention are further defined in the following non-limiting Examples. These Examples, while indicating certain embodiments of the invention, are given by way of illustration only. From the above discussion and these Examples, one skilled in the art can ascertain the essential characteristics of this invention, and without departing from the spirit and scope thereof, can make various changes and modifications of the embodiments of the invention to adapt it to various usages and conditions. Thus, various modifications of the embodiments of the invention, in addition to those shown and described herein, will be apparent to those skilled in the art from the foregoing description. Such modifications are also intended to fall within the scope of the appended claims.

Example 1

In this Example, a series of flexible nanocoating compositions were prepared and some electrical and/or thermal properties were measured. An exemplary procedure for making the flexible nanocoating compositions follows. The exemplary compositions were prepared according to this exemplary method. The fluid component was heated to increase the viscosity and facilitate better mixing of the materials. Carbon nanomaterials were slowly added to the fluid component while stirring. Once all carbon nanotubes were added, the mixture was stirred for 10 more minutes. The mixture could cool down while stirring until it is safe to handle. The mixture was passed through a three-roll mill eight times to obtain a smooth consistency.

Table 4 lists the ingredients and the measured resistances. The resistivity was measured with a Keithly instrument 2401. The accurate resistivity was measured with a four-probe meter. The thermal conductivity data was obtained using the Hot Disk™ thermal constants analyzer, using the following parameters:

measurement depth: 6 mm room temperature: 25° C.

power: 0.025 W measurement time: 16 seconds sensor radius: 2.001 mm

TCR: 0.0471/K, disk type: Kapton temperature drift rec: yes

TABLE 4

The ingredients and measured resistance of some exemplary coatings.

| Fluid Component | Carbon | Carbon wt. % | Resistivity (ohm) | Accurate Resistivity ($\Omega \cdot m$) | Thermal Conductivity (W/mK)$_{cured}$ |
|---|---|---|---|---|---|
| Polyurethane | MWNT-OH | 7.5 | | | (#50) 400 |
| Polyurethane | MWNT-OH | 5 | | | (#51) 6000 |
| Polyacrylic | MWNT-OH | 5 | $1.6 \times 10^4$ | | |
| Polyurethane | MWNT-OH | 2 | $8.9 \times 10^4$ | | |
| Polyurethane 75 wt. %/ 25 wt. % H$_2$O | MWNT-OH | 4.5 | $1.3 \times 10^2$ | (#57) | |
| Polyurethane diluted w/H$_2$O | MWNT-OH | 7.5 | $1.3 \times 10^2$ | | |
| Polyurethane (9.25 g grease diluted w/4 g H2O) | MWNT-OH | 7.5 | $5.7 \times 10^2$ | | |
| Polyurethane | MWNT-OH | 4.5 | $5.8 \times 10^3$ | | |
| 75 wt. % Polyacrylic/25 wt. % H$_2$O | MWNT-OH | 4.5 | $1.2 \times 10^{x3}$ | | |
| 75 wt. % Polyurethane/ 25 wt. % IPA | MWNT-OH | 4.5 | $4.8 \times 10^2$ | (#55) 25 | |
| 75 wt. % Polyurethane/ 25 wt. % EtOH | MWNT-OH | 4.5 | $2.1 \times 10^2$ | (#56) 6.8 | |
| A + B Water Based Epoxy | MWNT-OH | 5 | $5.8 \times 10^{x3}$ | | |

TABLE 4-continued

The ingredients and measured resistance of some exemplary coatings.

| Fluid Component | Carbon | Carbon wt. % | Resistivity (ohm) | Accurate Resistivity ($\Omega \cdot m$) | Thermal Conductivity (W/mK)$_{cured}$ |
|---|---|---|---|---|---|
| Thick to Diluted Polyurethane | MWNT-OH | N/A | | | (#54) 23.2 |
| Polyurethane | CNF-19 | 10 | $3.4 \times 10^{x1}$ | | 1.578 |
| 50 wt. % Polyurethane/ 50 wt. % H$_2$O | CNF-19 | 10 | $1 \times 10^{x1}$ | | 1.254 |

The stability of the coating compositions was assessed visually. If unstable the components would separate. This was not observed for any of the exemplary samples prepared and examined. All the coatings were stable and maintained conductivity over several months.

As shown in Table 4, many of the coating compositions provided excellent resistivity properties. These results demonstrate the coating compositions described herein could be useful as conductive coating materials.

Example 2

An exemplary coating composition was prepared and painted onto a surface to assess its paintability and its ability to serve as a surface coating. The compositions comprised 25 wt. % ethanol and 75 wt. % Polyurethane as the fluid component and had 4.5 wt. % of MWNT-OH carbon nanomaterials. The properties of this composition are reflected in Table 4. The photograph of the coating painted onto the surface can be seen in FIGS. 25A and 25B.

As can be seen in FIGS. 25A and 25B, the coating composition was capable of painting on a surface. It covered the surface and dried without cracking or peeling from the surface. Inspection of the composition on the surface revealed its suitability to serve as a coating material.

Therefore, various methods, systems, and apparatus have been shown and described. Although various embodiments or examples have been set forth herein, it is to be understood the present invention contemplates numerous options, variations, and alternatives as may be appropriate in an application or environment.

What is claimed is:

1. A non-volatile memory circuit, comprising:
   a nano-grease located between terminals of the non-volatile memory circuit, wherein the nano-grease exhibits non-volatile memory characteristics.

2. The non-volatile memory circuit of claim 1, further comprising:
   a logic source; and
   a semi-conductive device being electrically coupled to the logic source.

3. The non-volatile memory circuit of claim 1, wherein the nano-grease exhibits memristive properties.

4. The non-volatile memory circuit of claim 1, wherein the nano-grease exhibits memcapacitive properties.

5. The non-volatile memory circuit of claim 1, wherein the nano-grease exhibits meminductive properties.

6. The non-volatile memory circuit of claim 1, wherein the nano-grease can store the last known current passing through the nano-grease.

7. The non-volatile memory circuit of claim 1, wherein the nano-grease can store the last known charge held by the nano-grease.

8. The non-volatile memory circuit of claim 1, wherein the nano-grease comprises less than 2.5% by weight of single wall carbon nanotubes (SWNT).

9. The non-volatile memory circuit of claim 1, wherein the nano-grease comprises less than 1.5% by weight of multi wall carbon nanotubes.

10. The non-volatile memory of circuit of claim 2, wherein the logic source is an analog source.

11. A non-volatile memory circuit, comprising:
    a nano-grease located between a first and second terminal of a logic source, wherein the nano-grease exhibits non-volatile memory characteristics.

12. The non-volatile memory circuit of claim 11, further comprising:
    a voltage source; and
    a semi-conductive device being electrically coupled to the logic source.

13. The non-volatile memory circuit of claim 11, further comprising:
    a voltage sensor electrically coupled in parallel with a semi-conductive device capable of measuring the voltage drop at the semi-conductive device.

14. The non-volatile memory circuit of claim 11, wherein the nano-grease exhibits memristive properties.

15. The non-volatile memory circuit of claim 11, wherein the nano-grease exhibits memcapacitive properties.

16. The non-volatile memory circuit of claim 11, wherein the nano-grease exhibits meminductive properties.

17. The non-volatile memory circuit of claim 11, wherein the nano-grease is comprised of a percentage of single wall carbon nanotubes (SWNT).

18. A method for a non-volatile memory circuit, comprising:
    disposing a nano-grease between circuit terminals, wherein the nano-grease exhibits non-volatile memory characteristics.

19. The method of claim 18, further comprising:
    electrically coupling a semi-conductive device to a logic source having the circuit terminals.

20. The method of claim 18, further comprising:
    storing electrical information in the nano-grease.

* * * * *